United States Patent
Ellis

(10) Patent No.: US 8,378,474 B2
(45) Date of Patent: Feb. 19, 2013

(54) DEVICES WITH FARADAY CAGES AND INTERNAL FLEXIBILITY SIPES

(75) Inventor: Frampton E. Ellis, Jasper, FL (US)

(73) Assignee: Frampton E. Ellis, Jasper, FL (US)

( * ) Notice: Subject to any disclaimer, the term of this patent is extended or adjusted under 35 U.S.C. 154(b) by 0 days.

(21) Appl. No.: 13/426,133

(22) Filed: Mar. 21, 2012

(65) Prior Publication Data

US 2012/0175752 A1      Jul. 12, 2012

Related U.S. Application Data

(63) Continuation of application No. 12/292,553, filed on Nov. 20, 2008, now Pat. No. 8,164,170.

(60) Provisional application No. 60/996,530, filed on Nov. 21, 2007, provisional application No. 60/996,553, filed on Nov. 26, 2007.

(51) Int. Cl.
*H01L 23/20* (2006.01)
(52) U.S. Cl. ......... 257/682; 257/685; 257/687; 361/818
(58) Field of Classification Search .................. 257/682, 257/685, 687; 361/818
See application file for complete search history.

(56) References Cited

U.S. PATENT DOCUMENTS

| | | | |
|---|---|---|---|
| 5,214,657 | A | 5/1993 | Farnworth et al. |
| 2004/0215931 | A1 | 10/2004 | Ellis |
| 2006/0248749 | A1 | 11/2006 | Ellis |
| 2007/0196948 | A1 | 8/2007 | Trezza |
| 2009/0200661 | A1 | 8/2009 | Ellis |

*Primary Examiner* — Thien F Tran
(74) *Attorney, Agent, or Firm* — Mendelsohn, Drucker, and Associates, P.C.

(57) ABSTRACT

A computer or microchip comprising an outer chamber and at least one inner chamber inside the outer chamber. The outer chamber and the inner chamber being separated at least in part by an internal sipe, and at least a portion of a surface of the outer chamber forming at least a portion of a surface of the internal sipe. The internal sipe has opposing surfaces that are separate from each other and therefore can move relative to each other, and at least a portion of the opposing surfaces are in contact with each other in a unloaded condition. The outer chamber including a Faraday Cage. A computer, comprising a semiconductor wafer having a multitude of microchips. The multitude of microchips forming a plurality of independently functioning computers, each computer having independent communication capabilities.

50 Claims, 30 Drawing Sheets

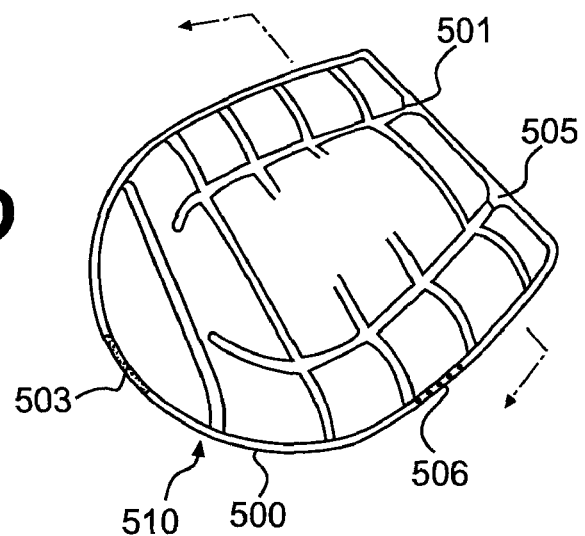
FIG. 1D
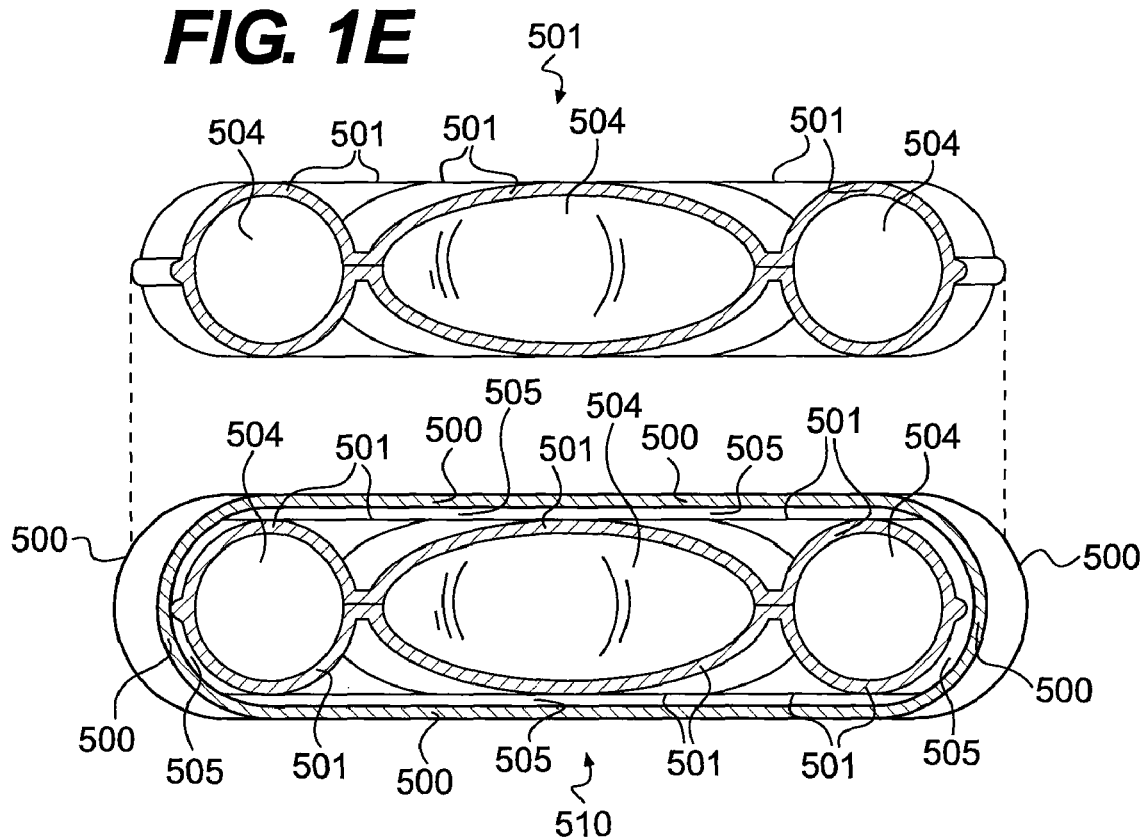
FIG. 1E
FIG. 1F

FIG. 9A    FIG. 9B
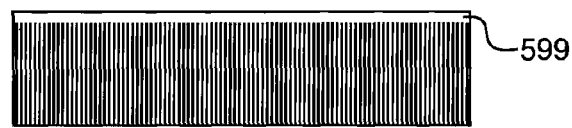
FIG. 9C
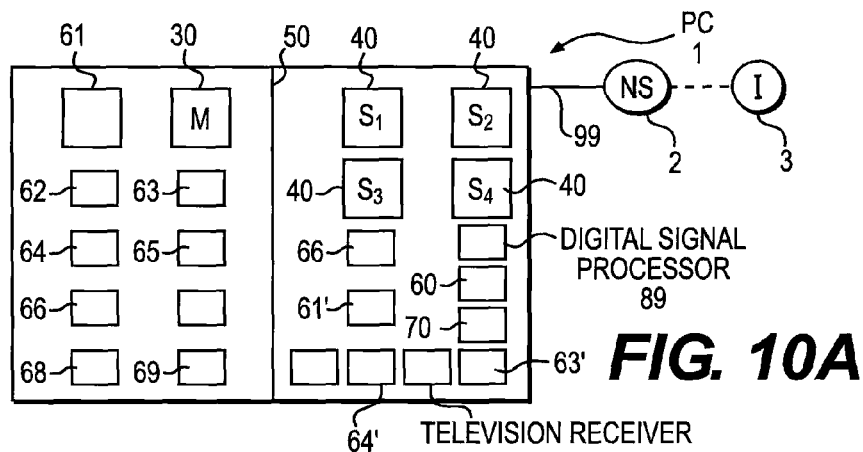
FIG. 10A
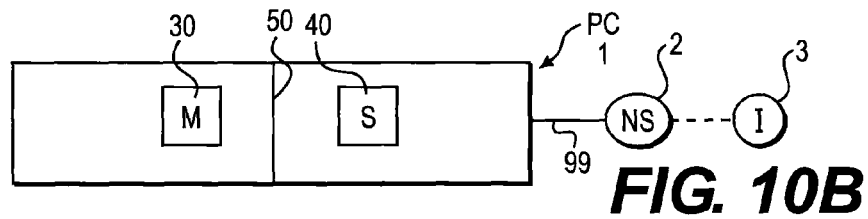
FIG. 10B
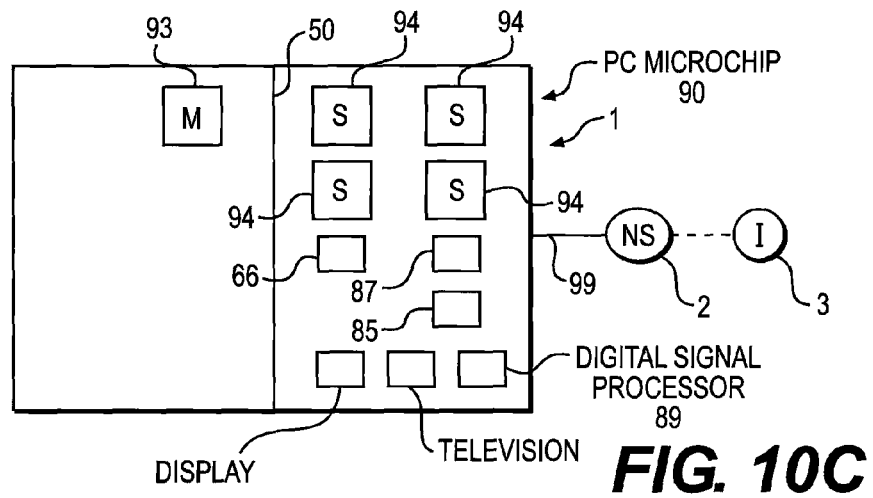
FIG. 10C

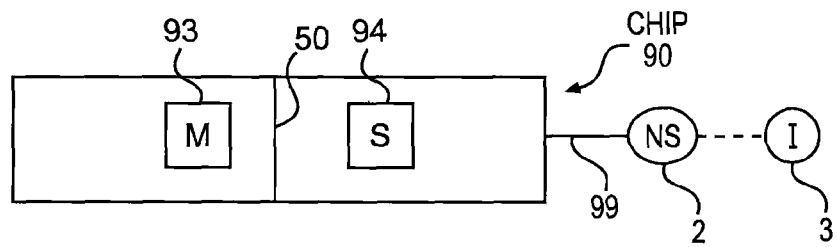
FIG. 10D
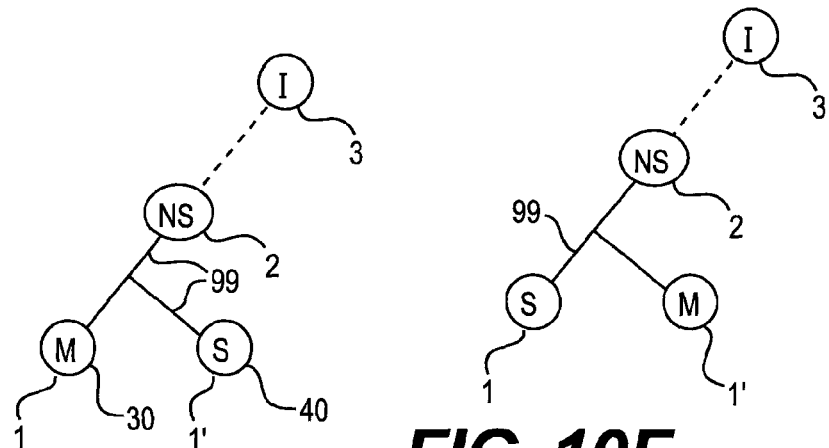
FIG. 10E
FIG. 10F
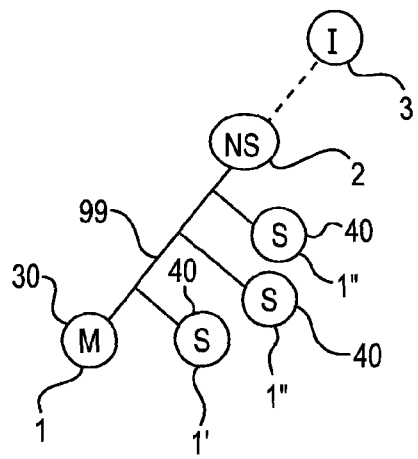
FIG. 10G
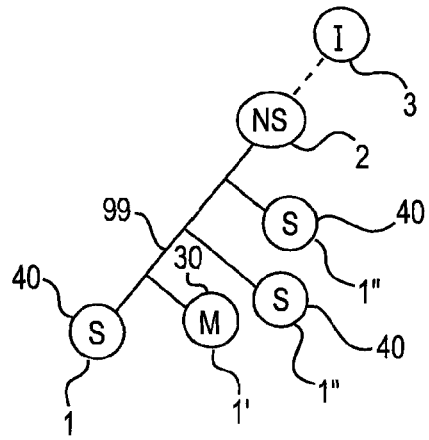
FIG. 10H
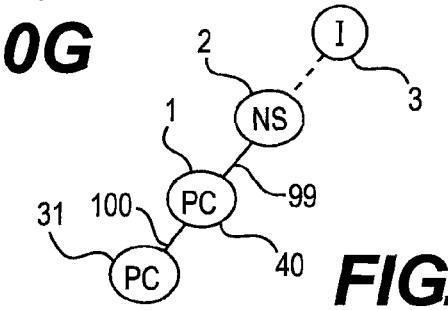
FIG. 10I

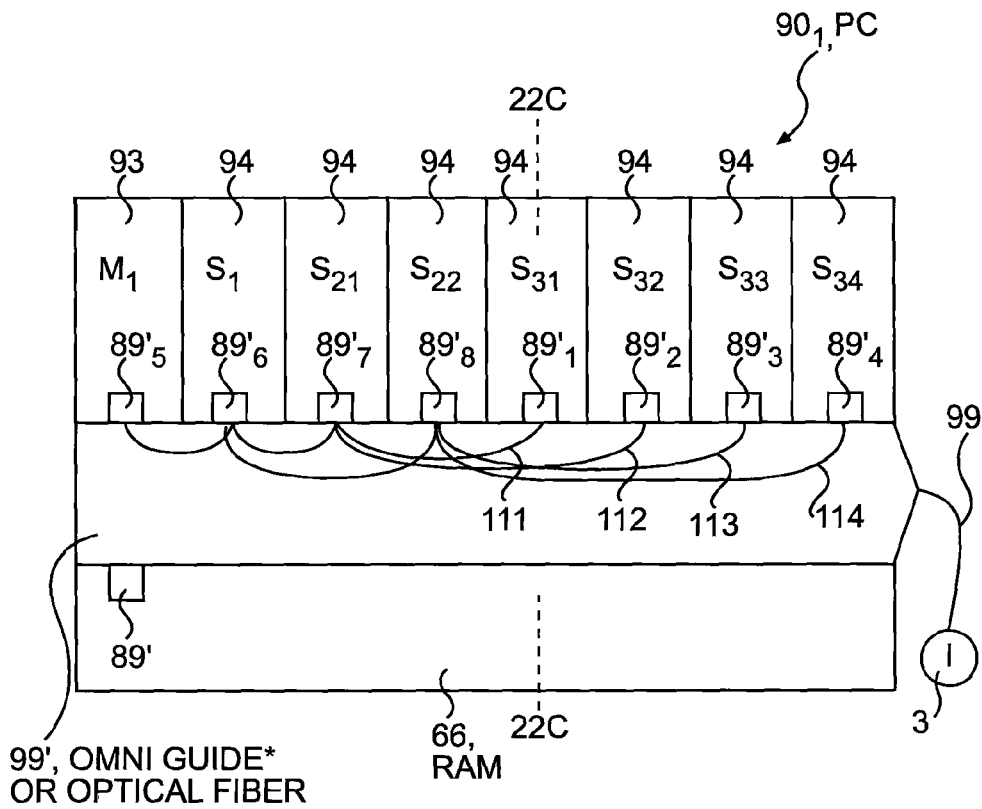
FIG. 14A
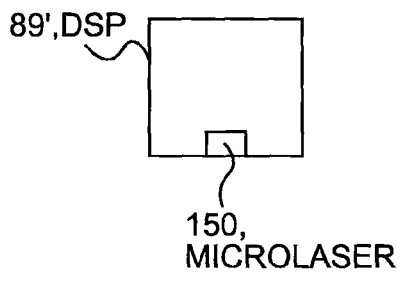 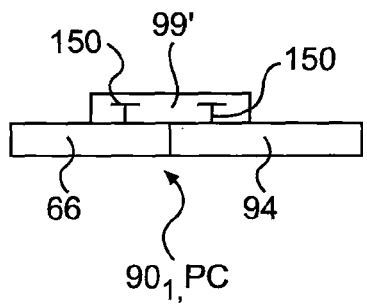
FIG. 14B    FIG. 14C

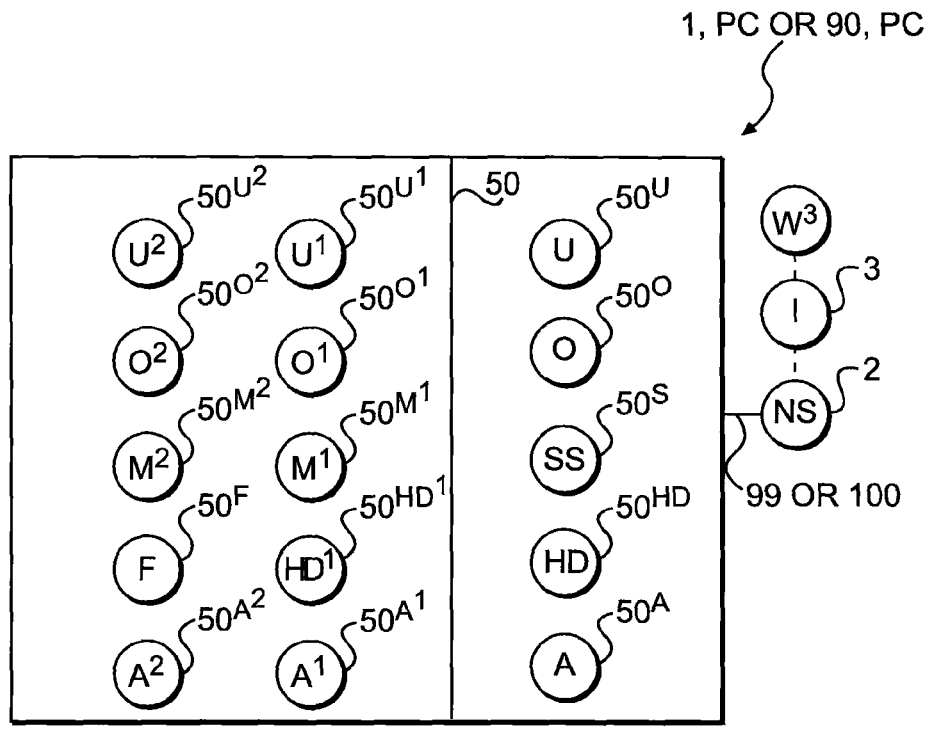
FIG. 15C
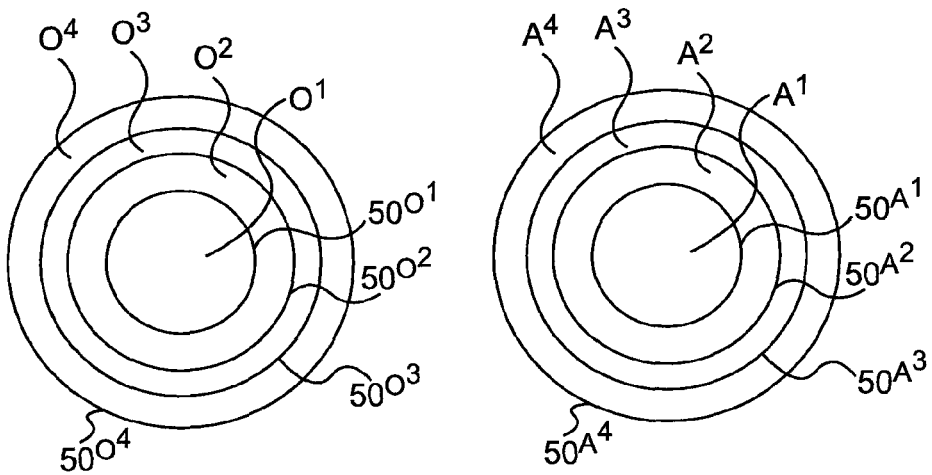
FIG. 15D  FIG. 15E

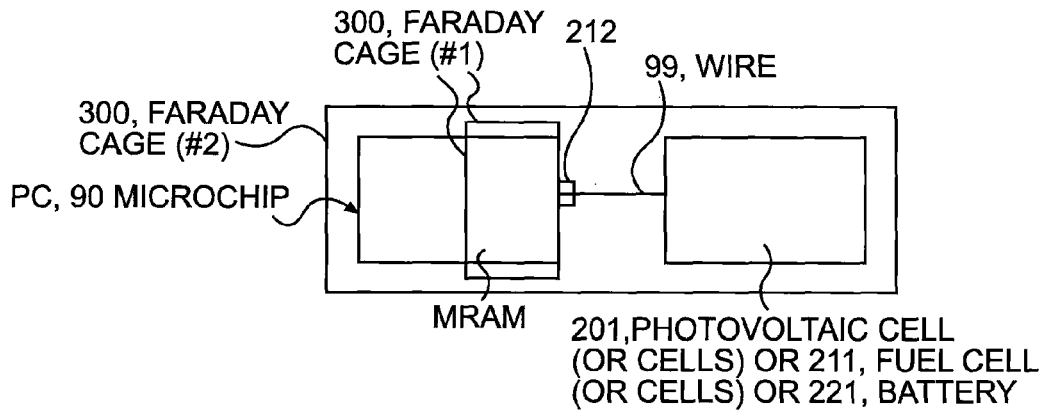
FIG. 18E
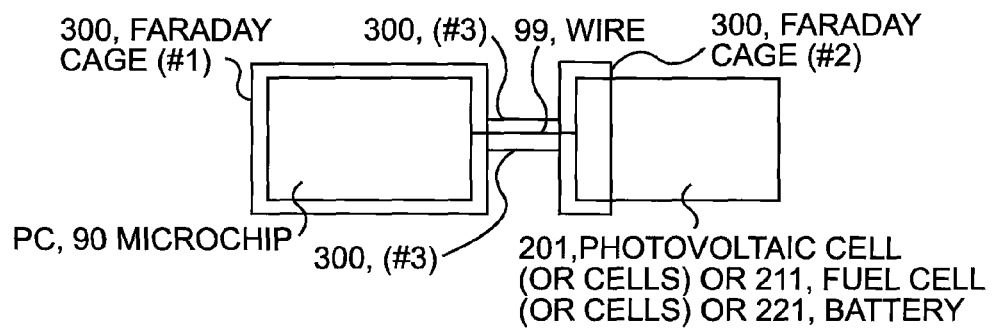
FIG. 18F
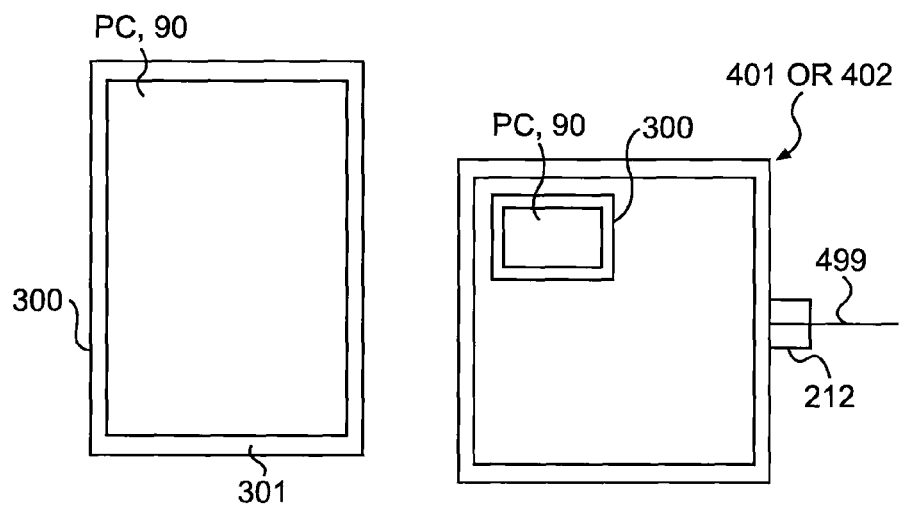
FIG. 18G  FIG. 18H

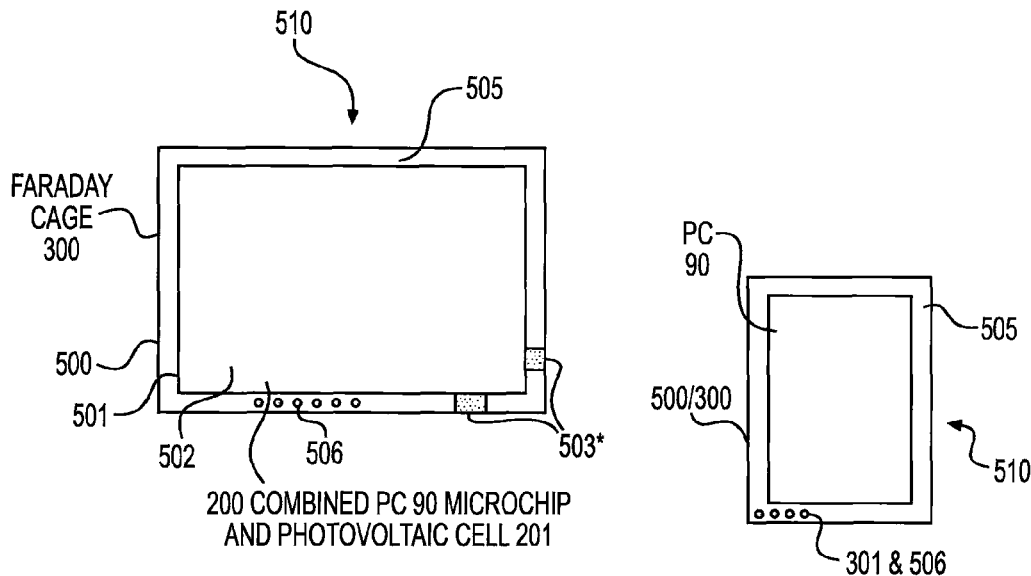
FIG. 23A
FIG. 23G
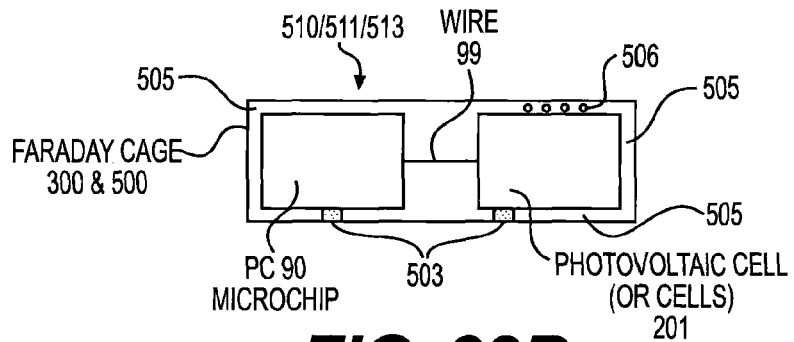
FIG. 23B
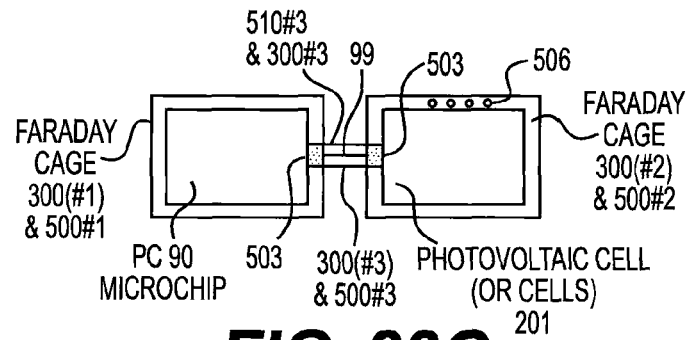
FIG. 23C
*CAN INCLUDE EXTERNAL CONNECTION FROM MICROCHIP/CELL 200

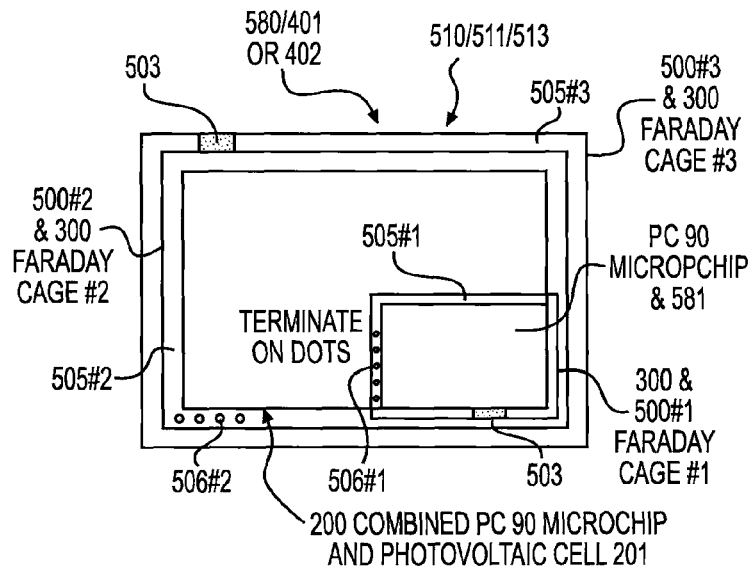
FIG. 23D
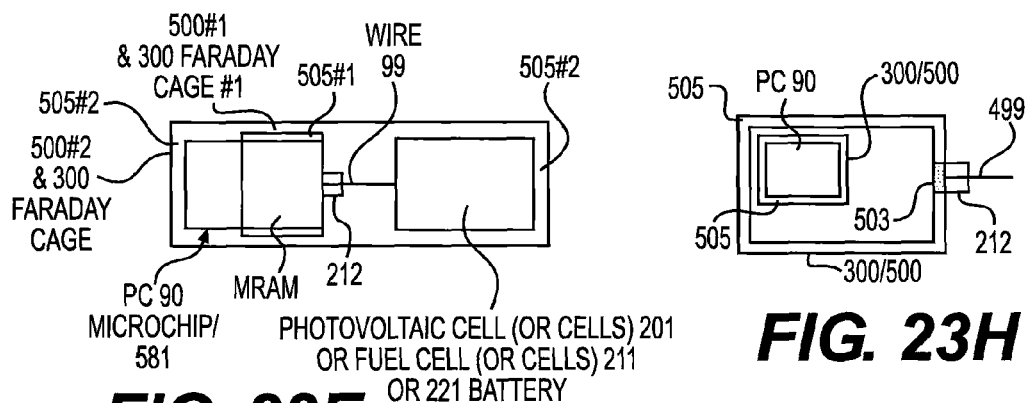
FIG. 23E
FIG. 23H
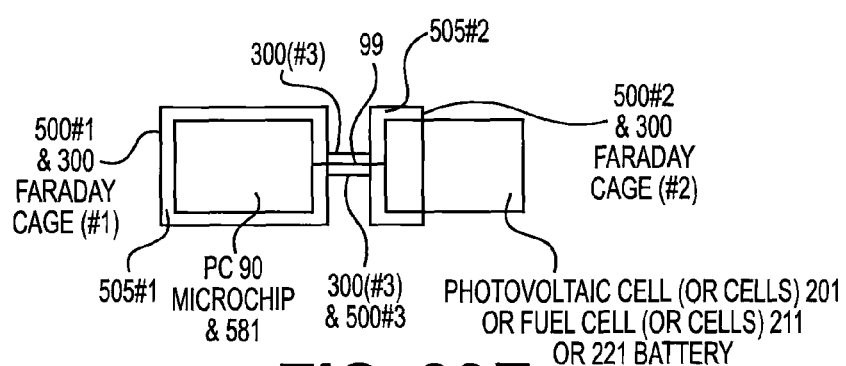
FIG. 23F

DEVICES WITH FARADAY CAGES AND INTERNAL FLEXIBILITY SIPES

This application is a continuation of U.S. patent application Ser. No. 12/292,553 filed on Nov. 20, 2008, which in turn is a non-provisional of and is a non-provisional of U.S. Provisional Application No. 60/996,530, filed on Nov. 21, 2007, and U.S. Provisional Application No. 60/996,553, filed on Nov. 26, 2007, the contents of the foregoing applications are hereby incorporated herein by reference.

BACKGROUND

1. Field of the Disclosure

The disclosure relates to a Faraday Cage surrounding semiconductor microchips, photovoltaic cells, and other micro and/or nano devices combined with the applicant's prior internal sipe inventions, including at least one compartment surrounded by at least one internal sipe, such as a slit. More specifically, a Faraday Cage coincides with an outer compartment, which forms one surface of a sipe surrounding an inner compartment including a personal computer microchip and/or a photovoltaic cell and/or a fuel cell and/or a battery.

The disclosure also relates to a semiconductor wafer, such as silicon, containing a multitude of microchips, such as with one or more core microprocessors. Instead of separating the microchips into separate dies in the conventional process, the entire semiconductor wafer is used essentially intact as a computer. More specifically, interconnects can be added to the printed circuit architecture of the wafer to connect the wafer microchips to other wafer microchips and/or other components on the wafer or external to it. Still more specifically, the microchips can be a complete system on a chip. Even more specifically, the semiconductor wafer can be used with other conventional interface devices for power and data, including wireless such as radio and/or optic, and/or wired such as fiber optic and/or electric. In another specific embodiment, several semiconductor wafers can be stacked in vertical layers; for example, with a first wafer including microprocessors or cores; a second wafer including random access memory or RAM; and a third wafer including other components.

The disclosure also relates to the semiconductor wafer including one or more of the applicant's prior internal sipe inventions, with an outer compartment having an internal sipe.

The disclosure also relates to the semiconductor wafer being surrounded by one or more Faraday Cages integrated into the internal sipe invention.

2. Brief Description of the Prior Art

Faraday Cage surrounding semiconductor microchips, photovoltaic cells, and other micro and/or nano devices, are described by the applicant in his U.S. application Ser. No. 10/802,049 filed Mar. 17, 2004, and published as Pub. No. US 2004/0215931 A! on Oct. 28, 2004.

The applicant's prior internal footwear sipe inventions, including at least one compartment surrounded by at least one internal sipe, such as a slit, are described by the applicant in his U.S. patent application Ser. No. 11/802,930, filed May 25, 2007 and published as Pub. No. US 2008/0086916 A1 on Apr. 17, 2008, as well as in several earlier U.S. applications filed by the applicant.

Existing semiconductor wafers, currently up to 300 mm in diameter, are always cut into a large number of separate dies, with one microchip formed into a package from each flaw-free die cut from the semiconductor wafer; some dies are inherently defective and are discarded. A typical semiconductor wafer is shown in the applicant's U.S. application Ser. No. 10/684,657 filed Oct. 15, 2003.

As described in Wikipedia, "wafer scale integration" (WSI) is a yet-unused system of building very-large integrated circuit networks that use an entire silicon wafer to produce a single "super-chip." Through a combination of large size and reduced packaging, WSI could lead to dramatically reduced costs for some systems, notably massively parallel supercomputers.

Many companies including TI and ITT attempted to develop "wafer scale integration" (WSI) production systems in the 1970's and '80's, but all failed and no products were released. Further attempts at WSI appear to be largely abandoned for decades.

One critical problem that has not been overcome is that of inherent flaws in semiconductor wafers. It has been an ongoing goal to develop methods to handle faulty areas of the wafers through logic, as opposed to sawing them out of the wafer. Generally, this approach uses a grid pattern of sub-circuits and "rewires" around the damaged areas using appropriate logic.

The overwhelming difficulty of this approach is illustrated by the history of famous computer pioneer Gene Amdahl, who attempted to develop WSI as a method of making a supercomputer, starting Trilogy Systems in 1980 and garnering investments from Groupe Bull, Sperry Rand, and Digital Equipment Corporation, who (along with others) provided as estimated $230 million in financing. The design called for a 2.5" square chip with 1200 pins on the bottom. After burning through about one third of the capital with nothing to show for it, Amdahl eventually declared the idea would only work with a 99.99% yield, which would not happen for 100 years. There were several subsequent efforts in the 1980's, but none successful.

Another well-known problem is the field of wafer-scale integration technology is the impact of thermal expansion on external connectivity. More specifically, when a WSI microelectronic complex is connected to a circuit board by thousands of, for example, connectors positioned between the microelectronic complex and the circuit board, these connectors can be damaged due to the different rates of thermal expansion experience by the surfaces of the microelectronic comples and circuit board.

Taking for example a finished silicon wafer, packaged in a material such as ceramic, the wafer typically expands at a rate of 3 ppm/C. In contrast, the material of the circuit board typically expands at a rate of 20-40 ppm/C. Thus, as the two materials heat up, the two surfaces will expand at different rates, potentially damaging many of the connectors distributed between the wafer and the circuit board. See Norman, et al., U.S. Pat. No. 7,279,787;

The present disclosure solves one or more problems with existing technology.

SUMMARY

In the applicant's invention regarding Faraday Cages and siped compartments, two entirely different technologies (siped cushioning compartments and Faraday Cages) from two entirely different and unrelated fields of technology ("macro" athletic footwear and microelectronics), each with their own completely different art, have been integrated into a surprising new combination wherein the integrated structural components have simultaneous dual functions that are completely separate and unrelated.

Moreover, the integrated use of a sipe media both as a lubricant between the siped compartments and as a coolant for a microchip (or other electronic component) to deal with the critical microprocessor heat dissipation problem is an additional surprising combination of two entirely separate technical functions that are completely different into a single new structural and material component with dual functions, again from entirely different and unrelated fields of art.

The applicant's semiconductor wafer computer disclosure solves the two longstanding problems that have heretofore made all such wafer-scale integration efforts fail.

First, the applicant's disclosure solves the longstanding inherent flaw intolerance problem by using microchips on the wafer that are personal computer systems on the chip (SoC), so that each wafer microchip can operate independently, including communicating with other wafer microchips, such as wirelessly by radio or free space or waveguide optical device. In this approach, the wafer microchips that inherently are flawed during manufacture or fail in operation require no elaborate special handling like that described above. Generally, if they fail fatally, the remaining wafer microchips inherently ignore them since they do not communicate with other microchips; partial failure can be detected remotely and the microchip can be turned off if necessary.

Second, the applicant's disclosure solves the longstanding unequal thermal expansion problem by reducing, even almost eliminating the need for pins, since both on wafer and off wafer communication by the independently functioning microchips (personal computer SoC's) on the wafer can be accomplished by radio or optics connections that do not require pins or require far fewer structural connections. In addition, the applicant's use of stacked semiconductor wafers, which can have very similar or identical materials and expansion rates, and can obviate the need for conventional motherboards or reduce their role.

These and other features of the disclosure will become apparent from the detailed description that follows.

BRIEF DESCRIPTION OF THE DRAWINGS

FIGS. 1-9 of this application are FIGS. 1-6, 52, 61, 67, 74, and 79 of both the applicant's U.S. application Ser. No. 11/802,033 filed May 18, 2007 and published on Apr. 10, 2008 as Pub. No. US 2008/0083140 A1 and PCT Application PCT/US2007/011976 filed 18 May 2007 and published on 31 Jan. 2008 as Int. Pub. No. WO 2008/013594 A2, as well as U.S. application Ser. No. 11/802,930 filed May 25, 2007 and published on Apr. 17, 2008 as Pub. No. US 2008/0086916 A1; all three applications are incorporated herein by reference. In addition, FIGS. 1-6 (except 6D-6F) of this application are FIGS. 83-88 of both the applicant's U.S. application Ser. No. 11/282,665 filed Nov. 21, 2005 and published on Nov. 9, 2006 as Pub. No. US 2006/0248749 A1 and PCT Application PCT/US2005/042341 filed 21 Nov. 2005 and published on 1 Jun. 2006 as Int. Pub. No. WO 2006/058013 A2, both of which are incorporated herein by reference.

FIG. 1A-4A show a frontal or sagittal plane cross section view of an example of a device 510 such as a flexible insert with a siped compartment or chamber or bladder.

FIGS. 1B-6B shows a horizontal plane view of a device 510 example.

FIG. 1D-1F show an example of the 510 invention using typical commercial air bladder embodiments as compartment 501 modified with outer compartment 500.

FIGS. 5A-6A show a frontal or sagittal plane cross section view of an example of a device 510 such as a flexible insert with two siped compartments or chambers or bladders or combination.

FIG. 8 is a chart showing approximate comparison of hardness scales.

FIGS. 9A-9C show a large urban telephone book lying flat, solid wooden block, and an upright very thick book to illustrate basic concepts of sipe flexibility and stability.

FIGS. 10-22 of this application are FIGS. 10A-10I, 16A-16Z, 16AA, and 16AB, 17A-17D, 21B, 22A, 23A-23E, 25A-25D, 26A-26C, 27A-27H, 28, 29A, 30A-30C, and 31 of both the applicant's U.S. application Ser. No. 10/802,049 filed May 17, 2004 and published on Oct. 28, 2004 as Pub. No. US 2004/0215931 A1.

FIGS. 10A-10I are simplified diagrams of a section of a computer network, such as the Internet, showing an embodiment of a system architecture utilizing an internal firewall to separate that part of a networked PC (including a system reduced in size to a microchip) that is accessible to the network for shared processing from a part that is kept accessible only to the PC user; also showing the alternating role that each PC in the network may play as either a master or slave in a shared processing operation involving one or more slave PC's in the network; and showing a home or business network system which can be configured as an Intranet; in addition, showing PC and PC microchips controlled by a controller (including remote) with limited or no processing capability; and showing PC and PC microchips in which an internal firewall 50 can be reconfigured by a PC user.

FIG. 13 shows that all microprocessors of a personal computer or personal computer on a microchip can have a separate input/output communication link to a digital signal processor (DSP) or other transmission/reception connection component.

FIGS. 14A-14C shows a PC microprocessor on a microchip similar to that of FIG. 13, except that Figures shows microprocessors 93 and 94 each connecting to an optical wired connection 99' such as thin mirrored hollow wire or optical omniguide or optical fiber.

FIGS. 15A-15E show multiple firewalls 50 within a personal computer 1 or PC microchip 90.

FIGS. 18A-18H show exemplary microchip and Faraday Cage embodiments.

FIG. 19 shows a silicon wafer 500 used to make microchips.

FIG. 22 shows a combination of the embodiments shown in FIGS. 20 and 21.

FIGS. 23A-23H are modifications of FIGS. 18A-27H of this application, which are FIGS. 27A-27H of U.S. application Ser. No. 10/802,049 filed Mar. 17, 2004 and published on Oct. 28, 2004, as Pub. No. US 2004/0215931 A1 and U.S. application Ser. No. 10/684,657 filed Oct. 15, 2003 and published on Aug. 18, 2005, as Pub. No. US 2005/0180095 A1, both of which applications are hereby incorporated by reference herein for completeness of disclosure.

FIGS. 23A-23H are more specific example embodiments of the FIG. 7B example; they show examples of the applicant's inventions involving one or more Faraday Cages surrounding various combinations of semiconductor microchips, photovoltaic cells, and other micro and/or nano devices with the applicant's internal sipe inventions 510/511/513.

FIG. 24A is a top view of a semiconductor wafer 1500, the entire semiconductor wafer 1500 being used essentially intact as a computer, which can also include a Faraday Cage.

FIGS. 25A-25B are modifications of FIGS. 29A-29B of the '657 application incorporated by reference herein above. FIG. 25B shows a microchip 1501 as a separated die in a package 1503 including the applicant's internal sipe inventions 510/511/513 and the Faraday Cage 300.

It is understood that the reference numbers identified in this application and in U.S. patent applications '665, '033, and '930 incorporated by reference herein, are used consistently throughout the application such that like reference numbers are used to describe the same or like elements.

DETAILED DESCRIPTION

Figure 1A:
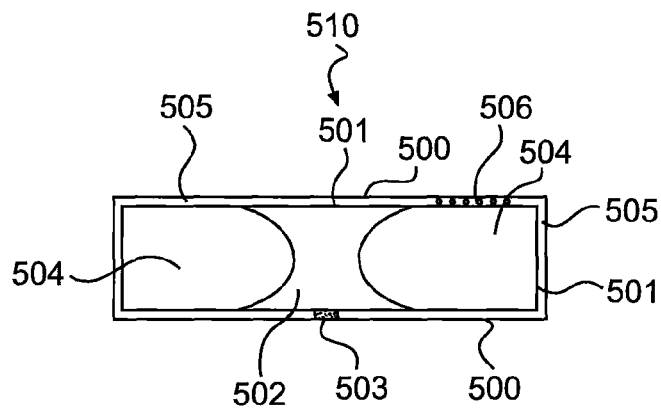

FIGS. 1-9 of this application are FIGS. 1-6, 52, 61, 67, 74, and 79 of both the applicant's U.S. application Ser. No. 11/802,033 filed May 18, 2007 and published on Apr. 10, 2008 as Pub. No. US 2008/0083140 A1 and PCT Application PCT/US2007/011976 filed 18 May 2007 and published on 31 Jan. 2008 as Int. Pub. No. WO 2008/013594 A2, as well as U.S. application Ser. No. 11/802,930 filed May 25, 2007 and published on Apr. 17, 2008 as Pub. No. US 2008/0086916 A1; all three applications are incorporated herein by reference. In addition, FIGS. 1-6 (except 6D-6F) of this application are FIGS. 83-88 of both the applicant's U.S. application Ser. No. 11/282,665 filed Nov. 21, 2005 and published on Nov. 9, 2006 as Pub. No. US 2006/0248749 A1 and PCT Application PCT/US2005/042341 filed 21 Nov. 2005 and published on 1 Jun. 2006 as Int. Pub. No. WO 2006/058013 A2, both of which are incorporated herein by reference.

FIGS. 1-9 show the applicant's prior inventions incorporating forms of insertable devices with one or more internal (or mostly internal) sipes, including slits (or channels or grooves and other shape, including geometrically regular or non-regular shapes, such as anthropomorphic shapes), into a large variety of products, including footwear and orthotics, athletic, occupational and medical equipment and apparel, padding for equipment and furniture, balls, tires and any other structural or support elements in a mechanical, architectural or any other device.

New reference numerals used in the FIGS. 1-79 are further defined as follows:

Ref. No 500: An outer compartment, such as an outer compartment 161 or chamber 188 or bladder, at least partially or mostly or entirely enclosing a space within the outer compartment/chamber/bladder 500, which can be located anywhere in a footwear sole or upper or both or other article described in this application. Construction and materials can be, as one embodiment example, simpler in shape but otherwise similar to those used in any commercial samples of Nike Air™.

Ref. No 501: An inner compartment, such as an inner compartment 161 or chamber 188 or bladder, is located inside the enclosed space of the outer compartment/chamber/bladder 500. Construction and materials of the inner compartment/chamber/bladder 501 can be, as one embodiment example, like those used in any commercial samples of gas bladders in Nike Air™.

Ref. No. 502: Structural element that is optional anywhere within either outer compartment/chamber/bladder 500 or inner compartment/chamber/bladder 501, of which a 501 embodiment is shown; any flexible, resilient material can be used, including structures molded into the shape of (and using the material of) the compartment/chamber/bladder 500 or 501, as is very common in the art, such as many commercial samples of gas bladders used in Nike Air™, as well as foamed plastic or plastic composite or other materials, like Nike Shox™ or Impax™ or Reebok DMX™ or New Balance N-ergy™. In addition, other materials can be used directly within a 501/500 compartment or can connected to or through a 501/500 compartment, as in the cushioning components of the shoe sole heel of commercial samples of Adidas 1™, including electromechanical, electronic, and other components. Some devices may benefit from the use of rigid or semi-rigid materials for part or all of a media within a compartment.

Ref. No. 503: Attachment of two compartment/chambers/bladders 500/501, including particularly attachment of outer 500 to inner 501; any practical number of attachments of any form using any materials can be used, including glue.

Ref. No. 504: Media contained within all or part of compartment/chamber/bladder 500 or 501, particularly 501, can be any useful material, such as gas (including, as an example, gas used in Nike Air™ or ambient air, liquid or fluid, gel, or foam (such as a plastic like PU or EVA or equivalent or rubber (natural or synthetic) or combination of two or more; encapsulation of foam is optional); material particles or coatings, such as dry coatings like Teflon™ can also be used. An optional element in an outer compartment/chamber 500 (or an inner compartment/chamber 501 that itself contains an inner compartment/chamber, as in FIG. 87).

Ref. No. 505: Internal sipe or slit or channel or groove for flexibility, such as between inner and outer compartment/chamber 500/501 (or bladder) surfaces, as one embodiment example; such surfaces can be substantially parallel and directly contact in one useful embodiment example, but are not attached so that at least parts of the two surfaces can move relative to each other, such as to facilitate a sliding motion between surfaces; the surfaces can be in other useful forms that allow portions of the surfaces to be proximate to each other but not contacting in an unloaded condition or in a partially loaded condition or in a maximally loaded condition.

Ref. No. 506: Media of internal sipe 505; media 506 can be any useful material like those used in media 504; media 506 can be located in part or all of 505 to decrease (or increase) sliding resistance between 500/501 or 505 surfaces, for example, to lubricate the surfaces with any suitable material; silicone or Teflon™ can be used, for example; an optional element.

Ref. No. 507: Metal particles.

Ref. No. 508: Shock absorbing fluid containing 507; a magnetorheological fluid.

Ref. No. 509: Electromagnetic field-creating circuit.

Ref. No. 510: A flexible insert or component including siped compartments 161 or chambers 188 or bladders used for example as outer and inner compartments/chambers/bladders 500/501 for footwear soles or orthotics or uppers or other uses; a useful embodiment being two or more compartment or chambers (or bladders) 161/188 (or mix) that are separated at least in part by an internal sipe 505, including the example of at least one 501 (either 161/188 or bladder) inside at least one 500 (either 161/188 or bladder) and being separated by an internal sipe 505.

Ref. No. 519: Piezoelectric components

Ref. No. 550: Any structural or support element with a device 510/511/513 described herein previously, including a helmet or other apparel or equipment for humans or animals or other biologically based product; or a tool (power or manual), club, or racquet handle, grip, shaft, body, or head; a beam or strut or any other element in any device, including mechanical or architectural.

Ref. No. 580: Computer

Ref. No. 581: Micro-technology and nanotechnology devices, including a semiconductor microchip device (a part of a die or an entire die or multiple dies assembled together) microelectromechanical systems (MEMS), field-programmable gate arrays (FPGA's) and faraday cages, photovoltaic cells, fuel cells, batteries, and including devices assembled at the molecular or atomic scale.

FIGS. 1-7 show, as numeral 510, examples of a device or flexible insert including siped compartments 161 or chambers 188 or bladders (another term used in the art) for use in any footwear soles, including conventional soles 22 or the applicant's prior inventions, including footwear/shoe soles 28 and midsole inserts 145 as described in applicant's published '087 application and 11/282,665 U.S. Application published Nov. 9, 2006, as Pub. No. US 2006/0248749 A1 incorporated by reference, or for orthotics 145 as described in the applicant's published '034 U.S. application, '869 Patent, and WO 02/09547 WIPO publication, as well as to be published by WIPO PCT Application Number PCT/US2005/042341, all incorporated by reference herein, including for uppers for footwear or orthotics (or including uppers), or for other flexibility uses in athletic equipment like helmets and apparel including protective padding and guards, as well as medical protective equipment and apparel, and other uses, such as protective flooring, improved furniture cushioning, balls and tires for wheels, and other uses.

The device or flexible insert with siped compartments or chambers 510 include embodiments like two or more of either compartments 161 or chambers 188 or bladders (or a any mix including two or more of a compartment, a chamber, and a bladder) that are separated at least in part or in several parts or mostly or fully by an internal sipe 505. The flexible insert 510 can be inserted during assembly of an article by a maker or manufacturer or is insertable by a user or wearer (into an article like a shoe, for example, as part of a removable midsole insert 145 described above), or integrated into the construction of a device as one or more components.

Siped compartments or chambers 510 include example embodiments such as FIGS. 1-7, which generally show at least one inner compartment 161 or chamber 188 inside at least one other outer compartment 161 or chamber 161; and the two compartments/chambers 161/188 being separated by an internal sipe 505.

One practical example embodiment of the invention is any prior commercial embodiment of Nike Air™ gas bladder or compartment (like typical examples in FIGS. 12-16 of U.S. Pat. No. 6,846,534, which is hereby incorporated by reference) that is installed unattached, as is, located within the space enclosed partially or fully by a new, slightly larger outer compartment of one additional layer of the same or similar material, with the same or a simpler or the simplest geometric shape; that is, not necessarily following indentations or reverse curves, but rather incorporating straighter or the straightest lines, as seen in cross-section: for example, following the outermost side curvature seen in FIGS. 12-16, but with upper and lower surfaces that are substantially flat and parallel (or curved and parallel), to facilitate ease of movement between the two surfaces of the sipe 505 formed, increasing the resulting flexibility.

The new additional, outer compartment thus thereby has created by its presence an internal sipe 505 between the two unconnected compartments. The new internal sipe 505 provides much greater flexibility to any footwear sole 22 or 28, since it allows an inner, otherwise relatively rigid Nike Air™ compartment structure to become an inner compartment 501 (instead of typically being fixed into the other materials such as EVA of the footwear sole) to move freely inside the new outer compartment 500, which becomes a new compartment that is fixed to the footwear sole, rather that the conventional Nike Air™ bladder. The flexibility improvement allows the shoe sole to deform under a body weight load like a wearer's bare foot sole, so that stability is improved also, especially lateral stability.

The result is that the conventional, inner Nike Air™ compartment—now contained by a new outer compartment—can move easily within the overall footwear sole, allowing the sole to bend or flex more easily in parallel with the wearer's bare foot sole to deform to flatten under a body weight load, including during locomotion or standing, so that footwear sole stability is improved also, especially lateral stability. The extent to which the inner Nike Air™ compartment is "free-floating" within the new outer compartment can be controlled or tuned, for example, by one or more attachments (permanent or adjustable) to the outer compartment or by the media in the internal sipe.

The internal sipe 505 includes at least two surfaces that can move relative to each other to provide a flexibility increase for a footwear sole so that the shape of the footwear sole can deform under a body weight load to better parallel to the shape of the barefoot sole of a wearer under a same body weight load. The relative motion between the two internal sipe 505 surfaces increases the capability of the footwear sole to bend during locomotion under a wearer's body weight load to better parallel the shape of said wearer's bare foot sole.

In an analogous way, especially to the thicker heel portion of a typical shoe sole, a thick urban area telephone book has in effect hundreds of mostly "internal sipes", each page being in effect separated by a horizontal internal slit from each adjacent page, each of which thereby is able to move freely relative to each other, resulting in a flexible telephone book that bends quite easily, while at the same time relatively stable when a vertical force like body weight is applied.

In contrast, if the same wood fiber material with the same dimensions as a thick telephone book were formed instead into a single piece with no pages, like a solid particle board, it would be quite rigid.

If, instead, the sipes were rotated 90 degrees into vertical slits and open to the bottom, so that the spine of the telephone book is on top, those external sipes would also provide a substantial amount of flexibility, but at the cost of excessive instability when a vertical force like body weight is applied.

Also, the sliding motion between internal support surfaces within the shoe sole 28 allowed by internal sipe 505 in response to torsional or shear forces between a wearer's foot and the ground assists in controlling and absorbing the impact of those forces, whether sudden and excessive or chronically repetitive, thereby helping to protect the wearer's joints from acute or chronic injury, especially to the ankles, knees, hips, lower back, and spine.

A benefit of the siped compartments/chambers 510 is that, as a single unitary component, it can be used in any conventional manner in constructing the footwear sole 28, generally like that used with a conventional single layer compartment such as used in Nike Air™; i.e. the outer surface of 510 can, as a useful embodiment, adhere to the adjacent materials like plastic such as PU (polyurethane) or EVA (ethyl vinyl acetate) or other plastic or rubber of the footwear sole that contact the 510 component, just as would be the case with the outer surface of existing single compartment 161 or chamber 188 of commercial examples of Nike Air™. However, the internal sipe 505 formed by the use of an inner compartment/chamber 501 in the siped compartment/chamber 510 provides flexibility in a footwear sole 28 that is absent in the relatively rigid footwear sole 28 formed with a conventional, single layer compartment 161 or chamber 188 of the many Nike Air™ commercial examples.

The sipe surfaces can in one useful example embodiment be formed by the inner surface (or part or parts of it) of the outer compartment 500 and the outer surface (or part or parts of it) of the inner compartment 501. Such sipe surfaces can be substantially parallel and directly contact each other in one useful embodiment example, but the two surfaces are generally not attached to each other, so that the sipe surfaces can move relative to each other to facilitate a sliding motion between the two surfaces.

The sipe surfaces can be in other useful forms that allow portions of the surfaces to be proximate to each other in an unloaded condition, rather than contacting; such surfaces can make partial or full direct contact under a wearer's body weight load (which can vary from a fraction of a "g" to multiple "g" forces during locomotion) or remain somewhat separated; the amount of sipe surface area making direct contact can also vary with a wearer's body weight load. The sipes surfaces also may not be parallel or only partially parallel, such as the areas of direct surface contact or proximal surface contact.

To preclude the surfaces of the internal sipe 505 from directly contacting each other (whether loaded or unloaded), the sipe surfaces can include an internal sipe media 506 located between the surfaces to reduce friction by lubrication and increase relative motion and therefore flexibility. Useful example embodiments of the internal sipe media 506 include any useful material known in the art (or equivalent), such as a liquid like silicone as one example, a dry material like Teflon™ as another example, or a gas like that used in Nike Air™ as a further example. The media 506 can be located in all of the sipe 505 or only part or parts, as shown in FIGS. 1-6.

The media 506 can be used to decrease (or increase) sliding resistance between the inner surfaces of the sipe; for example, to lubricate with any suitable material known in the art. The internal sipe media 506 is an optional feature.

The siped compartments/chambers 510 can be located anywhere in the footwear sole or orthotic or upper and can be used in other applications, including non-footwear applications where flexibility increases are useful). The siped compartments/chambers 510 can be made, for example, with any methods and materials common in the footwear arts or similar arts or equivalents, like those in various Nike Air™; see for example U.S. Pat. Nos. 4,183,156 and 4,219,945 to Rudy (which show fluid-filled bladder manufacturing through a flat sheet bonding technique), 5,353,459 to Potter et al. (which shows fluid-filled bladders manufactured through a blow-molding process), as well as 6,837,951 and FIGS. 12-16 of 6,846,534, all of which patents are herein incorporated by reference) or similar commercial examples like Reebok DMX™ compartments in its original form, as seen for example U.S. Pat. No. 6,845,573 (herein incorporated by reference), column 5, line 41 to column 6, line 9), or New Balance N-ergy™ (see for example FIG. 1 of WIPO Pub. No. WO 00/70981 A1, but note that, as a example, at least the initial production versions of the N-erny compartment can have less rigidity to allow better flexibility) or Asics Gel™ (many versions) compartments or future equivalents of any, or with less common materials, such as fibers described above incorporated into or on the surface of the material of the siped compartment/chambers 510, including either elastic fibers or inelastic fibers or a mix. The siped compartment/chambers 510 can be of any practical number in a footwear sole or any shape, of which useful example embodiments include regular geometric shapes or irregular shapes, including anthropomorphic or animal shapes; and the 510 number or shape can be symmetrical or asymmetrical, including between right and left footwear soles.

Figure 25A:
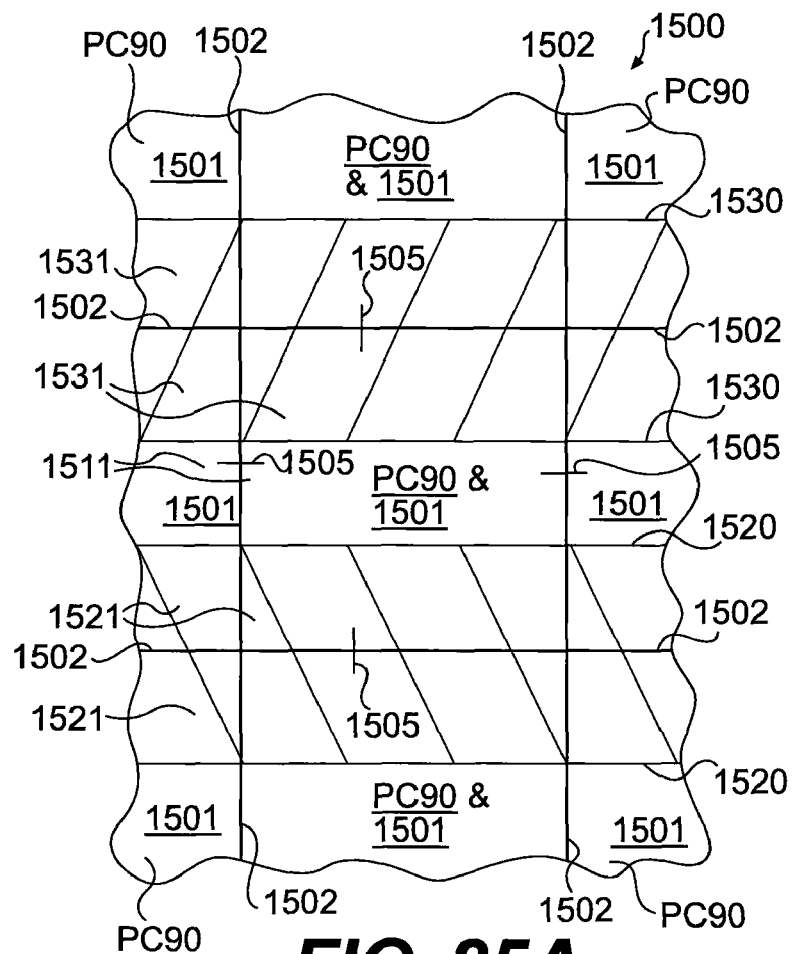
Figure 26A:
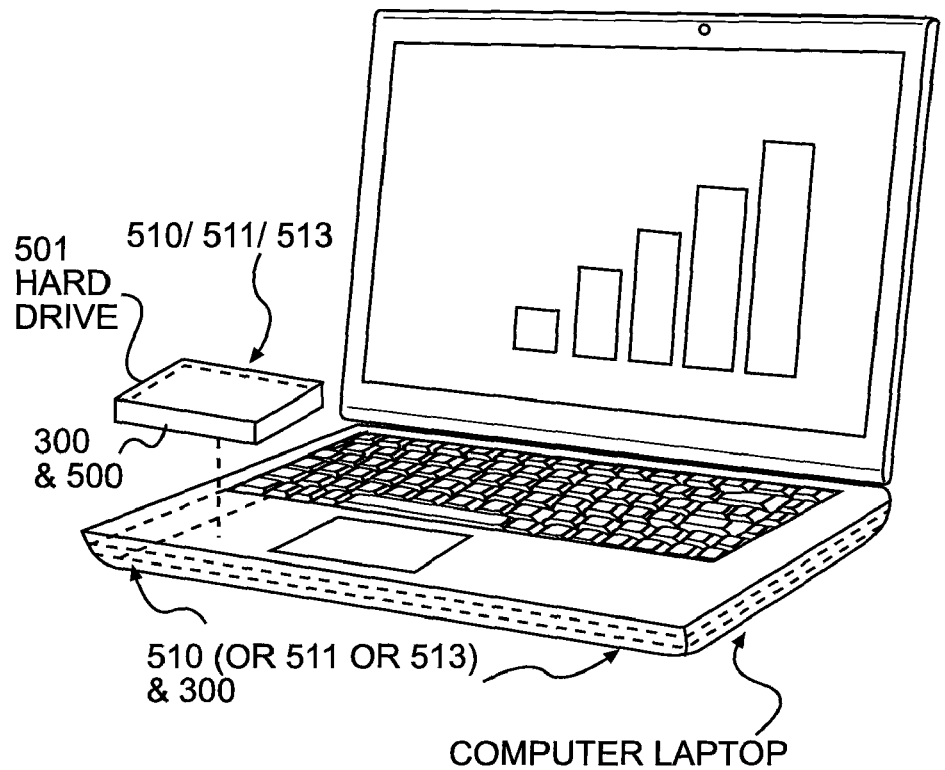
FIGS. 26A-26B is FIGS. 7A-7B with the addition of Faraday Cages, as well as stacked dies in FIG. 7B.

Either of the compartments 161 or chambers 188 of the siped compartment/chambers 510 (or 511 or 513) can include one or more structural elements 502 like those common in the footwear art such as in Nike Air™ as noted in the above cited Rudy and Nike patents, also including Tuned Air™ (See for example U.S. Pat. No. 5,976,451 to Skaja et al, which is herein incorporated by reference and which shows manufacturing of fluid-filled bladders through a vacuum-forming process) or Zoom Air™ (See for example FIGS. 1-3 of U.S. App. No. 2005/0039346 A1, which is herein incorporated by reference); a number of example embodiments of inner compartments 501 with structural elements 502 are shown in the FIGS. 1A, 9, 13, and 14. The structural elements 502 can be made of any useful material known in the art and constructed in any manner known in the art. FIGS. 25A and 26A show similar example embodiments wherein the structural elements 502 of the inner compartment 501 are formed with a specific shape and foamed plastic material such as PU or EVA like that of Nike Shox™ (See U.S. Pat. Nos. 5,353,523, 5,343,639, and 6,851,204, which are herein incorporated by reference) and Nike Impax™ (U.S. D500,585 S, which is herein incorporated by reference), respectively, and can be affixed to the inner compartment 501, which can be reinforced as necessary (instead of to rigid lower and/or upper plates); the lower surface of the outer compartment 500 can be attached to an outer sole, at least in part or an outer sole can be integrated into the outer compartment 500 by thickening, for example, or incorporating rubber or rubber substitute material. Other commercial existing examples that can be similarly modified as a device or flexible insert or component 510 (or 511 or 513) are Adidas a³™ Energy-Management Technology and Adidas™ Ground Control System (GPS)™, and Reebok DMX™ Shear Heel or other cushioning technologies.

Figure 25B:
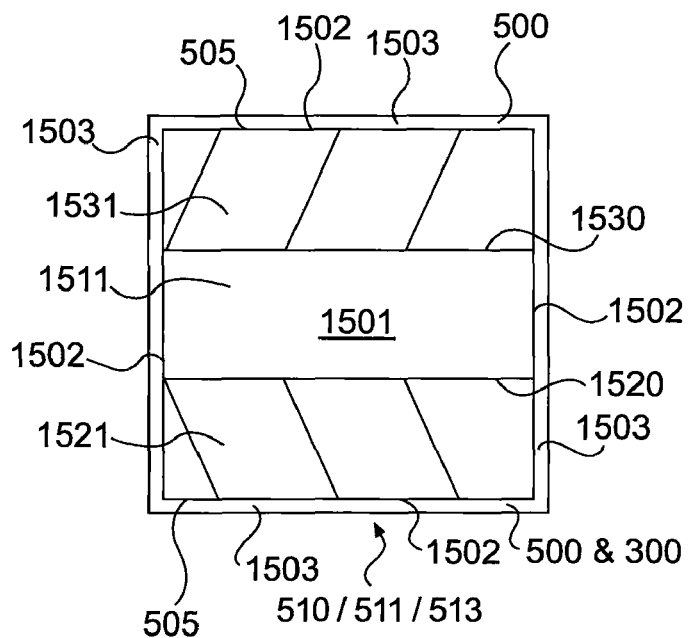
Figure 26B:
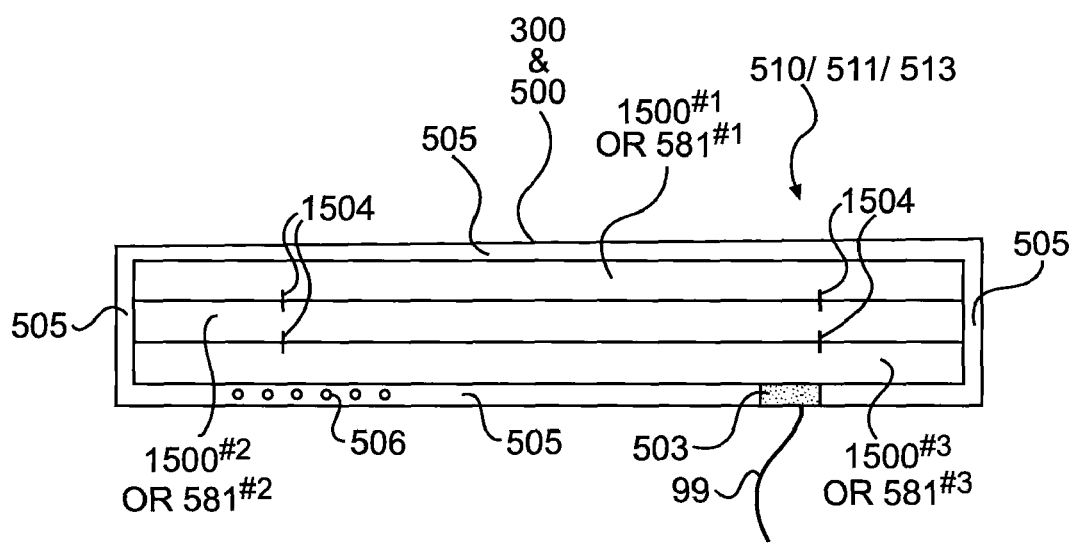

Also, as shown in the example embodiments of FIGS. 26B and 25B, since foamed plastic material does not require containment (unlike a gas, liquid, or most gels), if the structural elements 502 are sufficiently interconnected, like for example Nike Impax™ in FIG. 26B, or if the separate support columns 32 and midsole wedge 40 of Nike Shox™ are modified to interconnect like the example shown in FIG. 25B, then those connected structural elements 502 can form an integral inner compartment 501, the outer surface of which can form an internal sipe 505 with the new outer compartment 500. The interconnection can be complete, with each structural elements 502 connected to at least the closest other elements 502, as shown, or mostly complete, or partial. The Shox™ support columns 32 can be any practical number, such as existing examples of four or five or six (all commercially available) or more in the heel and many more in the forefoot of the shoe sole 22 or 28, for a total of eleven in existing commercial examples.

Any of the compartments or chambers 161/188 of the siped compartment 510 can be permanently or temporarily attached one to another with at least one attachment 503 of any useful shape or size or number or position; embodiment examples are shown in FIGS. 1A, 2A, 3A, 4A, 5A, 6A, and 8. Anthropomorphic designs would suggest including positioning attachments 503 on the internal sipe 505 closest to a wearer's foot sole as a useful embodiment, so that the remaining sipes 505 would have a U shape in cross-section, like the structure of human foot sole fat pads, which are analogous to the cushioning midsole and midsole components of footwear soles.

The attachments 503 can be simply passive (i.e. static) or actively controlled by electronic, mechanical, electromagnetic, or other useful means. The attachments 503 can, for example, be designed to break away as a failsafe feature to compensate for a predetermined extreme torsional load, for example, to reduce extreme stress on critical joints (in lieu of a wearer's cartilage, tendons, muscle, bone, or other body parts being damaged); the attachments 503 can then be reset or replaced (or, alternatively, return automatically upon relief of extreme stress to a normal position).

Example embodiments of the compartments and chambers 500/501 can include a media 504 such as a gas (like that used in Nike Air™ or ambient atmospheric air), a liquid or fluid, a gel, a foam (made of a plastic like PU or EVA, both of which are common in the footwear art, or equivalent, or of a rubber (natural or synthetic) or blown rubber or a rubber compound or equivalent or of another useful material or of a combination of two or more of the preceding foam plastic/rubber/etc.) or a useful combination of one or more gas, liquid, gel, foam, or other useful material.

Figure 2A:
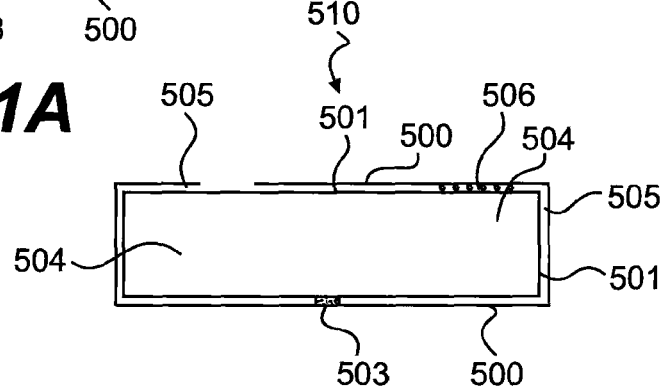
Figure 1B:
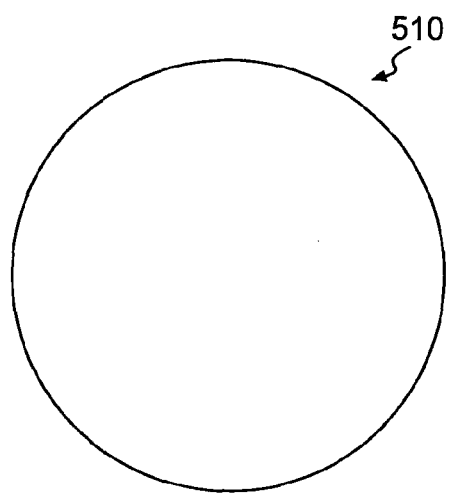
Figure 2B:
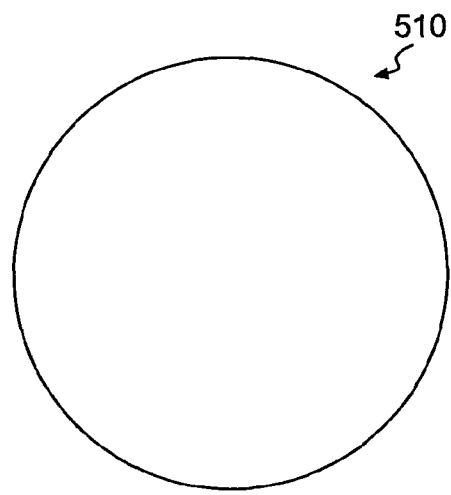

Also, any inventive combination that is not explicitly described above in the example shown in FIG. 1 is implicit in the overall invention of this application and, consequently, any part of the example embodiments shown in preceding FIG. 1 and/or associated textual specification can be combined with any other part of any one or more other elements of the invention or prior art examples described in FIGS. 2-79 and/or associated textual specification and/or, in addition, can be combined to make new and useful improvements over the existing art with any one or more other elements of the inventive or prior art examples shown in FIGS. 1-75 of both the applicant's prior footwear U.S. application Ser. No. 11/190,087, published as Pub. No. 2005/0268487 A1 on Dec. 8, 2005, and the applicant's prior orthotic U.S. Pat. No. 7,010,869, issued Mar. 14, 2006, as well as continuation U.S. application Ser. No. 11/108,034, published as Pub. No. 2005/0217142 A1 on Oct. 6, 2005, each of which is incorporated by reference herein for completeness of disclosure, as well as U.S. application Ser. No. 11/282,665 published as Publication No. US 2006/0248749 A1, on Nov. 9, 2006, which is also hereby explicitly incorporated by reference herein in its entirety for completeness of disclosure, as including additional FIGS. 76-82, any part or parts of which figure or figures can be combined with any part or parts of any figure or figures of this application. In addition, any one or more features or components of FIG. 1 and FIGS. 2-79 can be usefully combined with one or more features or components of FIGS. 1-43 of the applicant's earlier application Ser. No. 11/179,887 published as Publication No. US 2005/0241183 A1 on Nov. 3, 2005 describing footwear, which application is hereby incorporated by reference herein.

Figure 3A:
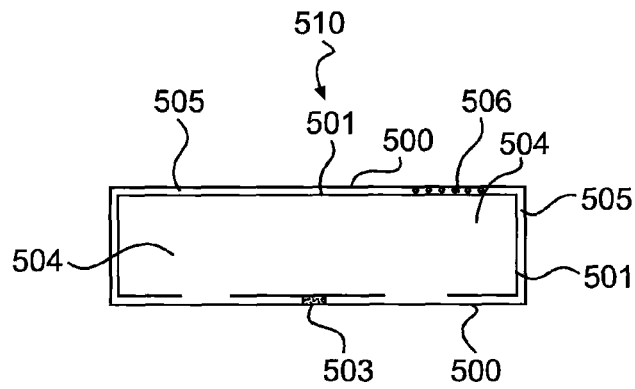
Figure 4A:
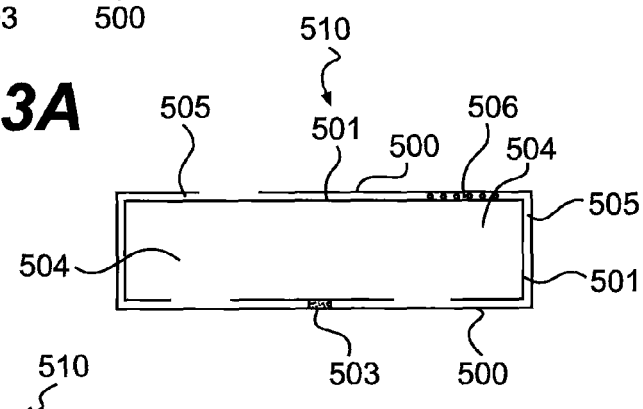
Figure 3B:
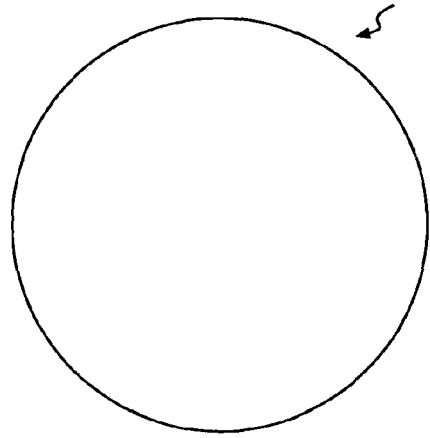
Figure 4B:
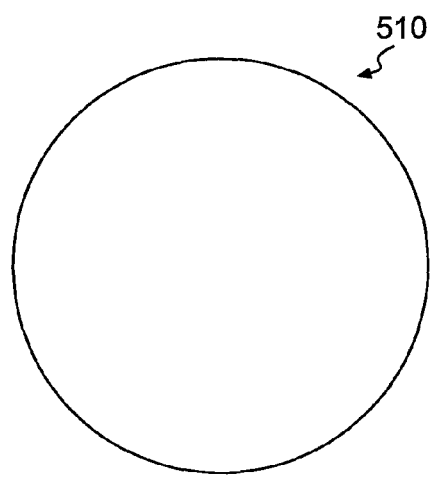

FIGS. 2A, 3A, and 4A show examples of embodiments of siped compartment/chamber/bladders 510 wherein either the inner compartment/chamber/bladder 501 or the outer compartment 500 can have one or more openings, for pressure equalization, assembly facilitation, or other purposes.

Figure 5A:
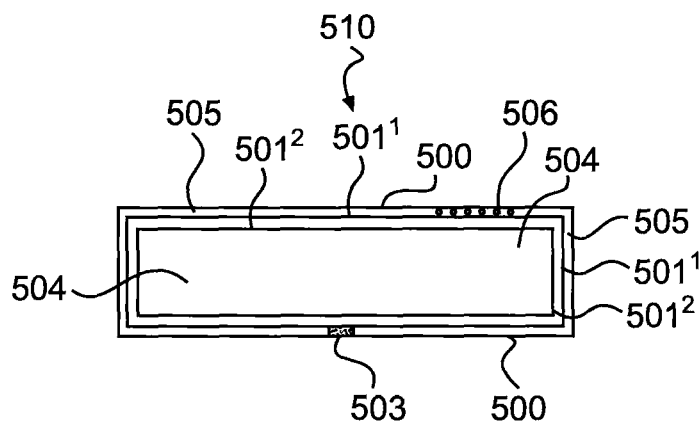
Figure 5B:
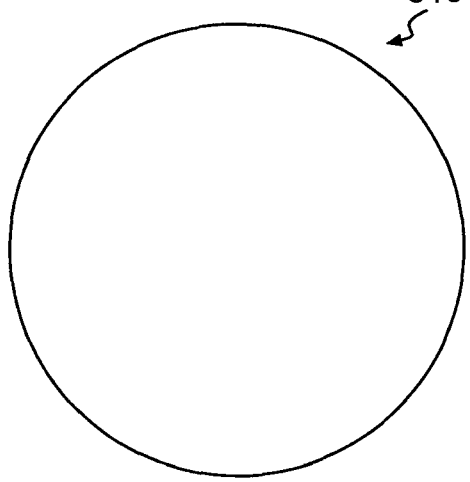
Figure 6B:
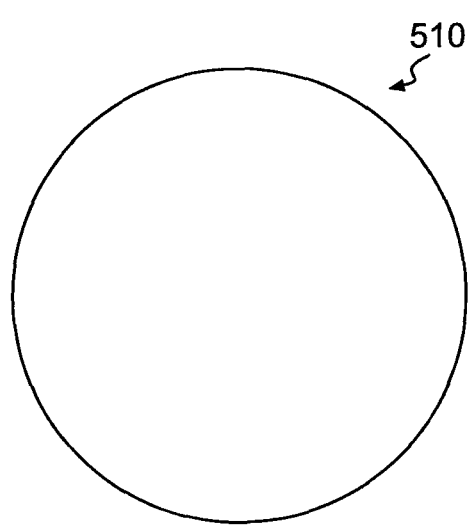

Also, any inventive combination that is not explicitly described above in the example shown in FIG. 2-4 is implicit in the overall invention of this application and, consequently, any part of the example embodiments shown in preceding FIG. 2-4 and/or associated textual specification can be combined with any other part of any one or more other elements of each other or the invention examples described in FIGS. 1 and 5-79 and/or associated textual specification, in addition, can be combined to make new and useful improvements over the existing art with any one or more other elements of each other or the inventive or prior art examples shown in prior published FIGS. 1-75 of the '869 patent and the '087, '034 and '665 Applications, as well as additional FIGS. 76-82 of the '665 Application, and also added FIGS. 1-43 of the '887 Application.

FIG. 5A shows an example embodiment with an inner compartment/chamber/bladder $501^1$ having a smaller inner compartment/chamber/bladder $501^2$; additional smaller inner compartments 501 are possible in a similar progression, either enclosed within the previous larger inner compartment 501 or within the same 501 or 500.

Figure 6A:
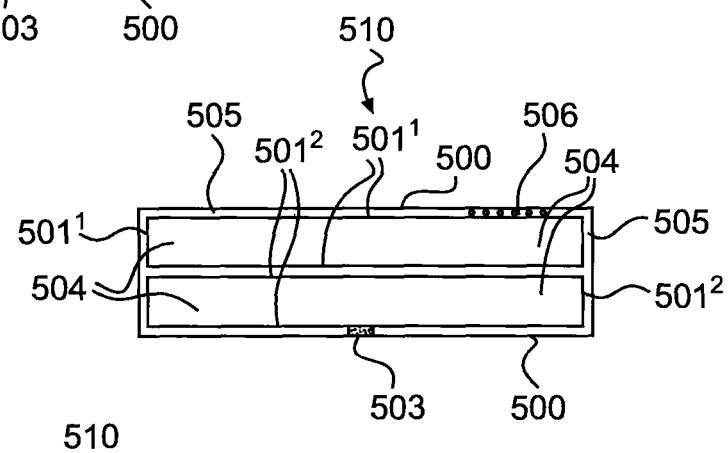

FIG. 6A shows an example embodiment with two inner compartment/chamber/bladders $501^1$ and $501^2$ which are layered within outer compartment/chamber/bladder 500; additional compartment/chamber 501 layers can be useful also.

FIG. 1B shows an example embodiment of the device 510 in a horizontal plane view of FIGS. 1A, 2A, 3A, 4A, 5A, and 6A.

Figure 1C:
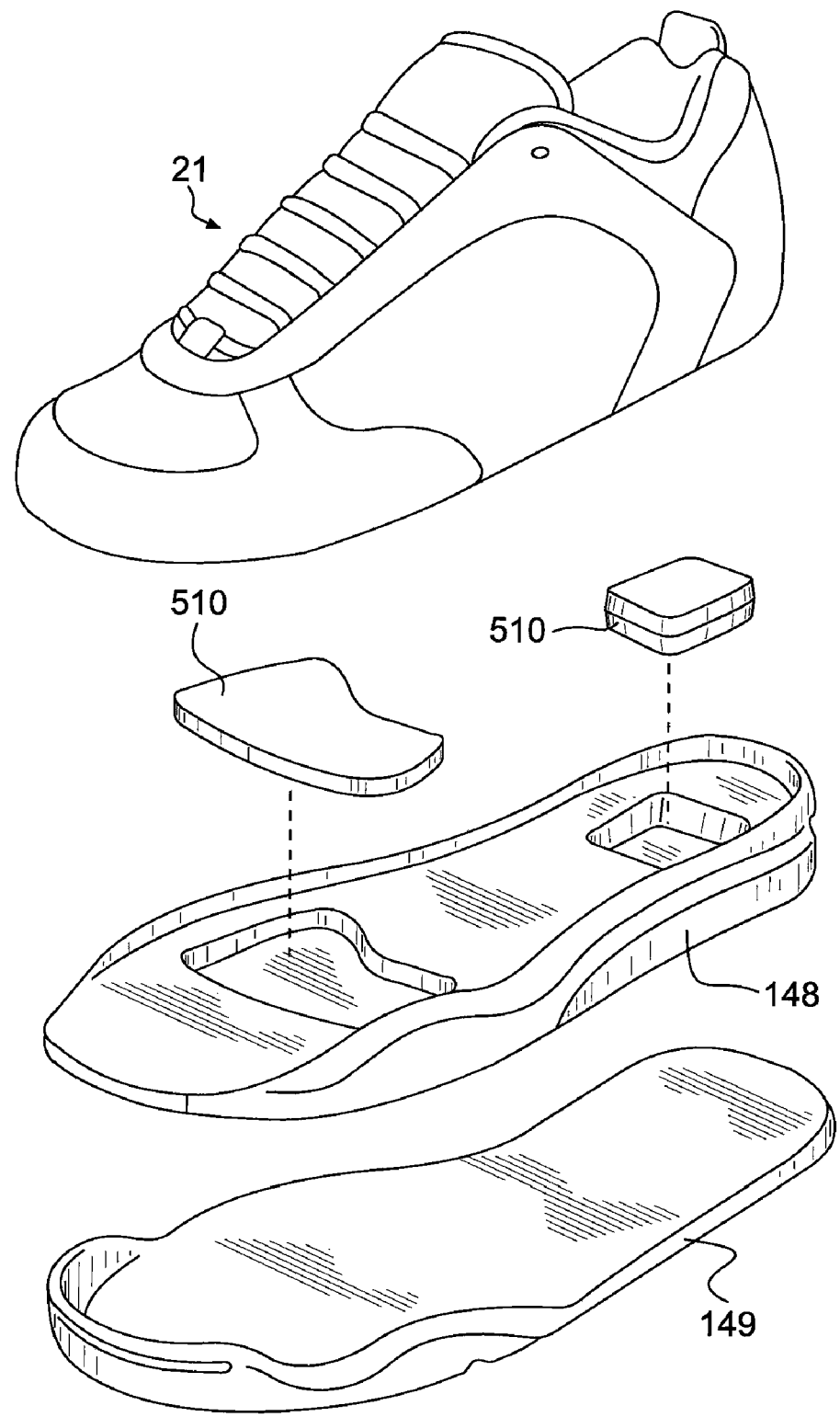
FIG. 1C is an exploded perspective view showing the relationship of an insert device 510, which has a siped compartment or chamber or bladder, with a midsole, bottom sole, and upper of a shoe or other footwear.

FIG. 1C is an exploded perspective view showing the relationship of an insert device 510, which has a siped compartment or chamber or bladder, with a midsole 148, bottom sole 149, and upper 21 of a shoe or any other footwear. The midsole 148 and bottom sole 149 (and any additional layers not shown) together form a shoe sole which can be any footwear sole, including any conventional sole 22 or any sole 28 according to one of the applicant's patents or applications. In the simple example shown, the device 510 can be inserted during a conventional manufacturing or assembly process or by a footwear wearer and can be located anywhere in the footwear sole and/or upper.

FIG. 1E shows a detailed frontal plane cross section of an example conventional commercial gas bladder/compartment/chamber shown as inner bladder or compartment or chamber 501 in schematic perspective in FIG. 1D. FIG. 2F shows the same detailed cross sectional view of the same inner bladder or compartment or chamber 501 enveloped by an outer bladder or compartment or chamber 500 forming an insertable siped compartment 510, including wherein all or part of the sipe 505 is a slit.

Figure 7A:
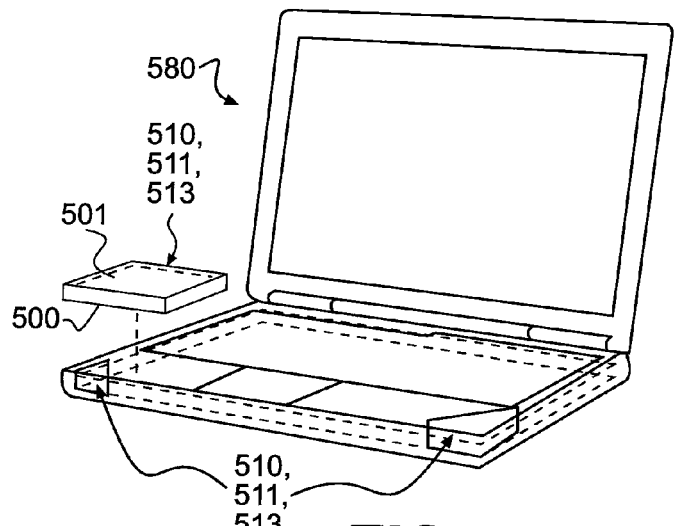
FIG. 7A shows a computer laptop with the 510/511/513 inventions and FIG. 7B shows a semiconductor microchip with the 510/511/513 inventions.

FIG. 7A shows a perspective view of a laptop personal computer 580 or any other electronic device with one of a potential multitude of potential example embodiments of the applicant's 510 or 511 or 513 inventions described above are used in two areas, but other useful embodiments with any of the previously described variations can be employed beneficially. For example, as shown, the 510/511/513 inventions can be used for cushioning selected corners of the laptop or can be integrated in the laptop frame in the same or other areas; and/or individual components of the laptop computer such as a harddrive can be protected by being mounted in a protected 510/511/513, such as the housing of the hard-drive forming an inner compartment 501 of the 510 siped compartment invention.

Figure 7B:
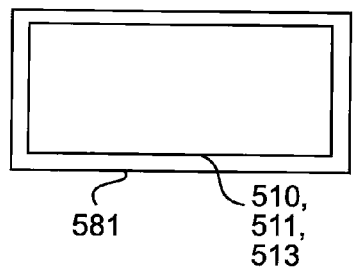

FIG. 7B shows a semiconductor microchip device 581 example including a part of a die or an entire die or multiple dies assembled together using the applicant's 510/511/513 invention; other devices 581 can include other micro-technology and nanotechnology devices, including microelectromechanical systems (MEMS), field-programmable gate arrays (FPGA's) and faraday cages, photovoltaic cells, fuel cells, batteries, and including devices assembled at the molecular or atomic scale. The FIG. 7B example embodiment can include a single layer of die or dies or can include a stacked arrangement of two or more layers of separate dies. FIG. 7C shows a cross section of the semiconductor microchip device 581 example of FIG. 7B, showing a stacked arrangement of three layers of separate dies 581#1, 581#2, and 581#3.

Figure 7D:
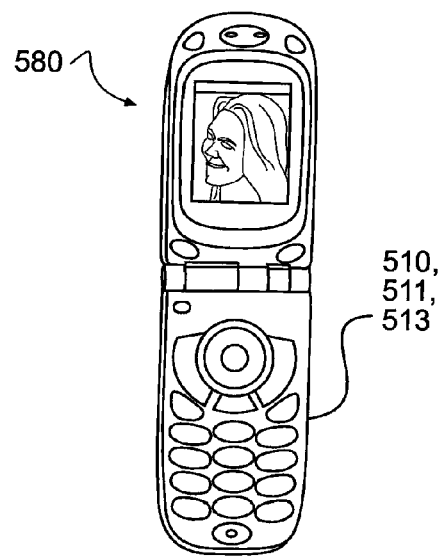
FIGS. 7C-7D show additional examples of the 510/511/513 inventions applied to electronic game controllers and cell phone.
Figure 7C:
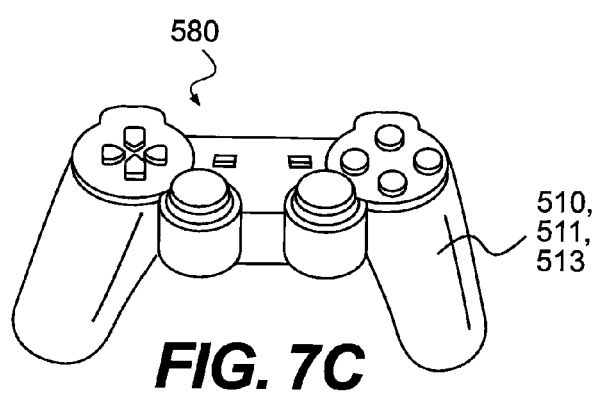

FIGS. 7C and 7D show other examples such as electronic game controllers or any other remote controllers 580 and cell phones 580 that can beneficially incorporates any of the applicant's 510/511/513.

Figure 8:
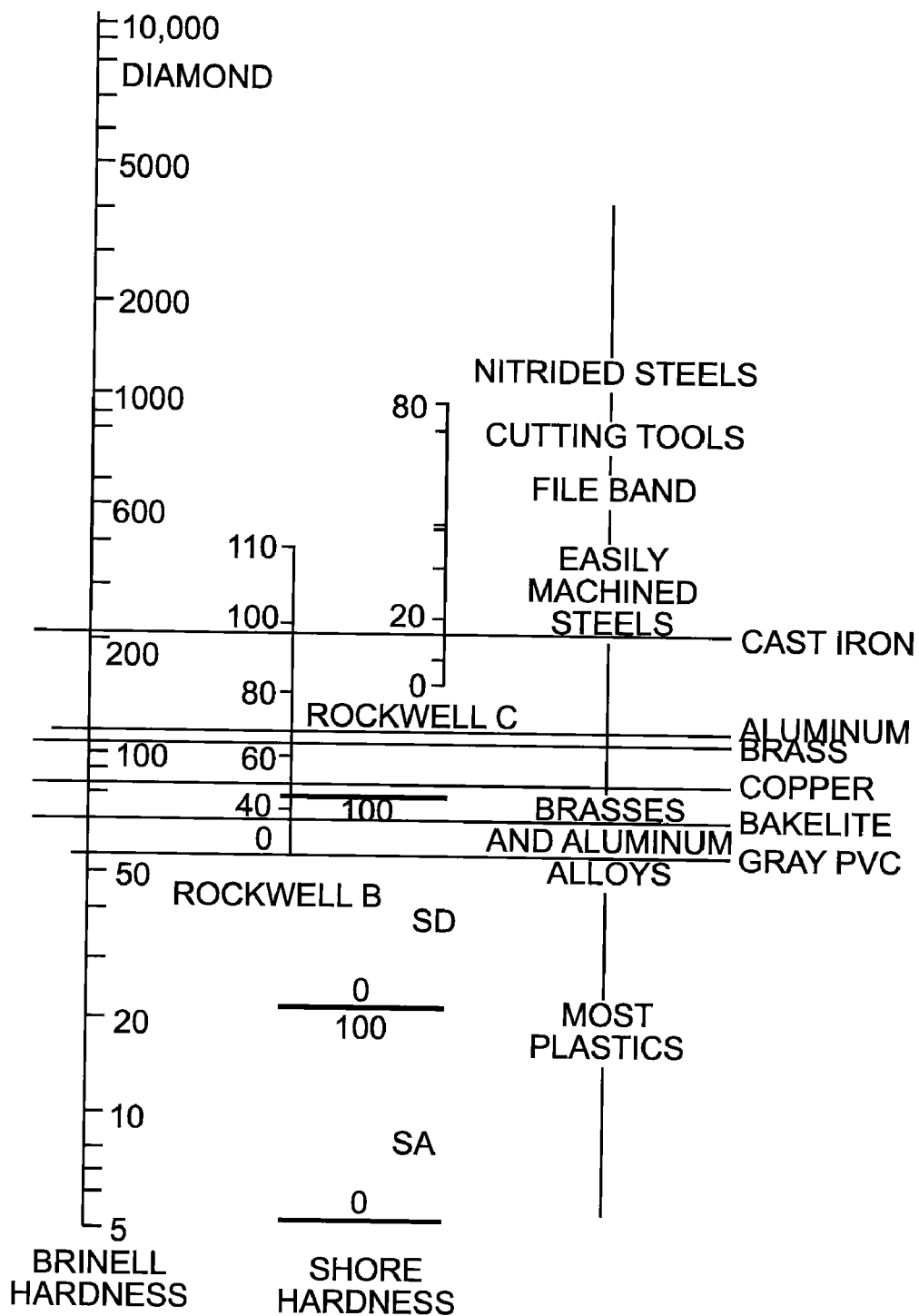

FIG. 8 shows a chart displaying "Approximate Comparison of Hardness Scales". Products using the 510 or 511 or 513 inventions can be made of any material and any material hardness shown in chart, including Rockwell C and B Scales and Brinell Hardness Scale, including metallic and ceramic, generally for non-cushioning, relatively rigid structural elements into which a degree of flexibility is to be introduced using the applicant's 510/511/513 inventions, specific examples of which are shown in FIGS. 7A-7B.

FIG. 9A shows that, in an analogous way, especially to the thicker heel portion of a typical shoe sole, a thick urban area telephone book has in effect hundreds of mostly "internal sipes", each page being in effect separated by a horizontal internal slit from each adjacent page, each of which thereby is able to move freely relative to each other, resulting in a flexible telephone book that bends quite easily as is well known by all, while at the same time relatively stable when a vertical force like body weight is applied. FIG. 9B shows, in contrast, if the same wood fiber material with the same dimensions as a thick telephone book were formed instead into a single piece of wood with no pages, like a solid particle board, it would be quite rigid with little flexibility, although it will support a body weight stably. FIG. 9C shows if, instead, the sipes were rotated 90 degrees into vertical slits and open to the bottom, so that the spine of a much wider telephone book with shorter pages is on top (in the form of a shoe sole with deep open external sipes, those external sipes would also provide a substantial amount of flexibility like that of the human foot sole, but at the cost of excessive instability when a vertical force like body weight is applied, as is obvious from common experience, since the pages will splay out uncontrollably.

FIGS. 10-22 of this application are FIGS. 10A-10I, 16A-16Z, 16AA, and 16AB, 17A-17D, 21B, 22A, 23A-23E, 25A-25D, 26A-26C, 27A-27H, 28, 29A, 30A-30C, and 31 of both the applicant's U.S. application Ser. No. 10/802,049 filed May 17, 2004 and published on Oct. 28, 2004 as Pub. No. US 2004/0215931 A1.

As shown in FIGS. 10A-10F, to deal with operational and security issues, it may be beneficial for individual users to have one microprocessor or equivalent device that is designated, permanently or temporarily, to be a master 30 controlling device (comprising hardware and/or software and/of firmware and/or other component) that remains inaccessible (using, for example, a hardware and/or software and/or firmware and/or other component firewall 50) directly by the network but which controls the functions of the other slave microprocessors 40 when the network is not utilizing them.

For example, as shown in FIG. 10A, a typical PC 1 may have four or five microprocessors (even on a single microprocessor chip), with one master 30 and three or four slaves 40, depending on whether the master 30 is a controller exclusively (through different design of any component part), requiring four slave microprocessors 40; or the master microprocessor 30 has the same or equivalent microprocessing capability as a slave 40 and multiprocesses in parallel with the slave microprocessors 40, thereby requiring only three slave microprocessors 40. The number of PC slave microprocessors 40 can be increased to virtually any other number, such as at least about eight, about 16, about 32, about 64, about 128, about 256, about 512, about 1024, and so on. These multiples are not required, and the number of PC master microprocessors 30 may be increased. Also included is an internal firewall 50 between master 30 and slave 40 microprocessors. As shown in preceding FIGS. 1-9, the PC 1 in FIG. 10A may be connected to a network computer 2 and to the Internet or WWW or present or future equivalent or successor 3, like the Grid (or MetaInternet).

Other typical PC hardware components such as hard drive 61, floppy diskette drive 62, compact disk-read only memory (CD-ROM) 63, digital video disk (DVD) 64, Flash memory 65, random access memory (RAM) 66, video or other display 67, graphics card 68, and sound card 69, as well as digital signal processor or processors, together with the software and/or firmware stored on or for them, can be located on either side of internal firewall 50, but such devices as the display 67, graphics card 68 and sound card 69 and those devices that both read and write and have non-volatile memory (retain data without power and generally have to be written over to erase), such as hard drive 61, Flash memory 65, floppy diskette drive 62, read/write CD-ROM 63 or DVD 64 may be located on the PC user side of the internal firewall 50, where the master microprocessor is also located, as shown in FIG. 10A, for security reasons; their location can be flexible, with that capability controlled such as by password-authorized access.

Alternately, any of these devices that are duplicative (or for other exceptional needs) like a second hard drive 61', can be located on the network side of the internal firewall 50. RAM 66 or equivalent or successor memory, which typically is volatile (data is lost when power is interrupted), should generally be located on the network side of the internal firewall 50, but some can be located with the master microprocessor to facilitate its independent use.

However, read-only memory (ROM) devices including most current CD drives (CD-ROM's) 63' or DVD's (DVD-ROM) drives 64' can be safely located on the network side of the internal firewall 50, since the data on those drives cannot be altered by network users; preemptive control of use may remain with the PC user.

However, at least a portion of RAM can be kept on the Master 30 microprocessor side of the internal firewall 50, so that the PC user can retain the ability to use a core of user PC 1 processing capability entirely separate from any network processing. If this capability is not desired, then the master 30 microprocessor can be moved to the network side of the internal firewall 50 and replaced with a simpler controller on the PC 1 user side, like the master remote controller 31 discussed below and shown in FIG. 10I.

The master microprocessor 30 may also control the use of several or all other processors 60 owned or leased by the PC user, such as home entertainment digital signal processors 70, especially if the design standards of such microprocessors in the future conform to the requirements of network parallel processing as described above. In this general approach, the PC master processor uses the slave microprocessors or, if idle (or working on low priority, deferrable processing), makes them available to the network provider or others to use. Wireless connections 100, including optical wireless, are expected to be extensively used in home or business network systems, including use of a master remote controller 31 without (or with) microprocessing capability, with broad bandwidth connections such as fiber optic cable connecting directly to at least one component such as a PC 1, shown in a slave configuration, of the home or business personal network system; that connection links the home system to the network 2 such as the Internet 3, as shown in FIG. 10I. A business system may include broadband such as fiber optic or optical wireless links to most or all personal computers PC 1 and other devices with microprocessors, such as printers, copiers, scanners, fax machines, telephone and video conferencing equipment; other wired or wireless links also can be used.

A PC 1 user can remotely access his networked PC 1 by using another networked master microprocessor 30 on another PC 1 and using a password or other access control means for entry to his own PC 1 master microprocessor 30 and files, as is common now in Internet and other access. Alternately, a remote user can simply carry his own digitally stored files and his own master microprocessor or use another networked master microprocessor temporarily has his own.

In the simplest configuration, as shown in FIG. 10B, the PC 1 may have a single master microprocessor 30 and a single slave microprocessor 40, separated by an internal firewall 50, with both processors used in parallel or multitasking processing or with only the slave 40 so used, and connected with broad bandwidth such as optical fiber wire 99 to a network computer 2 and Internet 3 and successors like the Grid (or MetaInternet). Virtually any number of slave microprocessors 40 is possible. The other non-microprocessor components shown in FIG. 10A above may also be included in this simple FIG. 10B configuration.

As shown in FIG. 10C, microchips 90 are expected to integrate most or all of the other necessary computer components (or their present or future equivalents or successors), like a PC's volatile memory like RAM 66 (such as DRAM), graphics 82, sound 83, power management 84, network communications 85, and video processing 86, possibly including modem 87, non-volatile memory like flash (or magnetic like MRAM or ovonic unified memory) 88, system BIOS 88', digital signal processor (DSP) or processors 89, and other components or present or future equivalents or successors) and internal bus, on a single chip 90 (silicon, plastic, or other), known in the industry as "system on a chip". Such a PC microchip 90 can have the same architecture as that of the PC 1 shown above in FIG. 10A: namely, a master control and/or processing unit 93 and one or more slave processing units 94 (for parallel or multitasking processing by either the PC 1 or the Network 2), separated by an internal firewall 50 and connected by broad bandwidth wire 99 such as optical fiber cable to a network computer 3 and the Internet 3 and successors like the Grid (or MetaInternet). Alternatively, microchip 90 can be an "appliance" system on a chip.

Existing PC components with mechanical components like hard drive 61, floppy or other removable diskette 62, CD-ROM 63, and DVD 64, which are mass storage devices with mechanical features that will likely not become an integral part of a PC "system of a chip" may still be capable of connection to a single PC microchip 90 and control by a single PC master unit 93.

In the simplest multi-processor case, as shown in FIG. 10D, the chip 90 has a single master unit 93 and at least one slave unit 94 (with the master having a controlling function only or a processing function also), separated by an internal firewall 50 and connected by broad bandwidth wire 99 such as fiber optic cable to a network computer 3 and the Internet 3 (and successors like the Grid or MetaInternet). The other non-microprocessor components shown in FIG. 10A above may also be included in this simple FIG. 10D configuration.

As noted above, any computer may be both a user and provider, alternatively—a dual mode operating capability. Consequently, any PC 1 within the network 2, connected to the Internet 3 and successors like the Grid (or MetaInternet), can be temporarily a master PC 30 at one time initiating a parallel or multitasking processing request to the network 2 for execution by at least one slave PC 40, as shown in FIG. 10E. At another time the same PC 1 can become a slave PC 40 that executes a parallel or multitasking processing request by another PC 1' that has temporarily assumed the function of master 30, as shown in FIG. 10F. The simplest approach to achieving this alternation is for both master and slave versions of the parallel processing software to be loaded in each or every PC 1 that is to share in the parallel processing, so each PC 1 has the necessary software means, together with minor operational modifications, such as adding a switching means by which a signaled request for parallel processing initiated by one PC 1 user using master software is transmitted to at least a second PC 1, triggering its slave software to respond by initiating parallel processing.

As shown in FIGS. 10G and 10H, which are parallel to FIGS. 10E and 10F, the number of PC slave processors 40 can be increased to any virtually other number, such as at least about 4; as shown, the processing system is completely scalar, so that further increases can occur to, for example, about eight, about 16, about 32, about 64, about 128, about 256, about 512, about 1024, and so on; the PC master microprocessors 30 can also be increased.

In summary, as noted above relative to FIG. 10I, a PC 1 can function as a slave PC 40 and be controlled by a master controller 31, which can be remote and which can have limited or no microprocessing capability, but can as well have similar or greater capability. Such a master controller 31 is located on the PC user side of the internal firewall 50, under the control of the PC user, while the microprocessors 40 reside on the network side of the internal firewall 50. The master controller 31 may receive input from the PC user by local means such as keyboard, microphone, videocam or future hardware and/or software and/or firmware or other equivalent or successor interface means (as does a master processor 40) that provides input to a PC 1 or microprocessor 30 originating from a user's hand, voice, eye, nerve or nerves, or other body part; in addition, remote access by telephone, cable, wireless or other connection may also be enabled by a hardware and/or software and/or firmware and/or other means with suitable security such as password controlled access. Similarly, relative to a PC "system on a chip", a master controller unit (which could be capable of being accessed by the PC user through a remote controller 31) with only a controlling capability can be located on the PC user side of the internal firewall 50, under the control of the PC user, while the slave processor units 94 would reside on the network side of the internal firewall 50.

FIGS. 10A-10C show PC 1 with an internal firewall 50 that is configurable through either hardware and/or software and/or firmware and/or other means; software configuration is easiest and most typical, but active motherboard hardware configuration is possible and may present some security advantages, including a use of manual or electromechanical or other switches or locks. FIG. 10A shows a CD-ROM 63' that has been placed by a PC user on the network side of an internal firewall 50 from a previous position on the PC user side of an internal firewall 50, which was shown in FIG. 10A. The settings of an internal firewall 50 may default to those that safely protect the PC 1 from uncontrolled access by network users, but with capability for the relatively sophisticated PC user to override such default settings and yet with proper safeguards to protect the unsophisticated user from inadvertently doing so; configuration of an internal firewall 50 may also be actively controlled by a network administrator in a local network like that of a business, where a PC user may not be the owner or leaser of the PC being used, either by remote access on the network or with a remote controller 31.

Similarly, FIGS. 10C and 10D show a PC "system on a chip" 90 with an internal firewall 50 that is configurable through either hardware and/or software and/or firmware and/or other means; software configuration is easiest and most typical. Active configuration of the integrated circuits of the PC microchip 90 is also possible and may present some speed and security advantages. Such direct configuration of the circuits of the microchip 90 to establish or change its internal firewall 50 could be provided by the use of field-programmable gate arrays (or FPGA's) or their future equivalents or successors; microcircuit electromechanical or other switches or locks can also be used potentially. For example, slave processing unit 94 can be moved to the PC user side of an internal firewall 50 from a network side position. The same active configuration of the chip circuit can use FPGA's for the simplest form of multiprocessing microchip 90 with a single slave unit 94, transferring its position to the PC user's side of an internal firewall 50 from a network side as shown by slave processing units 94 in FIGS. 10C and 10D.

Figure 11A:
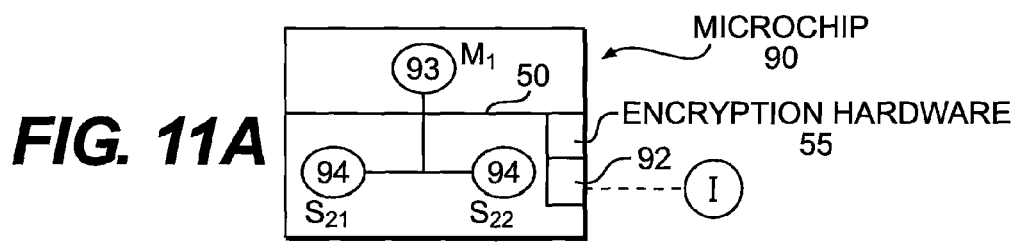
FIGS. 11A-11K show a new hierarchical network architecture for personal computers and/or microprocessors based on subdivision of parallel processing or multi-tasking operations through a number of levels down to a processing level.
Figure 11B:
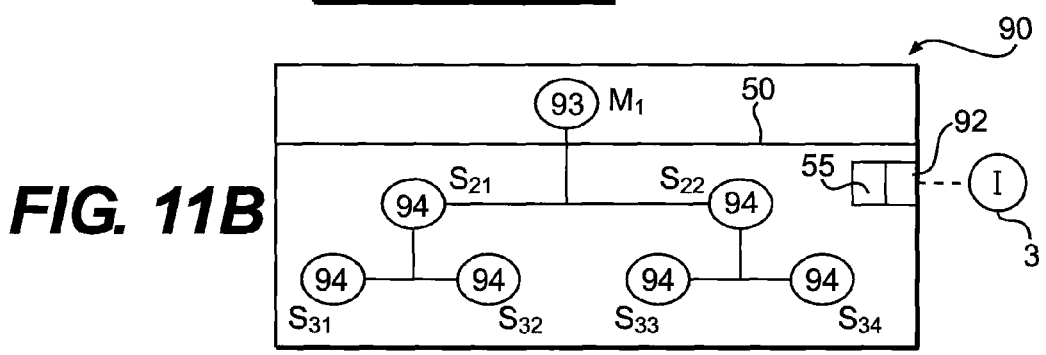
Figure 11C:
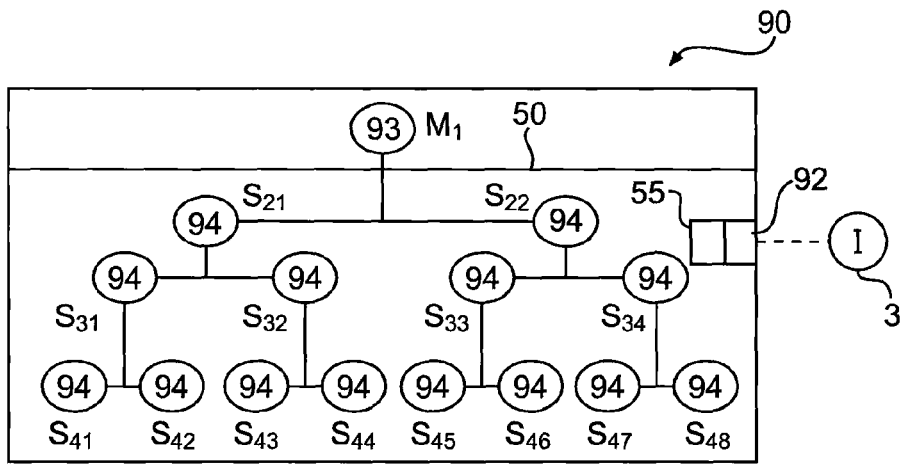
Figure 11D:
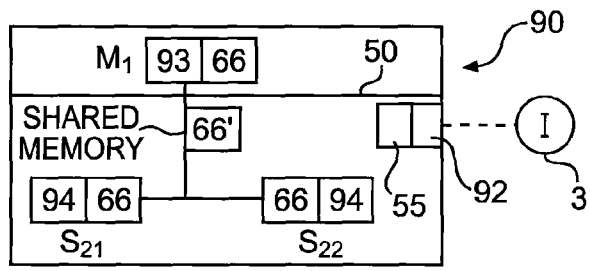
Figure 11E:
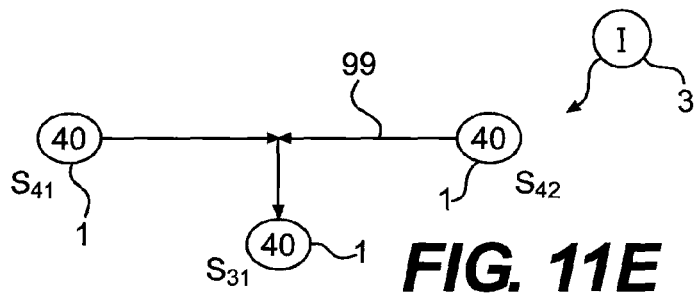
Figure 11F:
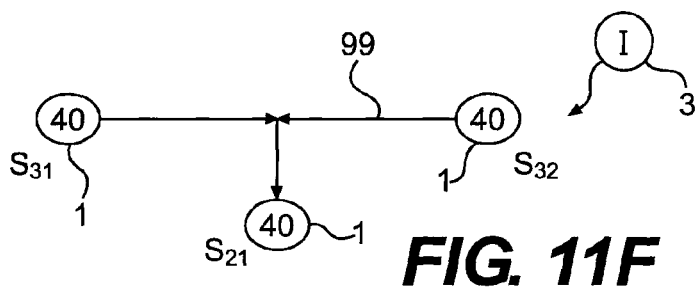
Figure 11G:
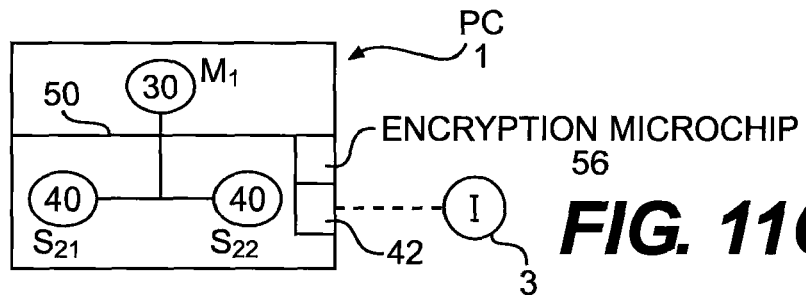
Figure 11H:
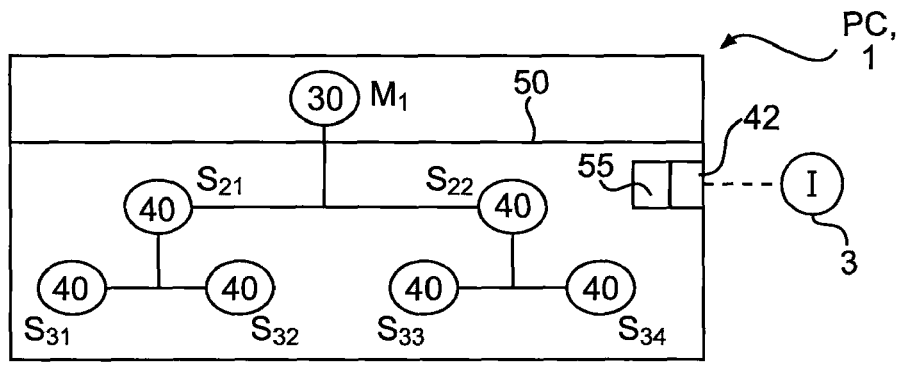
Figure 11I:
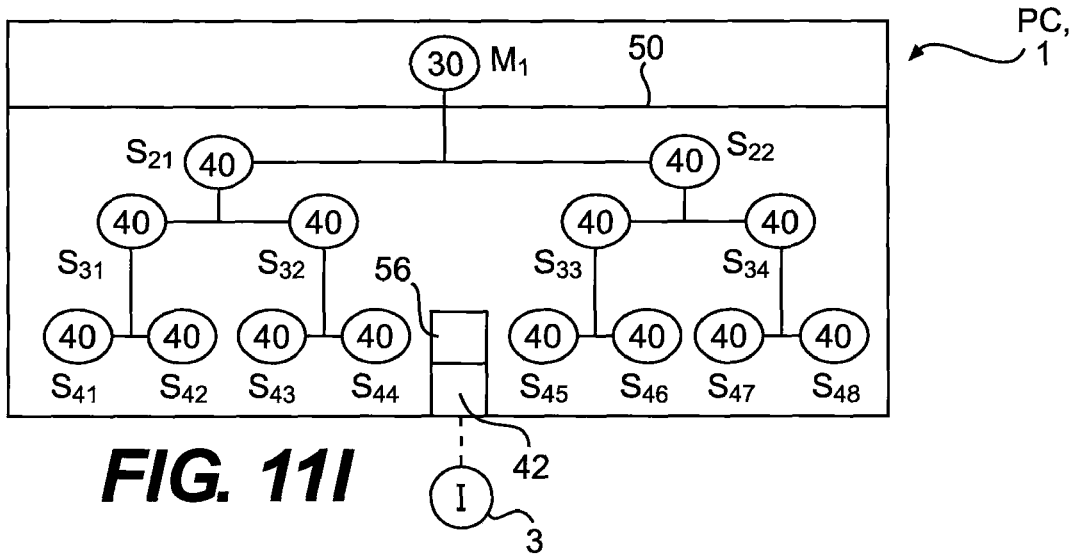

FIGS. 11G-11I show the applicant's new hierarchical network structure and function applied to the design of a personal computer PC 1, as discussed previously in FIGS. 10A and 10B of the '049 Application. FIG. 11G shows the simplest general design, with a master $M_1$ microprocessor 30 and two slave $S_{21}$ and $S_{22}$ microprocessors 40. FIG. 11H shows the same network structure with an additional level of slave microprocessors 40, $S_{31}$ through $S_{34}$, while FIG. 11I shows the same network structure as FIG. 11H with an additional level of slave microprocessors 40, $S_{41}$ through $S_{48}$. As shown in these examples, this network structure is completely scalar, including any practical number of slave microprocessors 40 on any practical number of processing levels.

Figure 11J:
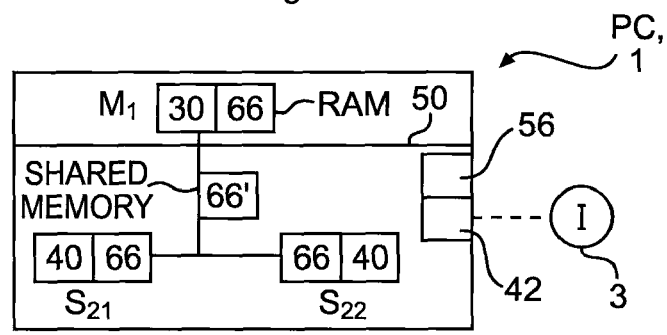

FIG. 11J shows a useful embodiment in which each microprocessor 30 and 40 has, in addition to internal cache memory, its own random access memory (RAM) 66 or equivalent memory (volatile like DRAM or non-volatile like Flash memory, magnetic such as MRAM memory, or ovonic unified memory), integrated on-microchip 90 or separate off-microchip. A significant amount of such microchip RAM (volatile like DRAM or non-volatile like Flash memory, magnetic such as MRAM memory, or ovonic unified memory), significantly greater than cache memory (SRAM) and other on-chip memory used on microprocessor chips today, can be beneficial in improving the efficient operation of the microprocessor; if located off microprocessor chip, the size of such memory can substantially exceed the size of the associated microprocessor, but an on-microprocessor chip location for DRAM or Flash (or MRAM or ovonic memory), like cache (SRAM) memory, offers the best potential for improving microprocessor speed and efficiency. The design can also incorporate (or substitute) conventional shared memory or RAM 66' (i.e. memory used by all, or some, of the microprocessors 30 or 40 (or 90) of the personal computer PC 1).

FIGS. 11A-11C are parallel to FIGS. 11G-11I above, but show PC microprocessor 90 architecture rather than macro PC 1 architecture; a PC microprocessor 90 is as earlier described in FIG. 10C, a personal computer on a microchip.

FIG. 11D is like FIG. 11J, also except for showing PC microprocessor 90 architecture instead of PC 1 architecture. FIG. 11D shows a useful embodiment in which each PC microprocessor 93 or 94 has its own integrated on-microchip (or separate off microchip) random access memory (RAM) 66 or equivalent memory (volatile like DRAM or non-volatile, like Flash memory, magnetic such as MRAM memory, or ovonic unified memory). A significant amount of such RAM or other memory, significantly greater than cache (SRAM) memory or other on-microchip memory used on microprocessor chips today, can be beneficial in improving the efficient operation of the microprocessor; if located off-microprocessor chip, the size of such memory can substantially exceed the size of the associated microprocessor, but an on-microprocessor chip 90 location for DRAM or Flash (or MRAM or ovonic memory), like cache (SRAM) memory, offers the best potential for improving microprocessor speed and efficiency. The microchip design can also incorporate (or substitute) conventional shared memory or RAM 66' (i.e. memory used by all, or some, of the PC microprocessors 93 or 94 of the personal computer PC microprocessor 90).

FIGS. 11A-11D show a different and improved basic microchip architecture which can exclude or reduce the currently used superscalar approach in microprocessors to execute multiple instructions during each clock cycle. The FIGS. 11A-11D architecture is much simpler and, by integrating memory with microprocessor, reduces memory bottlenecks. The simplicity of the FIGS. 11A-11D microchip design, which may have little or no superscalar components, compared to conventional superscalar designs (the inherent extreme complexity of which creates a very substantial memory overhead), can result in the use of a much greater proportion of independent, non-superscalar processors per microchip, exclusive of integrating memory or RAM 66 onto the microprocessor chip 90, as discussed in FIG. 11D.

FIGS. 11G-11J, by using the same architecture for PC 1 networks as FIGS. 11A-11D, import the same advantage of microchip parallel processing performance to parallel processing in PC 1 networks.

Figure 11K:
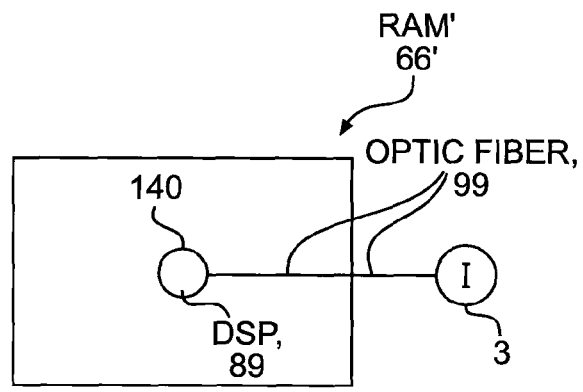

FIG. 11K shows a direct connection of optical fiber 99 from Internet 3 (or another network) to random access memory (RAM) microchip 66'. The connection may be at a central portion 140 of RAM chip 66' to provide equal access to stored data on RAM chip 66'. The direct connection can be anywhere on RAM chip 66'. Digital signal processor (DSP) 89 is on RAM chip 66' for connection with optical fiber 99. RAM chip 66' is for shared memory use among PC's 1 and for broadcast use. RAM chip 66' can include volatile or non-volatile (flash-type) memory. RAM chip 66' can have more than one DSP 89, such as shown in FIG. 20B.

All FIGS. 11A-11K, like the preceding figures of this application, show sections of a network of personal computers PC 1 (or PC microprocessors 90) or microprocessors 30 or 40 which can be parts of the WWW or Internet or Internet II or the Next Generation Internet (meaning connected to it) or Intranets or Extranets or other networks.

Also, except for FIGS. 11A-11C and 11G-11I, all of the FIG. 11 series show personal computers PC 1 and microprocessors 30 or 40 as occupying the same location. This dual representation was done for economy of presentation and to show the parallel functionality and interchangeability in conceptual terms of personal computer PC 1 and microprocessors 30 or 40 in the structure of the new network. So, taking FIG. 16A as an example, $M_1$, $S_{21}$ and $S_{22}$ show three personal computers PC 1 or, alternatively, one microprocessor 30 and two microprocessors 40.

As noted initially in FIG. 10C, a personal computer PC 1 can be reduced in size to a PC microprocessor chip 90, so preceding Figures showing personal computer PC 1 also generally represent PC microprocessor chip 90.

Finally, FIGS. 11A-11K show a mix of electrical and optical connections, including wired 99, especially connections such as optical glass fiber or omniguides, and wireless 100, especially wireless optical (and mixtures of both in a single figure), and dense wave division multiplexing (DWDM). Generally, either 99 or 100 or a mix can be used relatively interchangeably in the network inventions shown (as well as in prior figures), though in some embodiments either highest transmission speed (i.e. broadest bandwidth) or mobility (or some other factor) may dictate a use of wired or wireless. Generally, fiber optic wire 99 and dense wave division multiplexing (DWDM) may provide the most advantageous transmission means because it has the greatest bandwidth or data transmission speed, so it may be used for connections between personal computers and microchips, including direct connections, although optical wireless 100 also offers very high bandwidth, especially with dense wave division multiplexing (DWDM). Other wireless 100 (but also including optical wireless), including with DWDM, can be used where mobility is a paramount design criteria.

The FIG. 11 embodiments can be combined with, or modified by incorporating, any other network system architectures (including client/server or peer to peer) or any other topologies (including ring, bus, and star) either well known now in the art or their future equivalents or successors.

Any of the embodiments shown in FIGS. 11A-11K can be combined with any one or more of the preceding or subsequent figures of this application to provide a useful improvement over the art.

The parallel processing network architecture shown in the preceding FIGS. 11A-11K and in earlier figures has several features unique to its basic design that provide for the security of personal computers PC 1 (or PC microprocessor 90) or microprocessor 40 that share other computers for parallel and multi-tasking processing. First, the slave personal computers PC 1 (or microprocessors 40) each have only part of the operation (for large operations, only a very small part) and therefore unauthorized surveillance of a single PC 1 can provide only very limited knowledge of the entire operation, especially in only a relatively local area in which switching or routing was employed. Second, the addresses of the slave personal computers PC 1 (or microprocessors 40) are known or traceable, and therefore are not protected by anonymity (like hackers usually are) in case of unauthorized intervention. In addition, cryptography can be employed, with on microprocessor chip 30, 40, or 90 hardware 55 being used in some embodiments due to efficiency, although software and firmware can also be used, or a separate PC 1 hardware-based component 56 like an encryption microchip can be used; with either encryption component 55 or 56, micro electromechanical locks can be used to prevent access other than by the direct physical user; other MicroElectroMechanical System (MEMS) devices located on microchips like PC90 can be used for access prevention or other functions. Nonetheless, these inherent strengths can be substantially reinforced, as indicated in FIGS. 12B-12D.

Figure 12A:
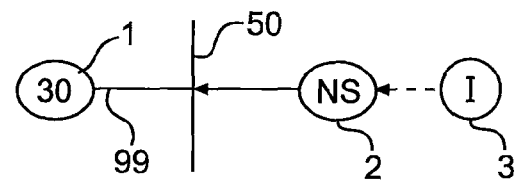
FIGS. 12A-12D show an internal firewall 50 with a dual function, including that of protecting Internet users (and/or other network users sharing use) of one or more slave personal computers PC 1 or microprocessors 40 from unauthorized surveillance or intervention by an owner/operator of those slave processors.

FIG. 12A shows at least one internal firewall 50 performing its conventional function of keeping out intruders such as hackers from the Internet 3 from unauthorized access for either surveillance of, or intervention in, a user's personal computer PC 1 (or PC microprocessor 90) or master microprocessor 30.

Figure 12B:
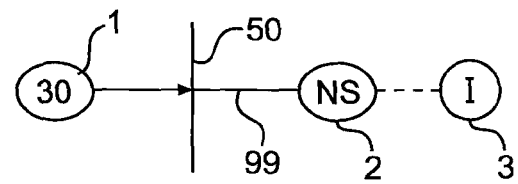

FIG. 12B shows that, since Internet users can, as enabled by the applicant's network structure invention, use one or more of the slave microprocessors 40 of another's personal computer PC 1 (or PC microprocessor 90) for parallel (or multi-tasking) processing, the at least one internal firewall 50 has a dual function in also protecting Internet 3 use (or other shared use on a network) from unauthorized surveillance or intervention by a PC 1 owner/user who is providing the shared resources. To maintain the privacy necessary to operate such a cooperatively shared network arrangement, unauthorized surveillance or intervention must be carefully prevented by hardware/software/firmware or other means.

Figure 12C:
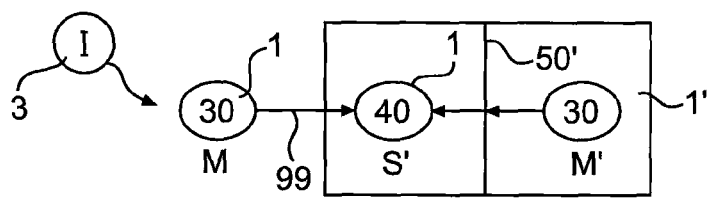
Figure 12D:
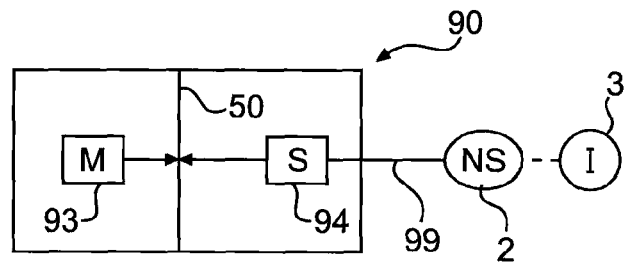

FIG. 12C therefore shows master M personal computer PC 1 (or PC microprocessor 90) using the slave $S_2$ microprocessor 40 of a different personal computer, PC 1', which is available for Internet 3 (or other net) shared use, while internal firewall 50' blocks unauthorized access into PC 1' by PC 1 (although PC 1' owner/user can always interrupt a shared operation and take back control and use of slave S' microprocessor 40, which then triggers off-loading action to compensate, as discussed above in FIGS. 16I-16J of the '049 Application).

FIG. 12D is similar to FIG. 12C, but shows a PC microprocessor 90 with a slave microprocessor 94 being used by Internet 3 users (or other net), so that at least one firewall 50 serves both to deny access such as surveillance by master M microprocessor 93 to an Internet 3 parallel processing (or multi-tasking) operation on slave S microprocessor 94 and to deny access to master M microprocessor 93 by Internet 3 (or other net) users of slave S microprocessor 94. At least one internal firewall 50 may be implemented by non-configurable hardware at the microchip level to provide protection against tampering with the internal firewall 50 by a PC 1 user, who has easier access to software or macro hardware such as PC motherboards to alter. PC 90 microchips may employ tamper-resistant construction or tamper-proof construction. As such, PC 90 microchips may be permanently locked by out-of-specification conditions or permanently destroyed by attempts at physical access.

Also, non-configurable hardware denying access from the network is the most immune to hacking from any outside source, including the Internet, and can therefore be used either for general protection or to protect an innermost kernel of the most confidential of personal files (such as passwords or financial data) and the most critical of operating system components, such as the system bios or access to file alternation.

At the same time, the FIG. 12 and earlier embodiments provide a solution to digital rights management by providing a highly safe environment for the owners of digital versions of audio, video, and software copyrighted material. Such copyrighted material as movies, television, music, and application or operating system software may be decrypted and controlled on the network user side of the PC 1 or PC 90, while the PC 1 user is denied access to the decrypted digital version of the copyrighted material. However, the network user can make the material viewable to the PC 1 user, but not copyable, via the PC 1 and PC 90 microchip architecture shown in FIGS. 10A and 10C.

Any of the embodiments shown in FIGS. 12A and 12B can be combined with one or more of any of the preceding figures of this application to provide a useful improvement over the art.

Figure 13:
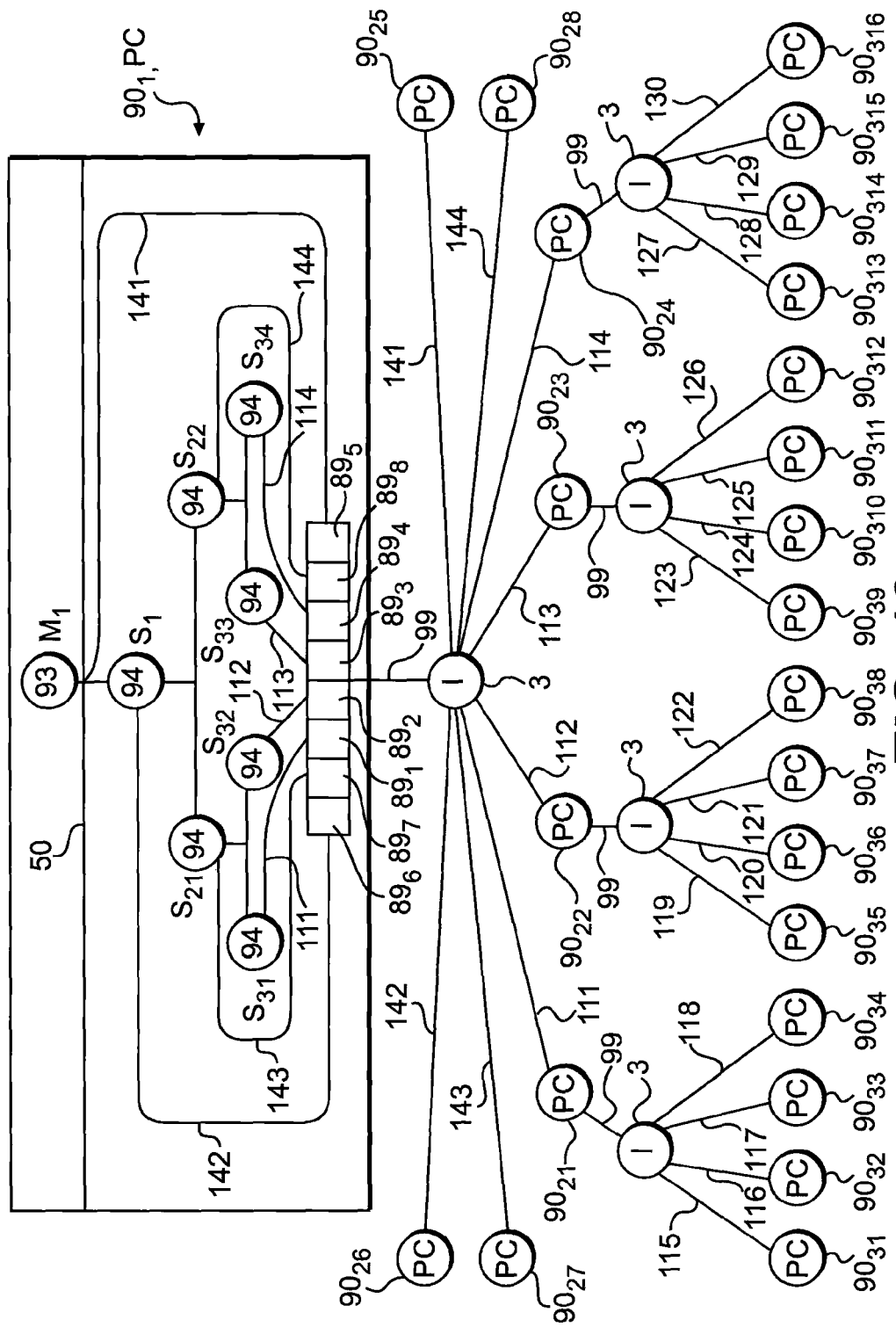

FIG. 13 is like FIG. 20B of the '049 Application (and therefore also can be combined with FIGS. 11J and 11D, respectively), but show additionally that all microprocessors 30, 40, 93, and 94 of PC 1 or PC $90_1$ can have a separate input/output communication link to a digital signal processor (DSP) or other transmission/reception connection component. The additional communications linkages are shown as 141, 142, 143, and 144, which connect to $M_1$, $S_1$, $S_{21}$, and $S_{22}$, respectively, and connect to the network, including the Internet 3, the WWW, the Grid, and equivalents or successors. Like all preceding and subsequent figures, FIG. 13 is a schematic architectural plan of the new and unique components of the parallel processing system invention disclosed in this application and can represent either physical connections or virtual relationships independent of hardware. FIG. 13 shows an embodiment in which the additional linkages lead through the Internet 3 to microprocessors PC $90_{25}$-$90_{28}$.

Figure 20A:
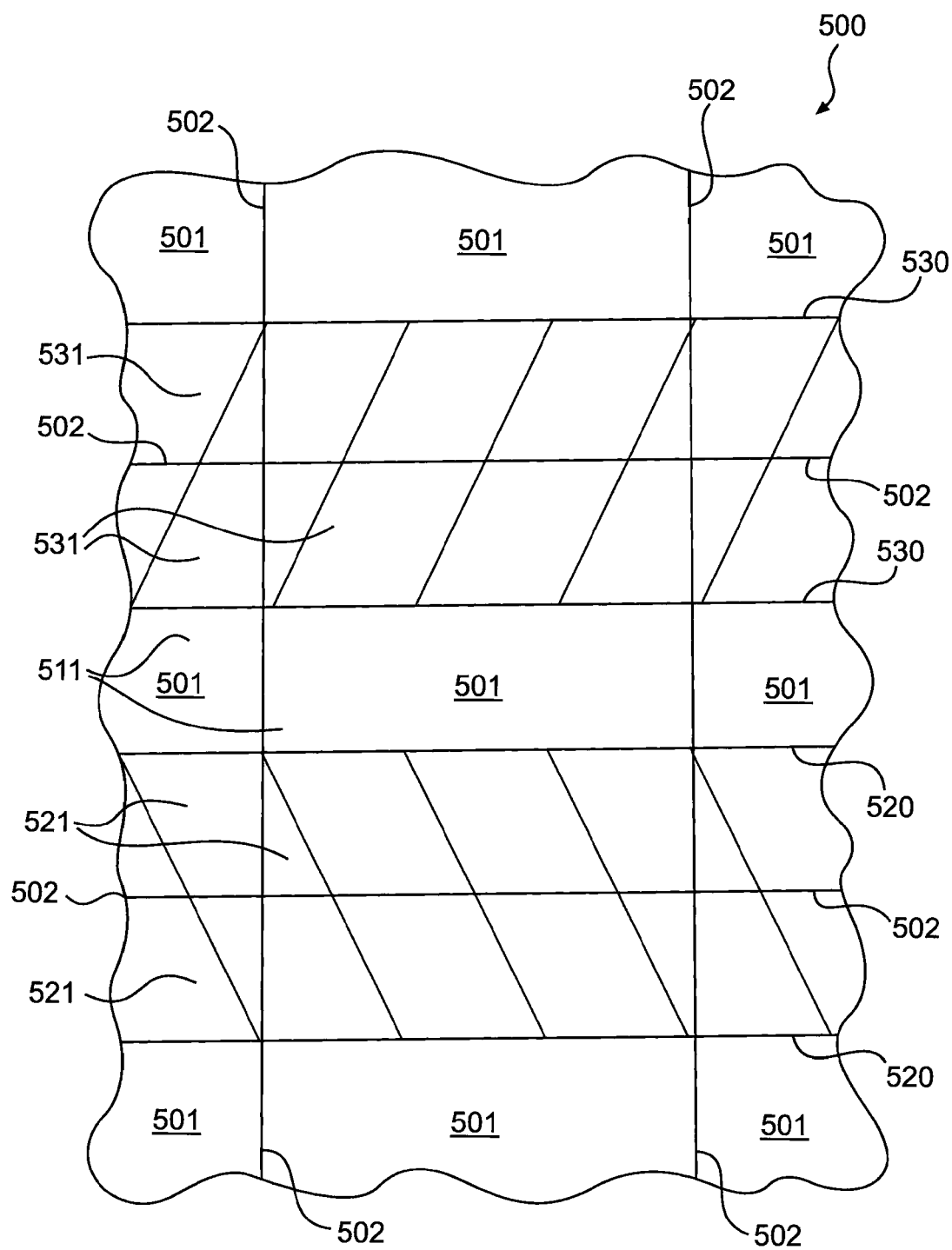
FIG. 20A shows a top view of a microchip 501 surrounded by adjoining portions of adjoining microchips 501 in a section of the silicon wafer 500.
Figure 20B:
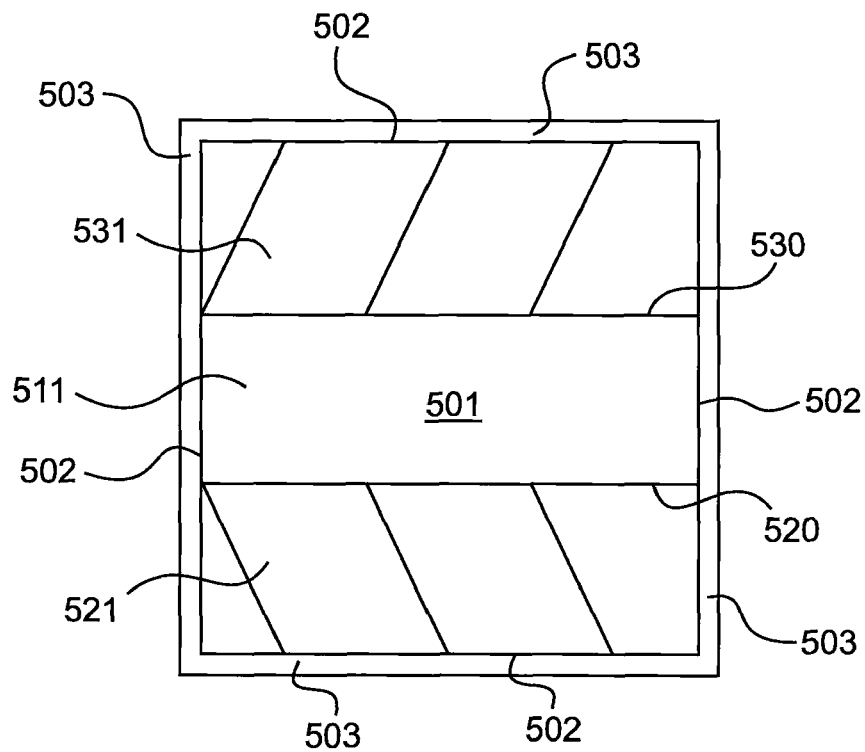
FIG. 20B shows a top view of the microchip 501 embodiment of FIG. 20A after the die has been separated from the silicon wafer 500 and positioned in a microchip package 503.

The additional communications linkages 141, 142, 143, and 144, as well as the original linkages 111, 112, 113, and 114 of FIGS. 20A and 20B, may have a bandwidth sufficiently broad to at least avoid constraining the processing speed of microprocessors 30, 40, 93, and 94 connected to the linkages. The ultra high bandwidth of optical connections like optical fiber or omniguides or optical wireless may provide external connections between PC 1 and PC $90_1$ microprocessors that are far greater than the internal electrical connections or buses of those microprocessors, for example, by a factor of 10, or 100, or 1000, which are already possible with optical fiber, or 1,000,000, which is possible with optical omniguides, which are not limited to a relatively smaller band of wavelengths using DWDM like optical fiber; future increases will be substantial since the well established rate of increase for optical bandwidth is much greater than that for microprocessor speed and electrical connections. Wireless optical antennas that are positioned on the exterior of houses, buildings, or mobile reception sites, instead of inside of glass or other windows, should significantly increase the number of optical wavelengths that can be sent or received by each of the wireless optical antennas; the entire connection is freespace optical wireless, which allows for greater dense wave division multiplexing (DWDM) and thereby greater bandwidth.

A major benefit of the embodiment shown in FIG. 13 is that PC 1 and PC $90_1$ can function like the FIG. 9 embodiment to efficiently perform operations that are uncoupled, so that each microprocessor $M_1$, $S_1$-$S_{34}$ can operate independently without microprocessors $M_1$, $S_1$, and $S_{21}$-$S_{22}$ being idled, as they may be in FIG. 13. Another benefit is that for tightly coupled parallel operations, microprocessors $M_1$, $S_1$, and $S_{21}$-$S_{22}$ can have broad bandwidth connections with microprocessors 30, 40, 93, or 94 that are not located on PC 1 or PC $90_1$. Thus the embodiments shown in FIG. 13 provide an architecture that allows PC 1 or PC $90_1$ the flexibility to function in parallel operations either like FIG. 13 embodiments or like the FIG. 9 embodiment of the '049 Application, depending on the type of parallel operation being performed. Studies indicate that single chip multiprocessors like PC $90_1$ can also perform uniprocessor operations with a speed like that of uniprocessor architectures like wide-issue superscalar or simultaneous multithreading.

Like FIG. 20B of the '049 application, the embodiment of FIG. 13 includes broad bandwidth connection to the Internet 3 by wired means such as optical connection by fiber optic cable or omniguide or optical wireless, although other wired or non-wired means can be used with benefit, and the use of DWDM or wideband CDMA is clearly advantageous. It should be noted that the architecture of the FIGS. 20 and 21 embodiments may be particularly advantageous with ultrawideband communication connections.

Another advantage of the embodiments shown in FIGS. 14A and 14B when functioning in the FIG. 9 (of the '049 Application) form of loosely coupled or uncoupled parallel processing or multitasking is that if PC 1 or PC $90_1$ is functioning as a web server and typically uses only one microprocessor to do so, it can quickly add mirror web sites using one or more additional microprocessors to meet increasing volume of visits or other use of the web site. This replication of web sites on additional microprocessors in response to increasing load can also be done using the FIG. 11 form of tightly coupled parallel processing. PC 1 and PC $90_1$ or any of their microprocessors 30, 40, 93, and 94 or other components can also serve as a switch or a router, including other associated hardware/software/firmware network components.

Any of the embodiments shown in FIG. 13 can be combined with one or more of any of the preceding figures of this application to provide a useful improvement over the art.

Figure 21A:
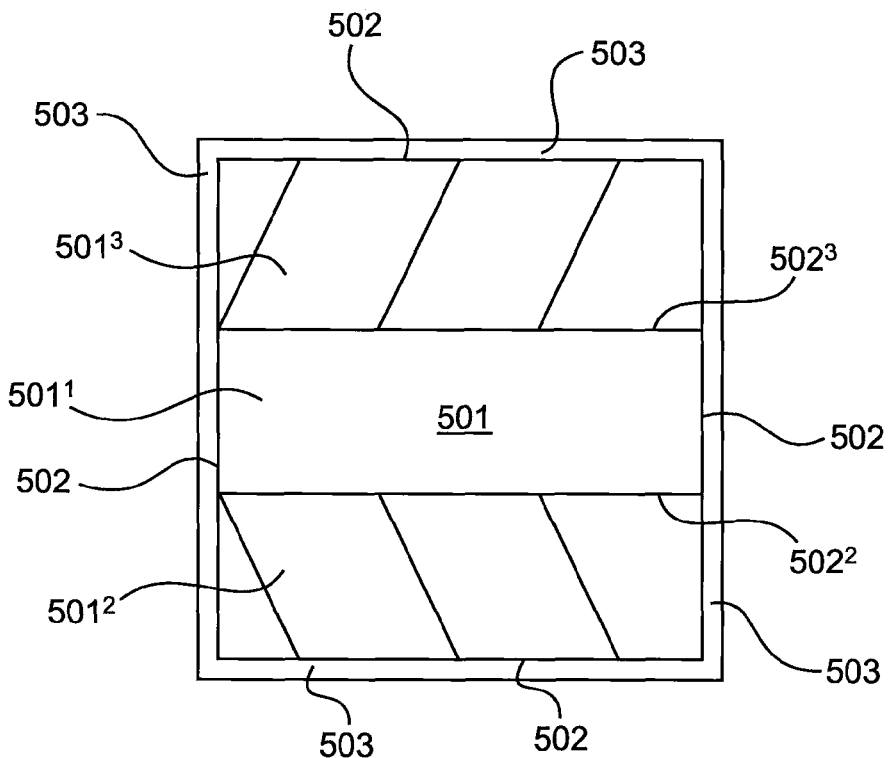
FIGS. 21A-21C show alternative embodiments that unite separate fabrication processes on the same microchip 501.
Figure 21B:
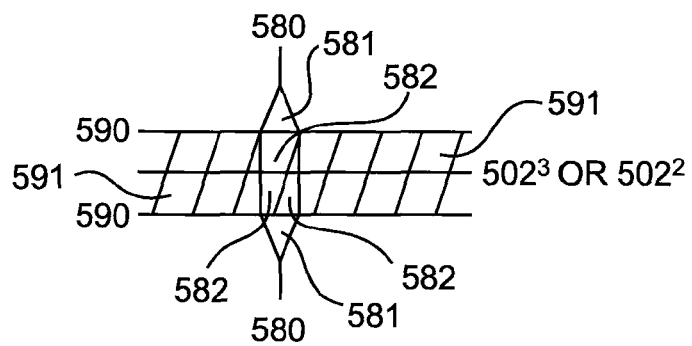
Figure 21C:
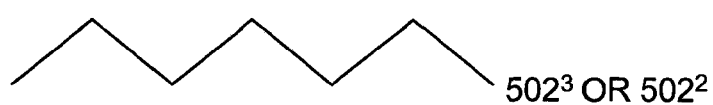

Binary tree configurations of microprocessors shown in FIGS. 11, and 13 can be laid out in 2D using an H-tree configuration, as shown in FIG. 21C of the '049 Application, and can be combined with one or more of any of the preceding figures of this application to provide a useful improvement over the art.

FIG. 14A shows a microprocessor PC $90_1$ like that of FIG. 13, except that FIG. 14A shows the microprocessors 93 and 94 each connecting to an optical wired interconnection 99' such as thin mirrored hollow wire or omniguide or optical fiber (and other very broad bandwidth connections can be used); the interconnect can include a digital signal processor 89' employed with a microlaser 150, which can be tunable, and other components to transmit and receive digital data for microprocessors 93 and 94 into the optical wired interconnects 99' such as an omniguide using, for example, a specific wavelength of light for each separate channel of each separate microprocessor 93 and 94 utilizing dense wave division multiplexing (DWDM).

FIG. 14B shows an enlargement of the digital signal processor 89' with microlaser 150 with other transmission and reception components.

FIG. 14A shows a simple bus network connection architecture between the interconnect 99' and the microprocessors 93 and 94. However, since the interconnection 99' is optical and the bandwidth available is very broad, the optical connection 99' allows connections between microprocessors 93 and 94 in PC $90_1$ that are functionally equivalent to those shown in FIG. 13 of the '049 Application, which includes a representation of physical connections. The interconnects between microprocessors 93 and 94 like FIG. 13 are shown within the omniguide 99' shown in FIG. 14A. In fact, the potential bandwidth of the optical interconnect 99' is so great that complete interconnection between all microprocessors 93 and 94 with PC $90_1$ is possible, even for a much greater number of microprocessors either in a larger PC $90_1$, like FIG. 11C for example, or in other PC $90s$, such as PC $90_{21}$-$90_{29}$ and $90_{31}$-$90_{316}$ in FIG. 13 connected to PC $90_1$ through a network such as the Internet 3, the WWW, or the Grid; consequently, any conventional network structure can be implemented. Consequently, the embodiment shown in FIG. 14A has the flexibility of those of FIG. 13 to function in parallel operations like either the FIGS. 20A-20B embodiments or like the FIG. 9 embodiment (both of the '049 Application), depending on the type of parallel operation to be performed, or the FIG. 11 embodiments.

It should be noted that the optical interconnect 99' shown in FIG. 14A can beneficially have a shape other than a thin wire or tube, such as an omniguide with any form or shape located above and connection to microlasers 150 at a suitable location such as on or near the upper surface of the microchip PC $90_1$ located at least at each microprocessor 93 and 94 or connected thereto, for example; the optical interconnect 99' and microlasers 150 and associated transmission and reception components can be located elsewhere on the microchip PC $90_1$ with benefit. An omniguide can take a waveform shape or rely exclusively on a mirrored (or semi-mirrored) surface or surfaces (or combination of both shape and mirrored surface) to guide lightwave signals such as propagated by a microlaser 150 substantially directly and/or by reflection. A relatively large optical interconnect 99' can enable freespace or wireless-like connections between microlasers 150; such an optical interconnect 99' can cover substantially the entire PC90 microchip or can connect multiple PC90 microchips and can connect one or more PC90 microchips to other PC components.

As shown in FIG. 14A, random access memory (RAM) 66 can be located on microchip PC $90_1$ like in FIG. 11D and also can be connected directly or indirectly to the optical interconnect 99' (or use non-optical connections not shown), so that the microprocessors 93 and 94 and RAM 66 can communicate with a very broad bandwidth connection, including with RAM 66 and microprocessors 93 and 94 located off microchip PC $90_1$ on the network including the Internet 3 and WWW. Any other component of the PC 90 microchip can be connected with the optical interconnect 99' and more than one such interconnect 99' can be used on the same PC 90 or other microchip. Microlasers 150 can include, for example, 5-to-20-micron-high (or other height) vertical cavity-surface-emitting lasers (VCSELs), which can beam down waveguides built into the PC90 microchip; alternatively, freespace optics can be employed; and lenses can be employed. Radio-frequency (RF) signals can also be used for similar interconnects 99'. Micro light emitting diodes (LEDs) can substitute for one or some or all of the microlasers 150 and either can be a transceiver (transmit and receive light signals).

FIG. 14C is a side cross section of the microchip PC $90_1$ shown in FIG. 14A taken at hatched line 22C (which is abbreviated). FIG. 14C shows the location of the omniguide above the surface of the microprocessors 93 and 94 and RAM 66 and connecting them while also containing two or more microlasers 150 (associated DSP and other components not shown) proximate to each to contain the optical signal generated by the microlasers 150 so that the signal can be transmitted between microprocessors 93 and 94 and RAM 66 either directly or by being reflected off the mirrored (or semi-mirrored) surface of the omniguide 99', for example. Each of the microprocessors 93 and 94 (or 30 or 40) and RAM 66 (or any other memory component such as L1 cache or L2 cache, for example, or other microchip component) can have one or more microlasers 150 and each such microlaser 150 can distinguish itself from other microlasers 150 on the microchip (or off it) that also generate wavelength signals by using, for example, a distinct wavelength of light for data transmission and/or utilizing wave or dense wave division multiplexing. FIG. 14A is a top view of the microchip PC $90_1$, which is a PC system on a microchip, any of which disclosed in this application can be also more generally any microchip with multiple processors. The microlasers 150 (and associated transmission and reception components such as DSP) that are associated with RAM (or parts of it) or other memory components can either provide data in response to direct inquiries or fetches made by a microprocessor 93 or 94 or can broadcast a continual stream of current data (continually updated and repeated in continuous cycle, for example) which is used by the microprocessor as needed.

Any of the embodiments shown in FIGS. 14A, 14B and 14C can be combined with one or more of any of the preceding figures of this application to provide a useful improvement over the art.

Figure 15A:
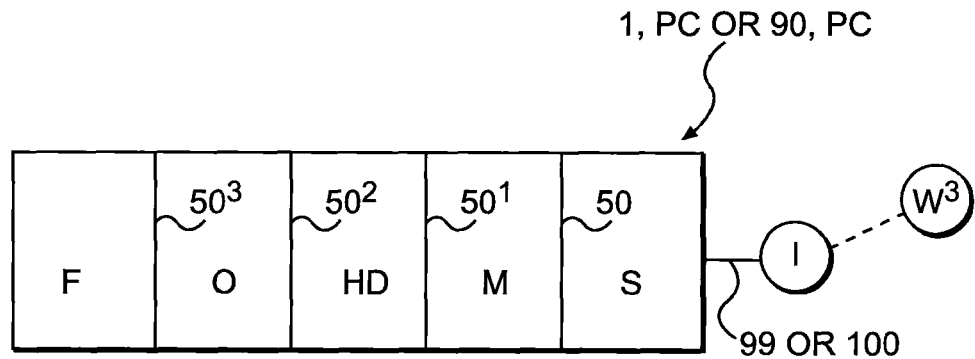

FIG. 15A shows multiple firewalls 50, a concept indicated earlier by the at least one firewall 50 discussed in FIG. 12D. FIG. 15A shows a PC1 or microchip 90 with a primary firewall 50 and additional interior firewalls $50^1$, $50^2$, and $50^3$, that are within primary firewall 50. As shown, interior firewall $50^3$ is in the most protected position, since it is inside all the other firewalls, while the other interior firewalls $50^2$, and $50^1$ are progressively less protected, since, for example, interior firewall $50^1$ is protected from the outside network only by the primary firewall 50. As shown, progressively more protected positions can be created within the PC1 or microchip 90. The interior firewalls can also be arranged in any other way within the primary firewall 50. The interior firewalls can be used to separate user files from system files, for example, or to separate various hardware components from each other. In this manner, a number of compartments can be created within the PC1 or microchip 90 to more safely protect the software, hardware, and firmware of the PC1 or microchip 90, just as ships have a number of separate watertight compartments to protect against flooding and avoid sinking. Any of the primary or interior (or other inner firewalls discussed below) can be hardware, software, or firmware, or a combination, and can coexist in layers, so that a firewall 50, for example, may have a hardware firewall, a software firewall, and a firmware firewall, either as independent units or as integrated components. $W^3$ in FIG. 15A and subsequent Figures denotes the World Wide Web.

Figure 15B:
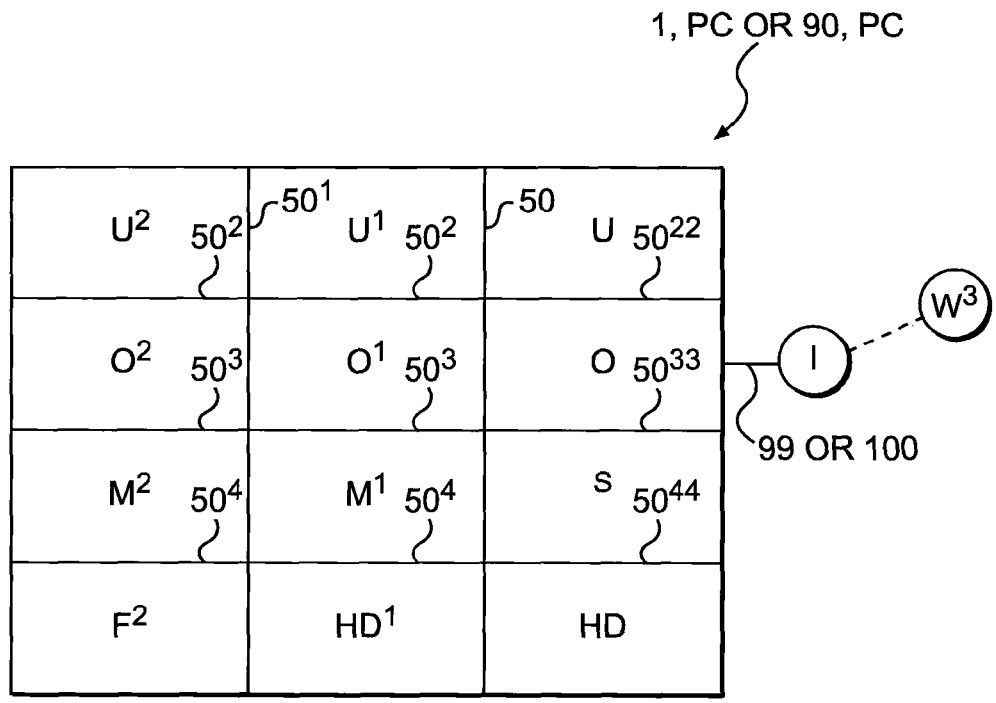

FIG. 15B shows another embodiment of compartments created by inner firewalls within a PC1 or microchip 90. Primary firewall 50 and interior firewall $50^1$ are like FIG. 15A, but interior firewalls $50^2$, $50^3$, and $50^4$ are shown perpendicular to firewalls 50 and $50^1$ (just to illustrate in a simplified schematic way, which may be different in an actual embodiment). In this way, an upper row of compartments $U^1$ and $U^2$ can be used, for example, to bring from the network files which are first authenticated and then enter into the $U^1$ compartment, are decrypted, and undergo a security evaluation, such as by virus scan, before transfer to the most secure compartment $U^2$. Any operations could potentially occur in any compartment, depending on the level of security desired by the user (by over-ride) for example, but an advantageous default system would allow for files with the highest levels of authentication, encryption, and other security evaluations to be allowed into the most secure compartments.

Similarly, operating system files can also be authenticated and brought from the network side of the PC1 or microchip 90 into compartment $O^1$ for decryption and security evaluation or other use, and then finally transferred into the most secure compartment $O^2$. Again, similarly, a row of compartments can be used for separating hardware, such as a master microprocessor 30 or 93 being located in compartment $M^1$ and a remote controller 31, for example, located in compartment $M^2$.

Also, additional inner firewalls $50^{22}$, $50^{33}$, and $50^{44}$ can be located outside the primary firewall 50, but within the network portion of the PC1 or microchip 90, to separate user files in compartment U from operating system files in compartment O from hardware such a slave microprocessor in compartment S on the network side. In the example shown, an additional row is shown for hardware, including a hard drive in a compartment HD on the network side, a hard drive in compartment $HD^1$ on the PC1 or microchip 90 user's side, and flash memory (such as system bios 88) in compartment $F^2$. Each microprocessor 30, 40, 93, or 94 can have its own compartment in a manner like that shown in FIG. 15B, as can associated memory or any other hardware component.

FIG. 15C shows an inner firewall 50 embodiment similar to FIG. 15B, but FIG. 15C shows that any file or set of files, such as operating files O or user data files U or application files A, can have its own inner firewall $50^O$ or $50^U$ or $50^A$. Similarly, any hardware component, such as hard drive HD, also can have its own inner firewall $50^{HD}$. Additionally, more than one file or set of files or hardware components can be grouped together within an inner firewall, such as $50^S$ shown in FIG. 15C.

FIGS. 15D and 15E show operating system files O or application files A like those shown in FIG. 15C, but organized differently in discrete layers, each separate grouping of the operating or application files having a separate firewall 50 (and optionally with as well as a PC1 or PC90 firewall shown in earlier Figures), so that the firewall structure is like that of an onion. The operating system files O or application files A can have a parallel structure, with an innermost kernel operating system or application file located in the center, with additional features in other files in subsequent layers, from the simplest to the most complex and from the most secure and trusted to the least secure and trusted.

Using this structure, as shown in FIG. 15D, an innermost operating system core $O^1$ may be firmware stored in a read-only memory (ROM), located in a microchip for quick access, so that a simplest version operating system with all core features can be protected absolutely from alteration and can be available almost immediately, without lengthy boot up procedures required by loading the operating system from a hard drive, for example. The core operating system $O^1$ can include a core of the system BIOS or of the operating system kernel, for example; it would be advantageous for this core to be capable of independent operation, not dependent on components in other levels to operate at the basic core level (similarly, other levels can advantageously be independent of higher levels).

A secondary operating system $O^2$ can be software located advantageously on flash or other microchip non-volatile memory such as magnetic (or less advantageously, a hard drive or other mechanical storage media) and can consist of additional features that are more optional, such as those not always used in every session, or features that require updating, changing, or improving, such features coming from trusted sources located on a network, such as the Internet or the Web; additional portions of or upgrades to the system BIOS and the operating system kernel can be located in $O^2$, for example.

A third level operating system $O^3$ located, for example, on a hard drive, can consist of additional software features that are used only occasionally and are more optional, and can be loaded as needed by a user into DRAM or magnetic memory microchip for execution, for example. Operating systems $O^2$ and $O^3$ can include, for example, the most recent upgrades from a known and trusted source, such as a commercial software vendor or open source software developer, that are downloaded from a network, including the Internet and the Web, or loaded from conventional memory media like CD or floppy diskette. All three levels of such operating systems $O^1$, $O^2$, and $O^3$ together can constitute, for example, roughly the equivalent of a conventional PC operating system typical in the year 2000.

A fourth level operating system $O^4$ for example, can consist of special use or single use operating system add-ons, especially software coming from untrusted or unauthenticated sources on a network, such as the Internet or the Web.

For example, the graphical interface of the operating system can be in 2D only at the $O^1$ level, in 3D at the $O^2$ level, rendering at the $O^3$ level, and animation in the $O^4$ level; additionally, a standard format can be maintained in the $O^1$ and $O^2$ levels, with user or vender customization at the $O^3$ level.

As shown in FIG. 15E, application files such as $A^1$, $A^2$, $A^3$, and $A^4$ can be structured the same way as operating system files O in FIG. 15D and with the same layered approach to firewalls 50 as in FIG. 15D. Typical application software of the year 2000 can be restructured in this manner.

The kernel operating system files $O^1$ and $O^2$, as well as kernel application files $A^1$ and $A^2$ can be located in any personal computer PC1 or PC90, including at the level of an appliance including the simplest device, advantageously in ROM and in non-volatile read/write memory such as Flash (or magnetic such as MRAM, or ovonic memory) microchips, for example, as described in FIGS. 15D and 15E above. Inclusion of wireless connection capability is advantageous, as is the use of DWDM.

An advantage of the file and firewall structures shown in FIGS. 15D and 15E is that a system crash or file corruption should never occur at the simple and unalterable level $O^1$ or $A^1$ and any level above $O^1$ or $A^1$ can be recovered at a lower level, specifically the highest level at which there is a stable system or uncorrupted data. For example, a word processing application program can have the most basic functions of a typewriter (i.e. storing alphanumeric, punctuation, spacing, and paragraph structure data) stored on a ROM microchip in $A^1$ and related user files (i.e. such as a word document) on $U^2$. Insertion of a digital video file into a word document can be handled at the $A^3$ level and insertion of a downloaded special effect at the $A^4$ level. In this example, a crash caused by the insertion at the least secure and most complex $A^4$ level would not disturb the word document located at the $U^2$ or $U^3$ level. Rebooting and/or recovery can be automatic when detected by the operating system or at the option of the user.

Thus, FIGS. 15A-15E illustrate embodiments wherein a PC1 or microchip 90 includes a hierarchy of firewalls. In the context of the present invention, firewalls may be structured to allow varying degrees of access from the network side of PC1 or microchip 90. As discussed above, ROM may totally deny access from the network side, effectively creating an innermost firewall. Hardware, software, firmware, or combinations thereof may be structured to deny or allow a predetermined maximum level of access from the network side, effectively creating outer firewalls. Similarly, intermediate firewalls effectively may be created.

The embodiments of FIGS. 15A-15E, as well as earlier FIGS. 12A-12D and earlier embodiments, provide a solution to digital rights management by providing a highly safe environment for the owners of digital versions of audio, video, and software copyrighted material. Such copyrighted material as movies, television, music, and application or operating system software may be decrypted and controlled on the network user side of the PC 1 or PC 90, while the PC 1 user is denied access to the decrypted digital version of the copyrighted material. However, the network user can make the material viewable to the PC 1 user, but not copyable, via the PC 1 and PC 90 microchip architecture shown in FIGS. 10A and 10C. For example, a copyrighted movie or music album may be a file that is associated with control and other software; all files located on one or more specific hardware components may be grouped together within an inner firewall, such as $50^S$ shown in FIG. 15C.

Additional security for copyright owners may be provided by using a digital signal processor (DSP), and/or analog and/or other components grouped within the inner firewall $50^S$ to convert network user selected decrypted digital files into analog files before they are transmitted off the PC 90 microchip, so that only an analog signal exits the PC 90 microchip for viewing or listening by the PC 1 user. As such, direct digital copying by the PC 1 user of copyrighted digital files provided over the Internet is prevented.

Any of the embodiments shown in FIGS. 15A-15E can be combined with one or more of any of the preceding figures of this application to provide a useful improvement over the art.

Additionally, an inner firewall can divide any hardware component into a separate network side compartment and a separate firewall protected side compartment. For example, a hard drive 61 can have a controller 61' that is divided into two compartments, HD and $HD^1$, as above. As shown in FIG. 24 of the '049 Application, the user side $HD^1$ compartment of the controller 61' can have a read capability controller r and a write capability controller w, while the network side HD compartment can be limited to a read capability controller r only. The user side $HD^1$ compartment controller can be, for example, used to control only the upper surface of the hard drive 61 platters, while the network side HD compartment controller can be used to control only the lower surface of the hard drive 61 platters, so that a single hard drive can effectively serve a dual role as both a network-accessible hard drive and a user-accessible hard drive, while maintaining a firewall 50 between them. Additionally, the network side HD controller can optionally have a write capability also, which can be preemptively turned on or off by the PC1 or microchip 90 user. Other relative allocations between network and user of the HD 61 platters can be made and can be configurable by the user or system administrator or not configurable.

Similarly, CD drives 63 or DVD drives 64 (read only or read/write) can have a controller 63' or 64' like that of the HD controller 61' above that is divided by a firewall 50, so that some laser beams are under network control and other laser beams are under user control, like the above hard drives. Floppy disk drives, "Zip" drives, and other removable disk or diskette drives can similarly be divided by a firewall 50 so that there is a physical user portion of the disk or diskette and a physical network portion of the disk or diskette, both either fixed or configurable by a user or system administrator or other authorized source. Memory microchips such as RAM or Flash or other can also be divided into network and user sides in a similar manner.

The use of volatile memory on the network side of the PC1 or microchip 90 is particularly useful in eliminating viruses and other security problems originating from the network side, such as malicious hackers on the Internet. When the network side of the firewall 50 of the PC1 or microchip 90 is returned to its user (preemptively or otherwise), volatile memory like random access memory (RAM) such as DRAM on the network side can first be erased. For example, volatile memory can be purged by momentarily interrupting power to the network side of the PC1 or microchip 90, thereby erasing all network data so that no network data is retained when the user regains control of the network side of the PC1 or microchip 90 for the user's use, except at the user's option; other conventional means may be employed. Of course, when the user is specifically using the network side, for example, for Web browsing, the operating system or the user can selectively save network side files or transfer them to the user side.

On the network side, non-volatile memory like Flash, MRAM, and ovonic memory with network data must be overwritten to obtain the same erasure-type protection, which can be a disadvantage if it takes much more time. Moreover, for relatively large storage media, such as CD-RW or DVD-RW with write-once capability, network data writing must be tracked to be effectively erased. Any new network file on non-volatile memory with only a write-once capability can be erased by overwriting all "0's" to "1's", so that, for example, the network data written on a CD-RW or DVD-RW would be converted to all "1's" or "pits" (no unpitted writing surface within the network data sector, permanently overwriting the file); optionally, the operating system or the user can selectively save network side files or transfer them to the user side, or vice versa. There is a disadvantage to using Flash memory, since repeated overwriting will eventually degrade it.

FIGS. 16A-16D show the use for security of power interruption or data overwrite of volatile memory like DRAM and non-volatile memory like Flash or MRAM (or ovonics), respectively, of the network portion (N) of a personal computer PC1 or system on a microchip PC90; the network (N) portion being created within a PC1 or PC90 by a firewall 50 (as described above in previous figures) and including resources that, when idled by a user, can be used by the network, including the Internet (I) or the World Wide Web. Such use is to prevent the unplanned or approved mixture of user and network files by either files being retained in the "swing space" (N) during the transition from use by a network user to use by the PC1/PC90 user or vice versa.

Figure 16A:
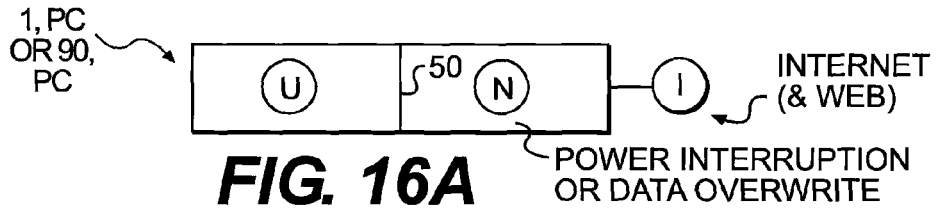
FIGS. 16A-16D show the use for security of power interruption or data overwrite of volatile memory like DRAM and non-volatile memory like Flash or MRAM (or ovonics), respectively, of the network portion of a personal computer PC1 or system on a microchip PC90.
Figure 16B:
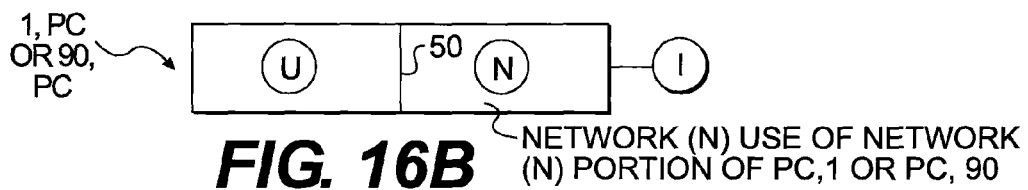
Figure 16C:
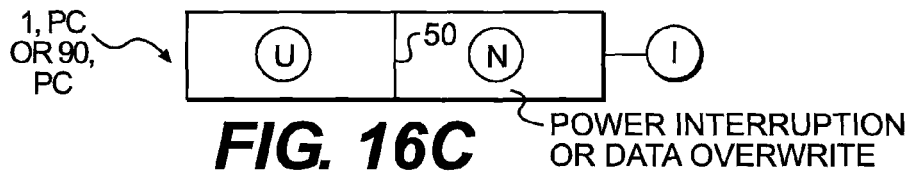

As shown in FIG. 16A and FIG. 16C, when the network portion (N) of the PC1 personal computer or PC90 microchip is idled by a user, for example, power is interrupted to volatile memory like DRAM and/or data is overwritten to files in non-volatile memory like Flash or MRAM (or ovonics), so that no files exist in the network portion (N) after such interruption or overwriting.

Figure 16D:
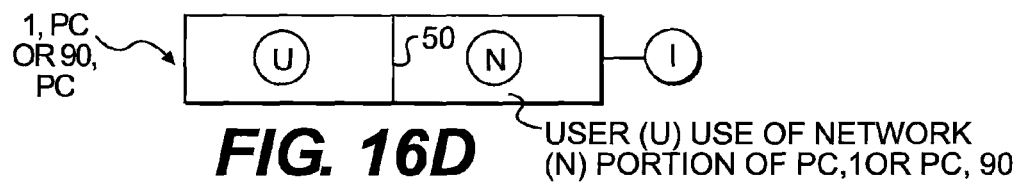

After the step shown in FIGS. 16A and 16C, the network portion (N) can be used safely from a security viewpoint by a user from the network, including the Internet and the World Wide Web (and potentially including other network resources), as shown in FIG. 16B, or by the PC1/PC90 user, as shown in FIG. 16D, potentially including other resources from the user portion (U) of the PC 1 or PC90. As noted earlier, the FIG. 16 approach can advantageously be used as an additional feature to other conventional security measures.

Any of the embodiments shown in FIGS. 16A-16D can be combined with one or more of any of the preceding figures of this application to provide a useful improvement over the art.

The PC 90 microchip as previously described, or a personal computer PC 1 (or any microchip, including a special or general purpose microprocessor on a microchip, alone or including one or more other system components as previously described) may include one or more photovoltaic cells 201, as are well known in the art. The photovoltaic cells 201 may be located on the PC 90 microchip or located near the PC 90 microchip, such as adjoining it or adjacent to it, or located less near, such as in the PC 90 microchip user's home, office, or vehicle, either inside or outside, or may be located more remotely.

Figure 17A:
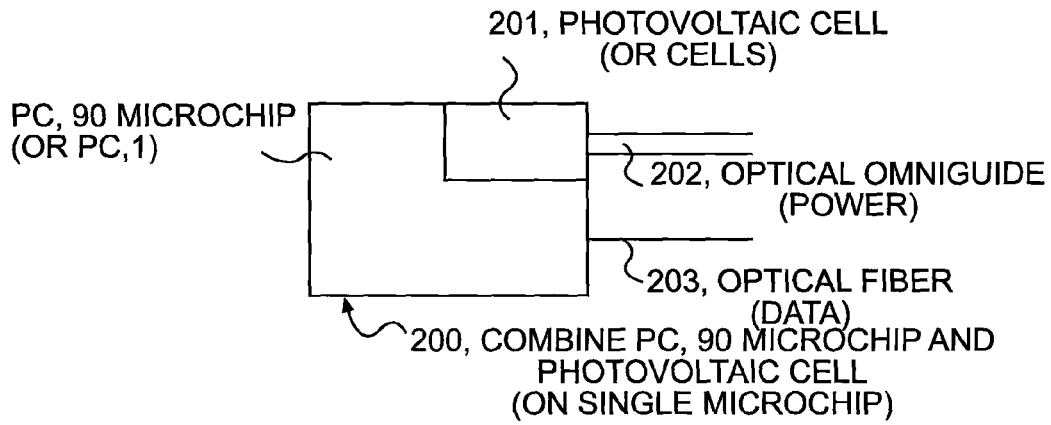
FIGS. 17A-17C show exemplary microchip and photovoltaic cell embodiments.

FIG. 17A shows one or more photovoltaic cells 201 located on a PC 90 microchip. The photovoltaic cells 201 may use electromagnetic radiation, such as visible light, as a power source that is directed to the cells 201 by an optical waveguide 202, which may include a size that is sufficient to allow the cells 201 to generate electrical power at maximum output level or at a most efficient level. In addition, visible light in freespace (without a waveguide 202) may also serve as a power source and can be directed by the use of one or more lenses 204.

Figure 17B:
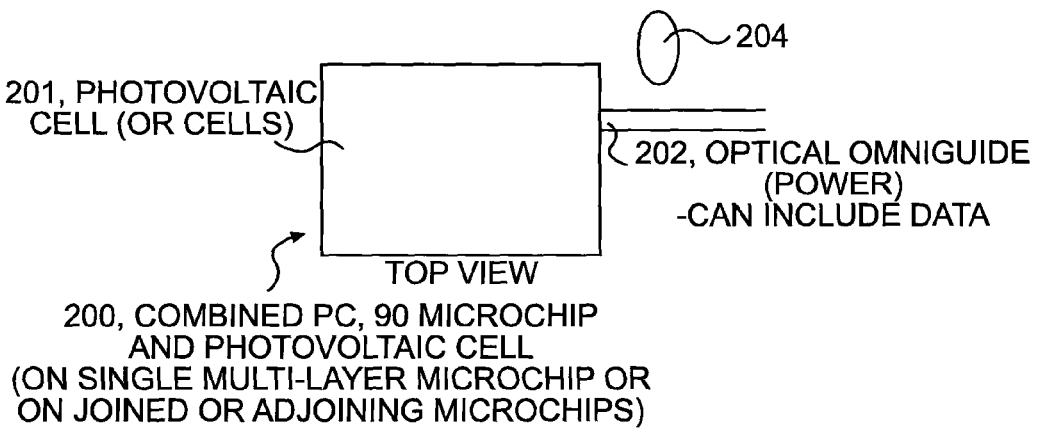
Figure 17C:
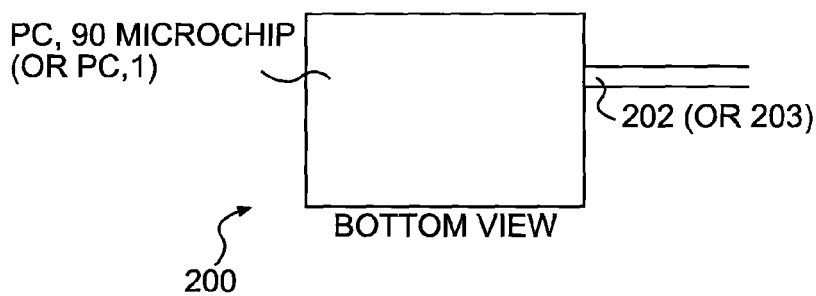

FIG. 17B shows a single microchip 200 including both a PC 90 and one or more photovoltaic cells 201. FIG. 17B shows a top view of a multi-layer microchip having one or more photovoltaic cells 201 on one side of a microchip 200, with a PC 90 on the other side of the microchip 200, as shown in FIG. 17C in a bottom view of the same microchip as FIG. 17B. Besides being integrated on the same microchip 200, the photovoltaic cells 201 may be located separately from the PC 90 microchip, and the two separate elements may be joined or adjoining.

A light source for the photovoltaic cells 201 can be direct or indirect and can be sunlight or artificial light, including light from a laser, or a combination, and can be optionally focused by a lens 204. The light may be coherent with one or more discrete frequencies, such as from a laser, or incoherent with many frequencies. The artificial light may be generated by well known conventional means that are conventionally powered by electricity distributed by the existing electrical power grid, as is well known in the art.

A single photovoltaic cell or a number of cells 201 may power each component on the PC 90 microchip, such as the master microprocessor 93 or slave microprocessors 94, DRAM or MRAM, Flash memory, DSP, or laser 150, or any of the other components previously described. The photovoltaic cells 201 may be connected to one or more batteries. The photovoltaic cells 201 can be located remotely as a separate unit, such as on the PC 90 microchip user's roof at home, car, or office, so that the cells 201 provide general local power or power dedicated to the PC 90 microchip and/or associated components. The PC 90 microchip may be a network server, router, or switch, so that any network component can be powered by photovoltaic cells 201, including the Internet, an Intranet, or the World Wide Web.

The FIG. 17A-17C embodiments advantageously eliminate the need for a microchip, such as the PC 90 microchip, to have a wired connection 99 that typically provides power or data or both, but which also provides a connection means for the entry of electromagnetic flux, which can impair or destroy the functioning of the PC 90 microchip. The embodiments shown rely on light, which does not transmit electromagnetic flux, for power and data.

Figure 18A:
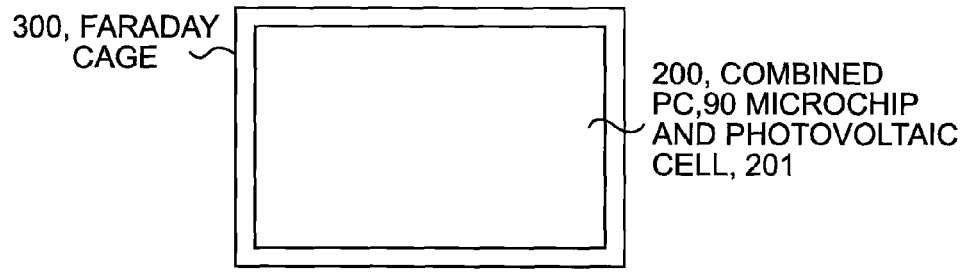

FIG. 18A shows a single microchip 200, combining a PC 90 microchip (or any microchip, including a special or general purpose microprocessor on a microchip, alone or including one or more other system components as previously described) and one or more photovoltaic cells 201, that is substantially surrounded by a Faraday Cage 300, such as is well known in the art, that is optimized to shield against magnetic flux, including high frequency flux (and may include shielding against electric flux). Faraday Cage 300 may be constructed of a mesh structure, or may also be a continuous structure without holes, which has an advantage of preventing entry by very high frequency electromagnetic flux, and may incorporate other microchip structures, such as a heat sink 301.

Figure 18B:
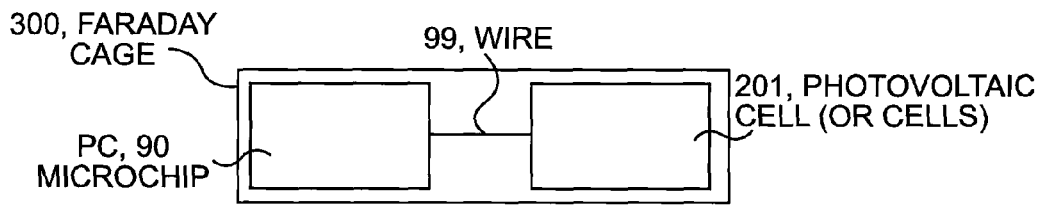

FIG. 18B shows separate PC 90 microchip and one or more photovoltaic cells 201; the two separate components are connected by a wire 99, and all three components are substantially surrounded by a Faraday Cage 300, also known as a Faraday Shield or Screen.

Figure 18C:
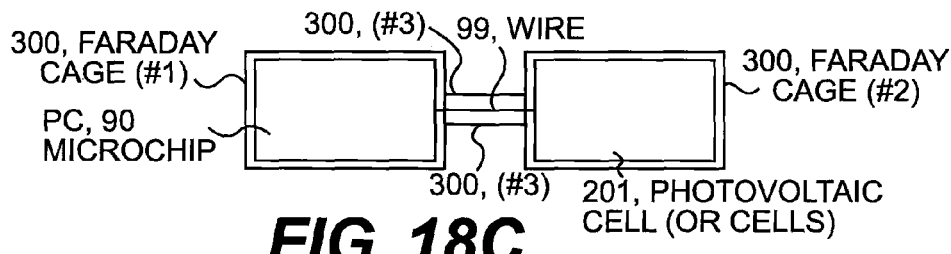

FIG. 18C shows the same components as FIG. 18B, but shows each component substantially surrounded by a separate Faraday Cage 300, all of which may be connected. For portable handheld wireless devices, the ground for the Faraday Cage 300 may be the user's body.

Figure 18D:
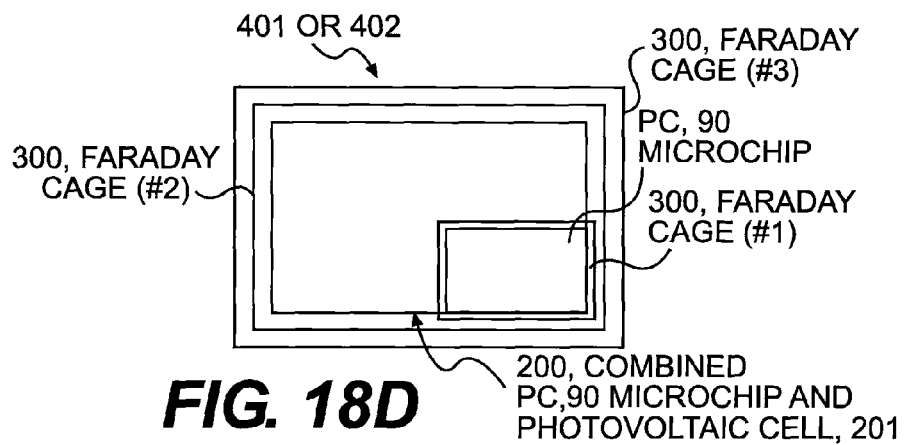

As shown in FIG. 18D, the PC 90 microchip may be located in a housing for any of the PC's described previously, such as a case of a laptop personal computer 401 or a PC cell phone 402, which may also have a separate Faraday Cage 300, so that the PC 90 microchip is substantially surrounded by more than one Faraday Cage 300. The inner Faraday Cage 300 surrounding the PC 90 microchip may be optimized to shield against specific frequencies of magnetic flux, such as high frequency flux in the microwave range, which may be assisted by the relatively smaller size of the PC 90 microchip (compared to its housing). FIG. 18D shows an inner Faraday Cage 300 surrounding only a portion, the PC 90, of a microchip such as the combined microchip 200.

As shown in FIGS. 18E and 18F, the PC 90 microchip can be separate from the photovoltaic cell or cells 201 and can be joined by a wired connection 99.

As shown in FIG. 18E, an inner Faraday Cage 300 may surround only a portion of a PC 90 microchip, such as a Magnetic Random Access Memory (MRAM) component.

FIG. 18F shows Faraday Cage 300 that surrounds only a portion of one or more photovoltaic cells 201, such as a part conducting an electrical current flow directly to the PC 90 microchip.

The PC 90 microchip may also be powered by one or more fuel cells 211 or one or more batteries (each with one or more cells) 221 or any combination of such batteries 221, fuel cells 211, or photovoltaic cells 201. As shown in FIGS. 18E and 18F, the PC 90 microchip is typically separate from a fuel cell or cells 211 or batteries 221 and can be joined by a wired connection 99, as shown, as is the case with a photovoltaic cell or cells 201. A wired connection 99 can be configured to protect the PC 90 microchip from electromagnetic flux through the use of RF traps or Ferrite grommets or beads 212 on the wire or cable connection 99.

By providing power without an external wired connection 99, both fuel cells 211 and batteries 221 isolate the PC 90 microchip from a power grid that can transmit electromagnetic flux, but to do so a battery or batteries 221 can be configured to provide connection to the power grid only intermittently when charging is required.

FIG. 18G shows a microchip, such as a PC 90 microchip, surrounded by a Faraday Cage 300 but without including a photovoltaic cell 201 shown in FIGS. 18A-18F.

FIG. 18H shows a PC housing such as a laptop PC 401 or PC cell phone 402 including a PC 90 microchip and separate Faraday Cages 300 surrounding both the microchip and housing. Also shown is an antenna 499 (or antennas) for wireless communication that can be separated from the Faraday Cage 300 to protect the electrical components of the PC by an RF trap or Ferrite grommets or beads 212. The antenna 499 can project externally from the PC housing or be located internally in the PC housing, such as in the screen housing of a laptop PC 401. In an exemplary implementation, the antenna 499 is located outside of at least one Faraday Cage 300.

Any of the embodiments shown in FIGS. 17A-17C and 18A-18H may be combined with one or more other embodiments shown in those figures or in preceding FIGS. 1-16 and described herein.

Figure 19:
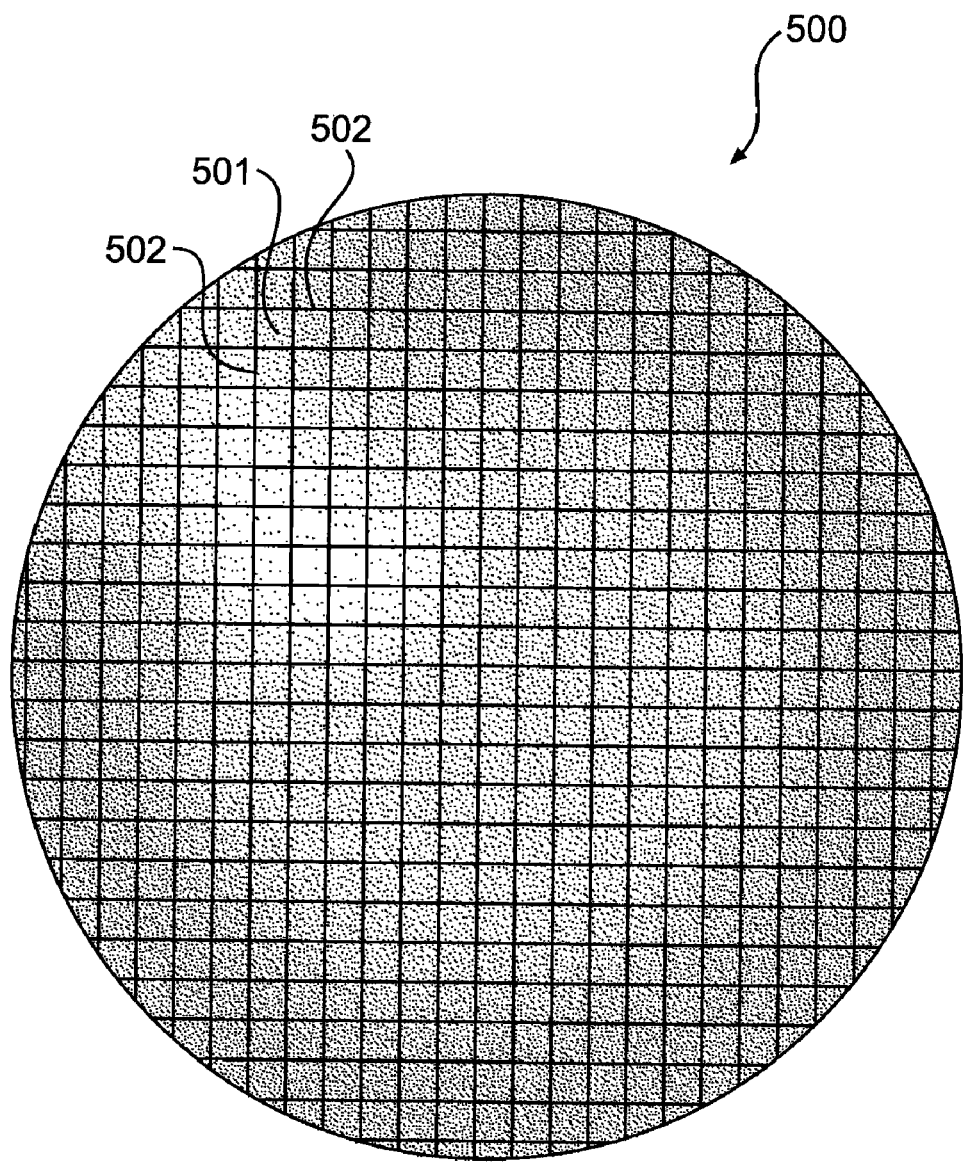

FIG. 19 shows a silicon wafer 500 used to make microchips. The largest wafers 500 in current use are 300 mm (12 inches) in diameter and can contain as many as 13 billion transistors. Current state of the art in microchip fabrication is 0.13 micron process technology and the next process will be measured in nanometers (90 nm). As shown in FIG. 19, microchips 501 are separated by an edge portion 502. A microchip 501 can be a PC 90 microchip.

FIG. 20A shows a top view of a microchip 501 surrounded by adjoining portions of adjoining microchips 501 in a section of the silicon wafer 500. The microchip 501 is bounded by edge portions 502. Although the current state of the art in microchip fabrication on a silicon wafer is to use only one process on a wafer, embodiments of the invention use two or more fabrication processes on a single wafer 500.

As shown in the example of FIG. 20A, one process can be located on one section 511 on the microchip 501, while a second process can be located on a second section 521 of the microchip 501. A third process can be located on a third section 531 of the microchip 501; additional processes can also be located on other sections of the microchip 501.

The processes can be completely separate while at least sharing the common silicon wafer 500 base, and the processes can occur at different fabrication facilities, including those owned by different manufacturers. Alternatively, two or more separate processes may have common sub-processes that can be integrated, i.e., performed at the same time. Sections of the microchip 501 that are not undergoing a process can be protected from that process by a protective coating that is unaffected by that process and removed after that process. There can be one or more temporary protective coatings, which can remain on for more than one process.

The separate sections of the separate fabrication processes of the microchip 501 can be in any shape or pattern of the microchip. As shown in the FIG. 20A example, one or more separate processes can be located on adjoining portions of adjoining microchips. For example, as shown in FIG. 20A, section 521 is located on the lower portion of one row of microchips 501 and on the upper portion of the adjoining row of microchips 501, which would be positioned upside down of the wafer 500, so that the contiguous area of the section 521 process is maximized. Similarly, section 531 is shown in the example located on the lower portion of the adjoining row of microchips 501 and on the upper portion of the middle row of microchips 501. Alternatively, all of the microchips 501 of the wafer 500 can be positioned upright on the wafer.

Embodiments of the invention include any fabrication process of a silicon wafer 500 and can include wafers made of other materials suitable for microelectronic devices, such as gallium arsenide. The fabrication processes in current widespread use are generally CMOS (complementary metal-oxide semiconductor), but can be bipolar or other. The separate processes (and separate sections 511, 521, and 531 shown in FIG. 29A) can be for general purpose microprocessor (including one or more cores), memory (DRAM or non-volatile such as Flash or MRAM or ovonic), analog (including radio and/or laser), digital signal processing (DSP), micro-electromechanical system (MEMS), field programmable gate arrays (FPGA), graphic processing unit (GPU), microprocessor chipset, and others.

Embodiments of the invention facilitate a "system on a chip" (SoC), such as the earlier described PC 90 microchip, by allowing most or all of the micro components of a PC to be located on a single microchip. Even the consolidation of only two microchips into a single microchip provides a significant increase in processing speed and reduced power consumption. The silicon die becomes the motherboard for all the micro components of the PC, leaving only the macro components like battery, power supply, and input/output (I/O) connections to be located on the printed circuit motherboard. The result is ultra-large-scale-integration.

FIG. 20B shows a top view of the microchip 501 embodiment of FIG. 20A after the die has been separated from the silicon wafer 500 and positioned in a microchip package 503.

The fabrication processes illustrated in FIGS. 20A-20B can include material such as silicon germanium, gallium arsenide, indium phosphide and others used, for example, as deposits on silicon. Besides using different materials in different sections of the microchip, different size processes can be used in different microchip sections, such as a 0.13 micron process on section 511 and a 0.18 micron process on section 521 in the FIG. 29A example. All or parts of the microchip 501 can be synchronous or asynchronous. Both different size and different material processes can be combined on different sections of the microchip 501.

Although the maximum increase in speed and decrease in power consumption can be achieved by putting all micro or nano components on a single "system on a chip," such as for a PC, even a minimal combination of just two different micro or nano components of a single microchip 501 can yield a very significant increase in speed and decrease in power consumption. To take a very simple example, a silicon wafer 500 can have 256 MB of DRAM manufactured onto a section 531 of the microchips 502 located on the wafer by one factory; when that DRAM process is completed, a second factory can add a general purpose CPU like a Pentium 4 to a second section 511 of the microchips 501 on the silicon wafer 500. Such an approach allows direct communication between microprocessor and DRAM on the microchip 501 for much greater speed and reduced power. Since 256 MB DRAM is an inexpensive commodity product currently, especially if purchased as wafers 500, there would be little or no increase in the production time of the microprocessor.

FIG. 21A illustrates an embodiment of the invention, which is an alternative method of uniting separate fabrication processes on the same microchip 501. Sections 501$^1$, 501$^2$, and 501$^3$ of FIG. 21A correspond to sections 511, 521, and 531 of FIGS. 20A & 20B in that both sets of sections represent three separate processes, but in FIG. 21A each section is a separate die cut from a wafer 500 and all three sections are united in a single package 503. The section dies 501$^1$, 501$^2$, and 501$^3$ can be held together by the chip package 503 or can be glued together, or a combination of the two in parts or the whole. In addition, the section dies can be assembled into a chip package 503 or the package can be assembled around the dies or a combination of both partially or completely.

The separate process dies illustrated in the FIG. 21A example may be assembled with the surface that the process is on in each die being substantially level with each other, so that both process surfaces of the dies form a plane that is substantially flat. The edges of the dies are configured so adjoining dies fit together as closely as possible, as shown in FIG. 21A at 502$^2$ and 502$^3$.

The circuits of dies 501[1], 501[2], and 501[3] are connected at their edges 502[3] and 502[2] by interconnect lines 580 that can be widened as shown in 581 of FIG. 21B, which shows a portion of die edge 502[3] and 502[2] in an enlarged view. A process can be added in the area 591 overlapping the edges of the dies at 502[3] and 502[2] bounded by lines 590; in that process interconnect lines 580 of the two separate dies can be connected by laying down connections at 582 that connect to the enlarged portions 581 of the interconnect lines 580, as illustrated in FIG. 21B.

FIG. 21C shows that the die edges 502[3] and 502[2] can have any shape or pattern, not just a straight line shown above in FIGS. 21A & 21B.

Figure 22:
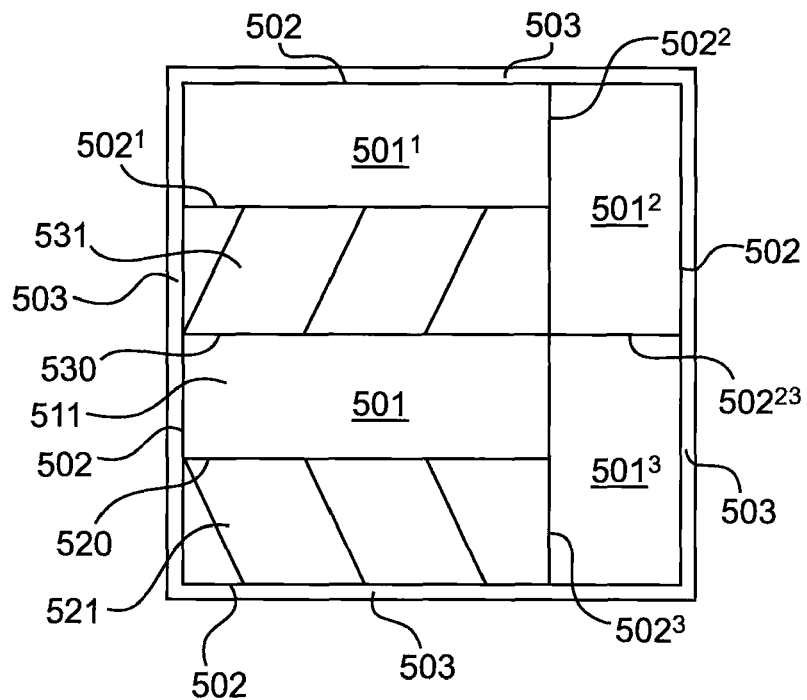

FIG. 22 shows a combination of the embodiments shown in FIGS. 20 and 21. Microchip 501 as shown in FIG. 20 is shown assembled with separate dies 501[1], 501[2], and 501[3] into a microchip package 503, with edges between dies at 502[1], 502[2], 502[3], and 502[23], which could include a connection process such as the example shown in FIG. 21B.

The microchip 501 dies shown in FIGS. 20-22 can be packaged using FCPGA (flip-chip pin grid array), FCBGA (flip-chip ball grid array), BBUL (bumpless build-up layer) or other technology.

Any of the embodiments shown in FIGS. 19, 20A-20B, 21A-21C, and 22 can be combined with one or more other embodiments shown in those figures or in the preceding FIGS. 1-18 and described herein.

FIGS. 23A-23H are new inventions based on FIGS. 18A-27H of this application, which are FIGS. 27A-27H of U.S. application Ser. No. 10/802,049 filed Mar. 17, 2004 and published on Oct. 28, 2004, as Pub. No. US 2004/0215931 A1 and U.S. application Ser. No. 10/684,657 filed Oct. 15, 2003 and published on Aug. 18, 2005, as Pub. No. US 2005/0180095 A1, both of which applications are hereby incorporated by reference herein for completeness of disclosure.

FIGS. 23A-23H are more specific example embodiments of the FIG. 7B example; they show examples of the applicant's inventions involving one or more Faraday Cages surrounding various combinations of semiconductor microchips, photovoltaic cells, and other micro and/or nano devices with the applicant's internal sipe inventions 510/511/513. In the exemplary embodiments shown, the Faraday Cages 300 coincide with the outer compartment 500, which forms a surface of the sipe 505 (as previously defined) which can partially or completely surround the PC 90 microchip and/or photovoltaic cell 201 and/or fuel cell 211 and/or battery 221; any one or more of which (90/201/211/221) can be connected by wire 99, which can also be protected by Faraday Cage 300 so that all components are protected; and one or more Faraday Cages 300 and or internal sipes 505 can be inside a Faraday Cage 300 and/or internal sipe 505 so as to provide additional protection, including of one or more individual components, as shown in several useful examples in the FIGS. 23A-23H.

Heat sink 301 or other microchip cooling device can be augmented or replaced by a cooling media 506, which can for example circulate by convection alone within the sipe 505 as shown in FIG. 23G for example or can be allowed to circulate away from the microchip or other micro or nano device to a heat sink in another location, for example, including by circulation powered by a pump, for example, or other powered means. One or more attachments 503 can provide external connection from the microchip/cell 200 or other component like fuel cell 211 or battery 221 to the outer compartment 500 and/or Faraday Cage 300 and then to other external connections, such as a wire 99 as shown in FIG. 23C or an antenna 499 as shown in FIG. 23H; as shown in the FIG. 23D example, one or more attachments 503, which can be one or more conventional pins, can connect a microchip PC 90 and/or other component with an internal Faraday Cage 300.

Figure 24A:
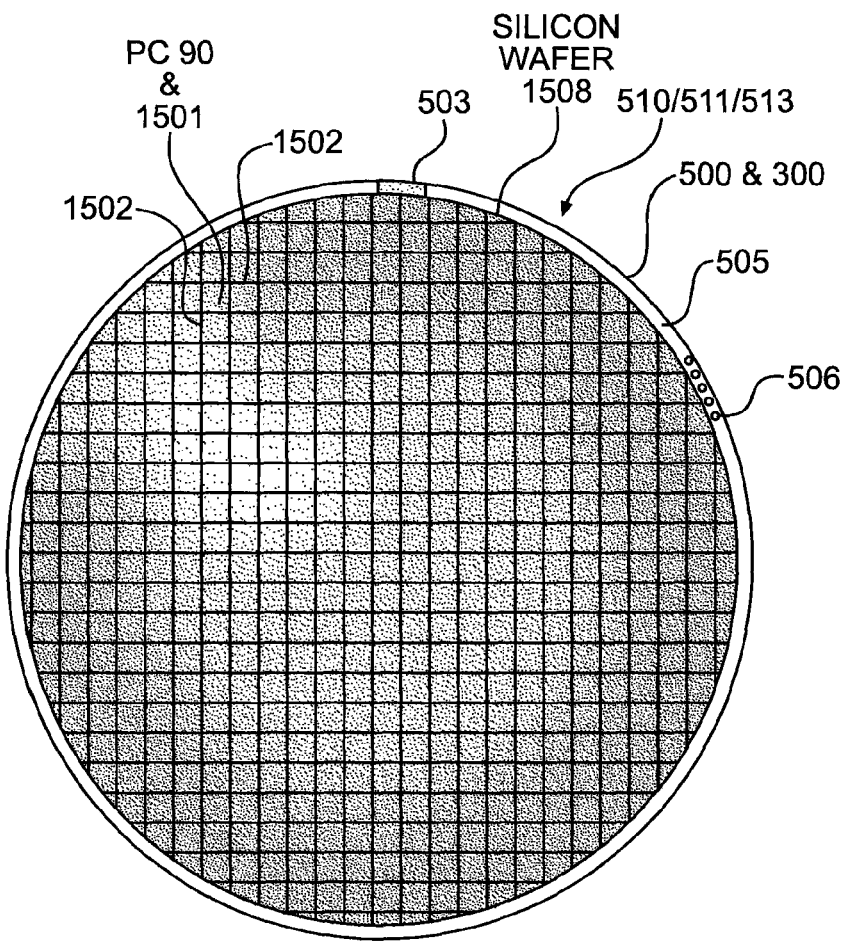
FIGS. 24A and 25A-25B are modifications of FIGS. 28 and 29A-29B of U.S. application Ser. No. 10/684,657 filed Oct. 15, 2003 and published on Aug. 18, 2005, as Pub. No. US 2005/0180095 A1, which was above incorporated by reference herein for completeness of disclosure.

FIGS. 24A and 25A-25B are modifications of FIGS. 28 and 29A-29B of U.S. application Ser. No. 10/684,657 filed Oct. 15, 2003 and published on Aug. 18, 2005, as Pub. No. US 2005/0180095 A1, which was above incorporated by reference herein for completeness of disclosure.

FIG. 24A is a top view of a semiconductor wafer 1500, of which 300 mm. is a current example using a 90 nanometer process, made of silicon, gallium arsenide, or any other suitable semiconductor materials in current use or future equivalents. The wafer 1500 contains a multitude of microchips 1501 with each microchip 1501 including, for example, 1 or more core microprocessors 93 or 94, including at least 2 or 4 or 8 or 16 or 32 or 64 or 128 or 256 or 512 or 1028 or more cores. But instead of separating the microchips 1501 into separate dies in the conventional process along lines 1502, the entire semiconductor wafer 1500 of any size (including smaller that 300 mm) is used essentially intact as a computer (or in one example embodiment, the wafer 1500 can be virtually entire and intact, excluding deactivated or disconnected incomplete microchips 1501 located around the periphery of a circular wafer and microchips 1501 with manufacturing defects or other damage, such as failure during use, which can remain inactively on the wafer); instead of separating along lines 1502, interconnects 1505 of any length or configuration can be added to the printed circuit architecture to connect the microchips 1501 to other microchips 1501 and/or other components on the wafer 1500 or external to it, using any interconnection means or architecture known in the art.

The microchips 1501 on the wafer 1500 can for example each be a complete personal computer (PC 90) system on a chip (SoC), including for example microprocessors, random access memory, radio and/or optical communication components, and other operational components necessary for each microchip 1501 functioning as a fully independent PC 90 unit on the semiconductor wafer 1500. The semiconductor wafer 1500 can be used with other conventional interface devices for power and data, including wireless such as radio and/or optic (See FIG. 14, for example), and/or wired such as fiber optic and/or electric; such connections can reduce or eliminate the need for interconnections between the microchips 1501 or pins connecting a wafer 1500, for example, to a motherboard (not shown). Alternatively, more than one semiconductor wafer 1500 can be stacked in vertical layers, for example, with wafer 1500 #1 including microprocessors or cores; wafer 1500 #2 including random access memory or RAM such as DRAM; and wafer 1500 #3 including other components, as shown in the FIG. 24B example, which is similar to FIG. 7B 61C of this application.

By reducing or eliminating the need to go "off microchip" or off wafer in this case to complete computation operations, the applicant's invention provides huge savings in terms of speed and energy efficiency.

FIG. 24A also shows an example of the semiconductor wafer 1500 including one or more of the applicant's 510 or 511 or 513 internal sipe invention, with an outer compartment 500 with a sipe 505. In addition, FIG. 24A shows an example of the semiconductor wafer 1500 including one (or potentially more) Faraday Cage 300 surrounding the semiconductor wafer 1500. Moreover, FIG. 24A shows an example embodiment wherein both one or more of the internal siped inventions 510/511/513 and one or more of the Faraday Cages 300 can be used with the same semiconductor wafer 1500. Finally, FIG. 24A shows an example wherein one or more of the outer compartment 500 of the internal siped invention coincide with one or more of the Faraday Cages 300. Each of the four example embodiments described above in this paragraph can be used independently from each other or in any combination, including all four together as shown in FIG. 24A.

Figure 24B:
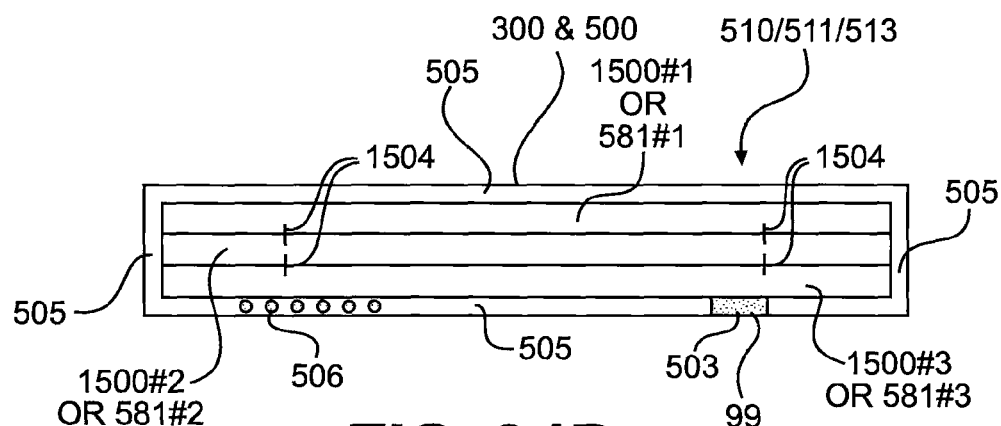
FIG. 24B is a cross sectional view of three vertically stacked semiconductor wafers 1500 including one or more of applicant's internal sipes.

FIG. 24B shows a side cross section of three vertically stacked semiconductor wafers 1500, which have interconnects or vias 1504 between facing surfaces of the wafers. As with the example embodiments shown in FIG. 24A, FIG. 24B shows those stacked wafers 1500 including one or more of the applicant's 510 or 511 or 513 internal sipe invention, with an outer compartment 500 with a sipe 505. In addition, FIG. 24A shows an example of the stacked semiconductor wafers 1500 including one or more Faraday Cage 300 surrounding the semiconductor wafer 1500. Moreover, FIG. 24A shows an example embodiment wherein both one or more of the internal siped inventions 510/511/513 and one or more of the Faraday Cages 300 can be used with the same stacked semiconductor wafers 1500. Finally, FIG. 24A shows an example wherein one or more of the outer compartment 500 of the internal siped invention coincides with one or more of the Faraday Cages 300 surrounding the stacked wafers 1500. Each of the four example embodiments described above in this paragraph can be used independently from each other or in any combination, including all four together as shown in FIG. 24B. Advantageous combinations of the FIGS. 24A-24B embodiments with embodiments shown in FIGS. 23A-23H can also be made.

The invention examples shown in FIGS. 24A-24B can be used as stand-alone computers or as networked computers or as components of a computer. As noted above, sipe media 506 can also be a coolant, which can circulate to a location outside the outer compartment 500 (not shown) or be enclosed within the 300/500 structure (shown in FIG. 24B partially filling sipe 505 as one example and completely filling sipe 505 as another example (not shown).

FIGS. 25A-25B are modifications of FIGS. 29A-29B of the '657 application incorporated by reference herein above. FIG. 25B shows a microchip 1501 as a separated die in a package 1503 including the applicant's internal sipe inventions 510/511/513 and the Faraday Cage 300.

FIGS. 26A-26B are like FIG. 7A-7B with the addition of Faraday Cages, as well as stacked dies in a side view in FIG. 26B.

By way of background, FIG. 28A of the '033 and '930 Applications incorporated herein above shows in cross-section an example of a tire 535, such as for a wheel 533 of a transportation vehicle, with a device 510; the internal sipe 505 and/or inner compartment/chamber/bladder 501 can be pressured or not (valve not shown). As shown in the example, inner compartment/chamber/bladder 501 can have one or more direct attachments 503 to the wheel and the structural elements shown can be made of any useful material as is conventional in the art, including plastic and/or plastic composite and/or carbon fiber. The outer compartment/chamber/bladder 500 can be abbreviated to cover only part of inner compartment/chamber/bladder 501, as shown in FIG. 28A, (possibly pressure-sealed to the wheel like a conventional automobile tire and wheel); the outer compartment/chamber/bladder 500 can also be abbreviated further to cover only a lesser portion, including at least a tread portion, which can include rubber (natural or synthetic, as can other or all parts of the outer compartment 500. FIG. 28B of the '033 and '930 applications shows in a side view cross-section an example of shape of structural elements 502 of the inner compartment 501 (not shown for simplicity).

Figure 27A:
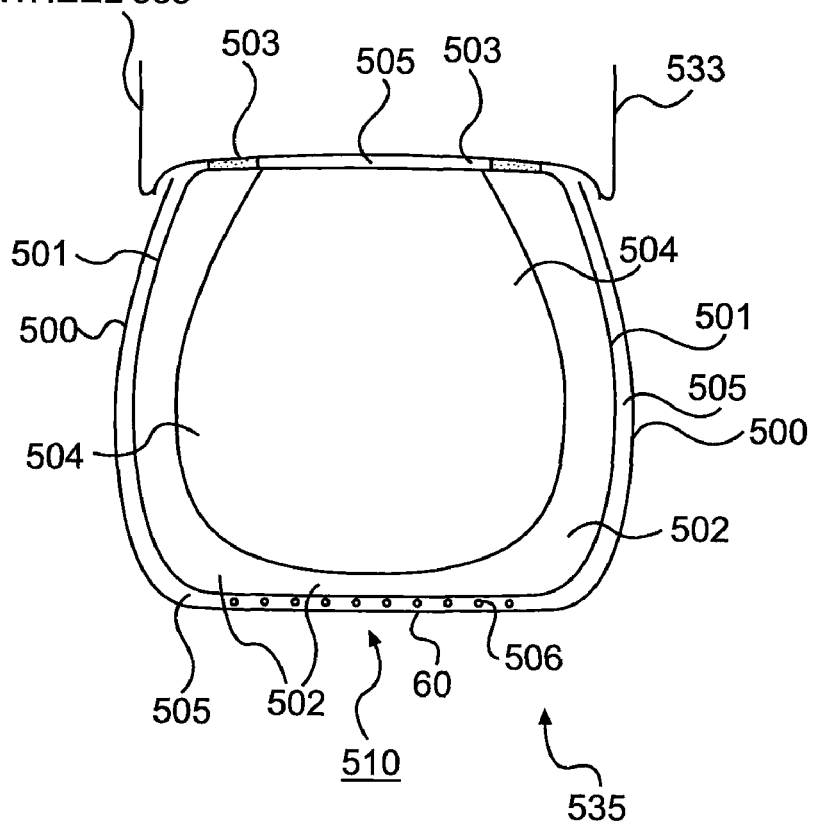
FIGS. 27A-27B are like FIGS. 28A-28B of the '033 and '930 Applications incorporated above shows in cross-section an example of a tire 535, such as for a wheel 533 of a transportation vehicle, with a device 510.
Figure 27B:
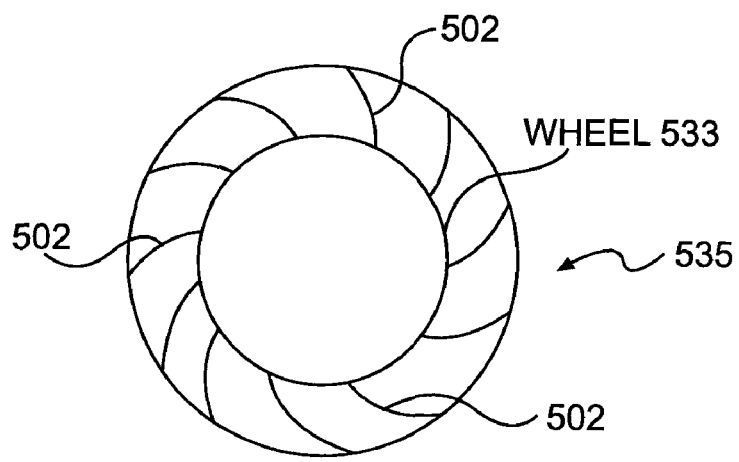

FIG. 27A is new in this application and shows another tire 535 example embodiment similar to that of FIG. 28A discussed in the previous paragraph, but maximizing lateral stability by locating the structural elements 502 at the sides of the tire 535, while maximizing soft ride by locating the media such as gas in the central portion of the tire 535. New FIG. 27D is the same as FIG. 28B discussed above.

FIGS. 23A-27 can be combined in any manner with each other and with any or all of FIGS. 1-22 of this applications, as well as with the Figures of the applicant's patents and applications incorporated by reference herein this application.

Broadly, the flexible inserts or components 510, 511, and 513 can be usefully employed anywhere that cushioning already is being used, or could be with beneficial effect, such as protective padding or cases for equipment of any sort, including portable devices like PC laptops or video players and/or games, cell phones, personal digital assistants (PDA's), and personal digital music players like Apple Ipods™ and MP3 players, as examples, such as the mounting of delicate electronic (or other) components like hard-drives or for vibration dampening, such as in automobile structural and body components and connections.

The applicant's two earlier applications, U.S. application Ser. No. 11/190,087 published as Publication No. US 2005/0268487 A1 on Dec. 8, 2005 describing footwear and U.S. application Ser. No. 11/108,034 published as Publication No. US 2005/0217142 A1 on Oct. 6, 2005 describing orthotics, as well as U.S. Pat. No. 7,010,869, issued Mar. 14, 2006 (of which the '034 Application is a continuation), are hereby expressly incorporated by reference in its entirety for completeness of disclosure. The applicant's earlier application Ser. No. 11/179,887 published as Publication No. US 2005/0241183 A1 on Nov. 3, 2005 describing footwear is hereby expressly incorporated by reference in its entirety for completeness of disclosure.

The applicant's other footwear U.S. Pat. Nos. 4,989,349; 5,317,819; 5,544,429; 5,909,948; 6,115,941; 6,115,945; 6,163,982; 6,308,439; 6,314,662; 6,295,744; 6,360,453; 6,487,795; 6,584,706; 6,591,519; 6,609,312; 6,629,376; 6,662,470; 6,675,498; 6,675,499; 6,708,424; 6,729,046; 6,748,674; 6,763,616; 6,789,331; 6,810,606; 6,877,254; 6,918,197; 7,010,869; 7,082,697; 7,093,379; 7,127,834; 7,168,185; 7,174,658; 7,234,249; 7,287,341; 7,334,350; and 7,334,356 are all hereby incorporated by reference herein in their entirety into this application for completeness of disclosure of the applicant's novel and useful combination of one or more of any of the features or components of any of the figures of this application with one or more of any of the features of any one or more of the preceding applicant's patents listed above in this paragraph.

The applicant's other footwear U.S. Applications with Publication Numbers US 20020000051; 20020007571; 20020007572; 20020014020; 20020014021; 20020023373; 20020073578; 20020116841; 20030046830; 20030070320; 20030079375; 20030131497; 20030208926; 20030217482; 20040134096; 20040250447; 20050016020; 20050086837; 20050217143; 20060032086; 20060248749; 20070240332; 20070271817; 20080000108; 20080005931; 20080022556; 20080083140; and 20080086916 are hereby incorporated by reference herein in their entirety into this application for completeness of disclosure of the applicant's novel and useful combination of one or more of any of the features or components of any of the figures of this application with one or more of any of the features of any one or more of the preceding applicant's published U.S. Applications listed above in this paragraph.

The applicant's non-footwear patents on global network computers, U.S. Pat. Nos. 6,167,428; 6,732,141; 6,725,250; 7,024,449; 7,035,906, and 7,047,275 are all hereby incorporated by reference herein in their entirety into this application for completeness of disclosure of the applicant's novel and useful combination of one or more of any of the features or components of any of the figures of this application with one or more of any of the features of any one or more of the preceding applicant's patents listed above in this paragraph.

The applicant's non-footwear applications on global network computers are U.S. application Ser. Nos. 09/085,755; 09/884,041; 09/935,779; 10/663,911; 11/196,527; 11/329,423; and 11/338,887, as well as U.S. application Ser. No. 10/802,049 with U. S. Publication Number US 2004/0215931 published Oct. 28, 2004; U.S. application Ser. No. 10/684,657 with U.S. Publication Number US 2005/0180095 published Aug. 18, 2005; U.S. application Ser. No. 11/196,527 filed Aug. 4, 2005 with U.S. Publication Number US 2006/0095497 published May 4, 2006; U.S. application Ser. No. 11/329,423 filed Jan. 11, 2006 with U.S. Publication Number US 2006/0177226 published Aug. 10, 2006; U.S. application Ser. No. 11/338,887 filed Jan. 25, 2006 with U.S. Publication Number US 2006/0190565 published Aug. 24, 2006; all of these applications are hereby incorporated by reference herein in their entirety into this application for completeness of disclosure of the applicant's novel and useful combination of one or more of any of the features or components of any of the figures of this application with one or more of any of the features of any one or more of the preceding applicant's applications, including published applications, listed above in this paragraph.

To avoid confusion, any numeral in the above listed non-footwear patents or applications relating to computers that is the same as a numeral in the above listed footwear patents or applications should have (or be presumed to have) a prefix numeral of "1" added to the numeral (the equivalent of adding "1000" to the numeral, so that all the numerals of both sets of applications and patents remain unique).

In the following claims, the term "chamber" means a compartment 161 or a chamber 188 or a bladder and the term "sipe" means a sipe 505 or a slit or a channel or a groove as described in the textual specification above and associated figures of this application.

The foregoing shoe designs meet the objectives of this invention as stated above. However, it will clearly be understood by those skilled in the art that the foregoing description has been made in terms of the preferred embodiments and various changes and modifications may be made without departing from the scope of the present invention which is to be defined by the appended claims.

What is claimed is:

1. A computer or microchip, comprising:
   an outer chamber;
   at least one inner chamber inside said outer chamber;
   said outer chamber and said inner chamber being separated at least in part by an internal sipe;
   wherein at least a portion of the internal sipe is formed by an inner surface of said outer chamber and an outer surface of said inner chamber and the surfaces forming the internal sipe oppose each other and are separate from each other and therefore can move relative to each other in a sliding motion;
   at least a portion of said surfaces forming the internal sipe are proximate to each other in a unloaded condition; and
   the outer chamber including at least one Faraday Cage; and
   at least one internal hardware firewall.

2. The computer or microchip according to claim 1, wherein at least a portion of said surfaces forming said sipe are separated by a cooling media when unloaded.

3. The computer or microchip according to claim 1, further including a second internal sipe located within the inner chamber and wherein said computer or microchip is located inside said second internal sipe.

4. The computer or microchip according to claim 1, further including a second Faraday Cage located within the inner chamber.

5. The computer or microchip according to claim 1, further including a photovoltaic cell or fuel cell or battery or a combination of two or all three.

6. The computer or microchip according to claim 1 wherein the computer or microchip is a computer.

7. The computer or microchip according to claim 1 further comprising an attachment attaching a portion of each of the opposing surfaces forming the sipe to each other.

8. The computer or microchip according to claim 1, further including an antenna.

9. The computer or microchip according to claim 8, wherein the antenna is located outside the Faraday Cage.

10. The computer or microchip according to claim 8, wherein the antenna is separated from the Faraday Cage.

11. The computer or microchip according to claim 10, wherein the antenna is separated from the Faraday Cage by an RF trap, ferrite grommets or beads.

12. The computer or microchip of claim 1, comprising a plurality of internal hardware firewalls.

13. The computer or microchip of claim 1, comprising at least four internal hardware firewalls.

14. The computer or microchip of claim 1, wherein said computer or microchip is an insertable device adapted for insertion into any suitable product including, but not limited to: footwear; orthotics; athletic, occupational and medical equipment; apparel; implant, surgical, prosthetic or brace devices for humans, animals or other biological entities; transportation vehicle components; elements of a mechanical, architectural, or other device; and any electronic device.

15. The computer or microchip of claim 1, wherein said computer or microchip has a geometrically regular shape, an anthropomorphic shape or an animal shape.

16. A microchip, comprising:
   an outer chamber;
   at least one inner chamber inside said outer chamber;
   said outer chamber and said inner chamber being separated at least in part by an internal sipe;
   wherein at least a portion of the internal sipe is formed by an inner surface of said outer chamber and an outer surface of said inner chamber and the surfaces forming the internal sipe oppose each other and are separate from each other and therefore can move relative to each other in a sliding motion;
   at least a portion of said surfaces forming the internal sipe are proximate to each other in a unloaded condition; and
   the outer chamber including at least one Faraday Cage; and
   at least one internal hardware firewall.

17. The microchip of claim 16, comprising a plurality of internal hardware firewalls.

18. The microchip of claim 16, comprising at least four internal hardware firewalls.

19. The microchip of claim 16, wherein said microchip is an insertable device adapted for insertion into any suitable product including, but not limited to: footwear; orthotics; athletic, occupational and medical equipment; apparel; implant, surgical, prosthetic or brace devices for humans, animals or other biological entities; transportation vehicle components; elements of a mechanical, architectural, or other device; and any electronic device.

20. The microchip of claim 16, wherein said microchip has a geometrically regular shape, an anthropomorphic shape or an animal shape.

21. A computer, comprising:
an outer chamber;
at least one inner chamber inside the outer chamber;
said outer chamber and said inner chamber being separated at least in part by an internal sipe;
wherein at least a portion of the internal sipe is formed by an inner surface of said outer chamber and an outer surface of said inner chamber and the surfaces forming the internal sipe opposed each other and are separate from each other and therefore can move relative to each other in a sliding motion;
at least a portion of said surfaces forming the internal sipe are proximate to each other in an unloaded condition; and
the outer chamber including at least one Faraday Cage;
the computer including at least a semiconductor wafer comprising a multitude of microchips,
each of the multitude of microchips including one or more core microprocessors; and
each of the multitude of microchips including at least one internal hardware firewall.

22. The computer according to claim 21, wherein the wafer has a diameter or greatest width of at least 100 mm.

23. The computer according to claim 21, wherein incomplete microchips located around the periphery of the wafer, and microchips having a manufacturing defect or other damage, are deactivated or disconnected.

24. The computer according to claim 21, wherein the wafer has interconnects between the microchips and components external to the wafer.

25. The computer according to claim 21, wherein two or more wafers are stacked together.

26. The computer according to claim 21, wherein three or more wafers are stacked together.

27. The computer according to claim 21, wherein the microchips have independent communication capabilities including at least one of a radio wave and an optical device.

28. The computer according to claim 21, wherein the microchips function independently and each microchip further includes a random access memory and digital signal processor circuitry.

29. The computer according to claim 21, wherein at least a portion of said surfaces forming said sipe are separated by a cooling media when unloaded.

30. The computer according to claim 21, further including a photovoltaic cell, a fuel cell, a battery or a combination of two or all three.

31. The computer of claim 21, wherein each of the multitude of microchips includes a plurality of internal hardware firewalls.

32. The computer of claim 21, wherein each of the multitude of microchips includes at least four internal hardware firewalls.

33. The computer of claim 21, wherein said computer is an insertable device adapted for insertion into any suitable product including, but not limited to: footwear; orthotics; athletic, occupational and medical equipment; apparel; implant, surgical, prosthetic or brace devices for humans, animals or other biological entities; transportation vehicle components; elements of a mechanical, architectural, or other device; and any electronic device.

34. The computer of claim 21, wherein said computer has a geometrically regular shape, an anthropomorphic shape or an animal shape.

35. A computer, comprising:
an outer chamber;
at least one inner chamber inside the outer chamber;
said outer chamber and said inner chamber being separated at least in part by an internal sipe;
wherein at least a portion of the internal sipe is formed by an inner surface of said outer chamber and an outer surface of said inner chamber and the surfaces forming the internal sipe opposed each other and are separate from each other and therefore can move relative to each other in a sliding motion;
at least a portion of said surfaces forming the internal sipe are proximate to each other in an unloaded condition; and
the outer chamber including at least one Faraday Cage;
the computer including at least a plurality of semiconductor wafers stacked together, each wafer comprising a multitude of microchips,
each of the multitude of microchips including one or more core microprocessors; and
each of the multitude of microchips including at least one internal hardware firewall.

36. The computer according to claim 35, wherein at least one of the microchips includes functional components on two or more separate wafers.

37. The computer according to claim 36, wherein the functional components are located on wafers that are proximate one another.

38. The computer according to claim 36, wherein the functional components are located on three semiconductor wafers.

39. The computer according to claim 35, wherein at least one of the semiconductor wafers has a diameter or greatest width of at least 100 mm.

40. The computer according to claim 35, wherein incomplete microchips located around the periphery of the plurality of wafers, and microchips having a manufacturing defect or other damage, are deactivated or disconnected.

41. The computer according to claim 35, wherein the plurality of wafers has interconnects between the microchips and components external to the wafers.

42. The computer according to claim 35, wherein three or more wafers are stacked together.

43. The computer according to claim 35, wherein the microchips include independent communication capabilities including at least one of a radio wave and optical device.

44. The computer according to claim 35, wherein the microchips function independently and each microchip further includes a random access memory and digital signal processor circuitry.

45. The computer according to claim 35, wherein at least a portion of said surfaces forming said sipe are separated by a cooling media when unloaded.

46. The computer according to claim 35, further including a photovoltaic cell, a fuel cell, a battery or a combination of two or all three.

47. The computer of claim 35, wherein each of the multitude of microchips includes a plurality of internal hardware firewalls.

48. The computer of claim 35, wherein each of the multitude of microchips includes at least four internal hardware firewalls.

49. The computer of claim 35, wherein said computer is an insertable device adapted for insertion into any suitable product including, but not limited to: footwear; orthotics; athletic, occupational and medical equipment; apparel; implant, surgical, prosthetic or brace devices for humans, animals or other biological entities; transportation vehicle components; elements of a mechanical, architectural, or other device; and any electronic device.

50. The computer of claim 35, wherein said computer has a geometrically regular shape, an anthropomorphic shape or an animal shape.

* * * * *